US012660489B2

(12) United States Patent
Park et al.

(10) Patent No.: US 12,660,489 B2
(45) Date of Patent: Jun. 16, 2026

(54) DISPLAY DEVICE

(71) Applicant: Samsung Display Co., LTD., Yongin-si (KR)

(72) Inventors: Cheol Eon Park, Seoul (KR); Eung Seok Park, Seoul (KR); Yong Tack Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/662,959

(22) Filed: May 13, 2024

(65) Prior Publication Data

US 2024/0306420 A1     Sep. 12, 2024

Related U.S. Application Data

(62) Division of application No. 17/203,683, filed on Mar. 16, 2021, now Pat. No. 12,016,194.

(30) Foreign Application Priority Data

May 26, 2020     (KR) ........................ 10-2020-0062879

(51) Int. Cl.
H10K 59/88          (2023.01)
H10K 50/13          (2023.01)
(Continued)

(52) U.S. Cl.
CPC ........... H10K 59/88 (2023.02); H10K 59/131 (2023.02); H10K 59/38 (2023.02);
(Continued)

(58) Field of Classification Search
CPC .. H10K 59/131; H10K 59/88; H10K 59/8792; H10K 59/8722; H10K 59/38;
(Continued)

(56) References Cited

U.S. PATENT DOCUMENTS 9,356,256  B2     5/2016  Choi
10,199,598  B2     2/2019  Kim
        (Continued)

FOREIGN PATENT DOCUMENTS

CN          105261620  A        1/2016
CN          108369788  A        8/2018
        (Continued)

OTHER PUBLICATIONS

Extended European Search Report—Eurpoean Application No. 21174925.4 dated Mar. 18, 2022, citing references listed within.
(Continued)

*Primary Examiner* — Vongsavanh Sengdara
(74) *Attorney, Agent, or Firm* — CANTOR COLBURN LLP

(57)          ABSTRACT

A display device includes a first base on which a display area and a non-display area are defined; a first support member disposed on the first base and located in the non-display area; a light emitting element disposed on the first base and located in the display area; an encapsulation layer which disposed on the light emitting element; a second base disposed on the encapsulation layer; a color filter disposed between the second base and the encapsulation layer, where the color filter overlaps the light emitting element; a wavelength conversion pattern disposed on the color filter; and a sealing member disposed between the first base and the second base and located in the non-display area, where the sealing member is located between the display area and the first support member and overlaps the encapsulation layer.

11 Claims, 39 Drawing Sheets

(51) Int. Cl.

| | |
|---|---|
| *H10K 50/19* | (2023.01) |
| *H10K 59/122* | (2023.01) |
| *H10K 59/124* | (2023.01) |
| *H10K 59/131* | (2023.01) |
| *H10K 59/38* | (2023.01) |
| *H10K 59/80* | (2023.01) |

(52) U.S. Cl.
CPC ..... *H10K 59/8722* (2023.02); *H10K 59/8731* (2023.02); *H10K 59/8792* (2023.02); *H10K 50/131* (2023.02); *H10K 50/19* (2023.02); *H10K 59/122* (2023.02); *H10K 59/124* (2023.02); *H10K 59/879* (2023.02)

(58) Field of Classification Search
CPC ............. H10K 59/8731; H10K 59/122; H10K 59/124; H10K 59/879; H10K 50/8426; H10K 50/844; H10K 50/131; H10K 50/19; H10K 71/851
See application file for complete search history.

(56) References Cited

U.S. PATENT DOCUMENTS

| | | |
|---|---|---|
| 10,749,142 B2 | 8/2020 | Kim |
| 10,916,722 B2 | 2/2021 | Park et al. |
| 11,444,258 B2 | 9/2022 | Park et al. |
| 11,903,229 B2 | 2/2024 | Park et al. |

| | | | |
|---|---|---|---|
| 2014/0117334 A1 | 5/2014 | Nakamura et al. | |
| 2014/0131683 A1* | 5/2014 | Kim ..................... | H10K 59/873 438/22 |
| 2015/0028307 A1 | 1/2015 | Kim et al. | |
| 2015/0340655 A1 | 11/2015 | Lee et al. | |
| 2016/0013253 A1 | 1/2016 | Lee | |
| 2017/0005144 A1 | 1/2017 | Akagawa et al. | |
| 2017/0069664 A1* | 3/2017 | Nakamura .......... | H10K 59/131 |
| 2018/0219183 A1* | 8/2018 | Song .................. | H10K 59/8731 |
| 2021/0043873 A1 | 2/2021 | Sung et al. | |

FOREIGN PATENT DOCUMENTS

| | | |
|---|---|---|
| CN | 110911447 A | 3/2020 |
| JP | 2015128027 | 7/2015 |
| KR | 1020150092792 A | 8/2015 |
| KR | 1020170038565 A | 4/2017 |
| KR | 1020180063412 A | 6/2018 |
| KR | 1020190064254 A | 6/2019 |
| KR | 1020190093131 | 8/2019 |
| KR | 1020190095639 A | 8/2019 |
| KR | 1020190117860 A | 10/2019 |
| KR | 1020200032294 A | 3/2020 |

OTHER PUBLICATIONS

Partial European Search Report—European Application No. 21174925.4 dated Nov. 8, 2021.

* cited by examiner

OS1: OS1a, OS1b

DISPLAY DEVICE

This application is a divisional of U.S. patent application Ser. No. 17/203,683, filed on Mar. 3, 2021, which claims priority to Korean Patent Application No. 10-2020-0062879, filed on May 26, 2020, and all the benefits accruing therefrom under 35 U.S.C. § 119, the content of which in its entirety is herein incorporated by reference.

BACKGROUND

1. Field

The disclosure relates to a display device.

2. Description of the Related Art

Recently, display devices are more widely used with the development of multimedia. Accordingly, various display devices such as liquid crystal display devices ("LCD"s) and organic light emitting diode display devices ("OLED"s) are being developed.

Among such display devices, a self-light emitting display device includes a self-light emitting element such as an organic light emitting diode. The self-light emitting element may include two electrodes facing each other and a light emitting layer interposed between the two electrodes. In a self-light emitting display device where the self-light emitting element is an organic light emitting diode, electrons and holes provided from the two electrodes may be recombined in the light emitting layer to generate excitons. As the generated excitons change from an excited state to a ground state, light may be emitted.

Since such self-light emitting display devices operate without using a separate light source such as a backlight unit, such self-light emitting display devices are low in power consumption, lightweight and thin, and may have a wide viewing angle, high luminance and contrast, and fast response speed. Due to these desired characteristics, self-light emitting display devices are drawing attention as next-generation display devices.

SUMMARY

In a display device, a color conversion pattern or a wavelength conversion pattern may be placed in each pixel on a light path extending from a light source to a viewer to allow each pixel of the display device to uniquely display one primary color.

Embodiments of the disclosure provide a display device having improved display quality and reliability.

An embodiment of a display device includes a first base on which a display area and a non-display area are defined; a first support member disposed on the first base and located in the non-display area; a light emitting element disposed on the first base and located in the display area; an encapsulation layer disposed on the light emitting element; a second base disposed on the encapsulation layer; a color filter disposed b between the second base and the encapsulation layer, where the color filter overlaps the light emitting element; a wavelength conversion pattern disposed on the color filter; and a sealing member disposed between the first base and the second base and located in the non-display area, where the sealing member is located between the display area and the first support member and overlaps the encapsulation layer.

An embodiment of a display device includes a first base on which a display area and a non-display area are defined; a first support member disposed on the first base and located in the non-display area; a light emitting element disposed on the first base and located in the display area; a second base disposed on the light emitting element; a color filter disposed between the second base and the light emitting element, where the color filter overlaps the light emitting element; a wavelength conversion pattern disposed on the color filter; and a sealing member disposed between the first base and the second base and located in the non-display area, where the sealing member includes a first portion spaced apart from an edge of the first base and a second portion aligned with the edge of the first base, where the first portion of the sealing member extends in a same direction as the first support member, is located between the first support member and the display area, and is spaced apart from the first support member.

BRIEF DESCRIPTION OF THE DRAWINGS

These and/or other features of embodiments of the invention will become apparent and more readily appreciated by describing in further detail embodiments with reference to the accompanying drawings, in which.

Figure 20:
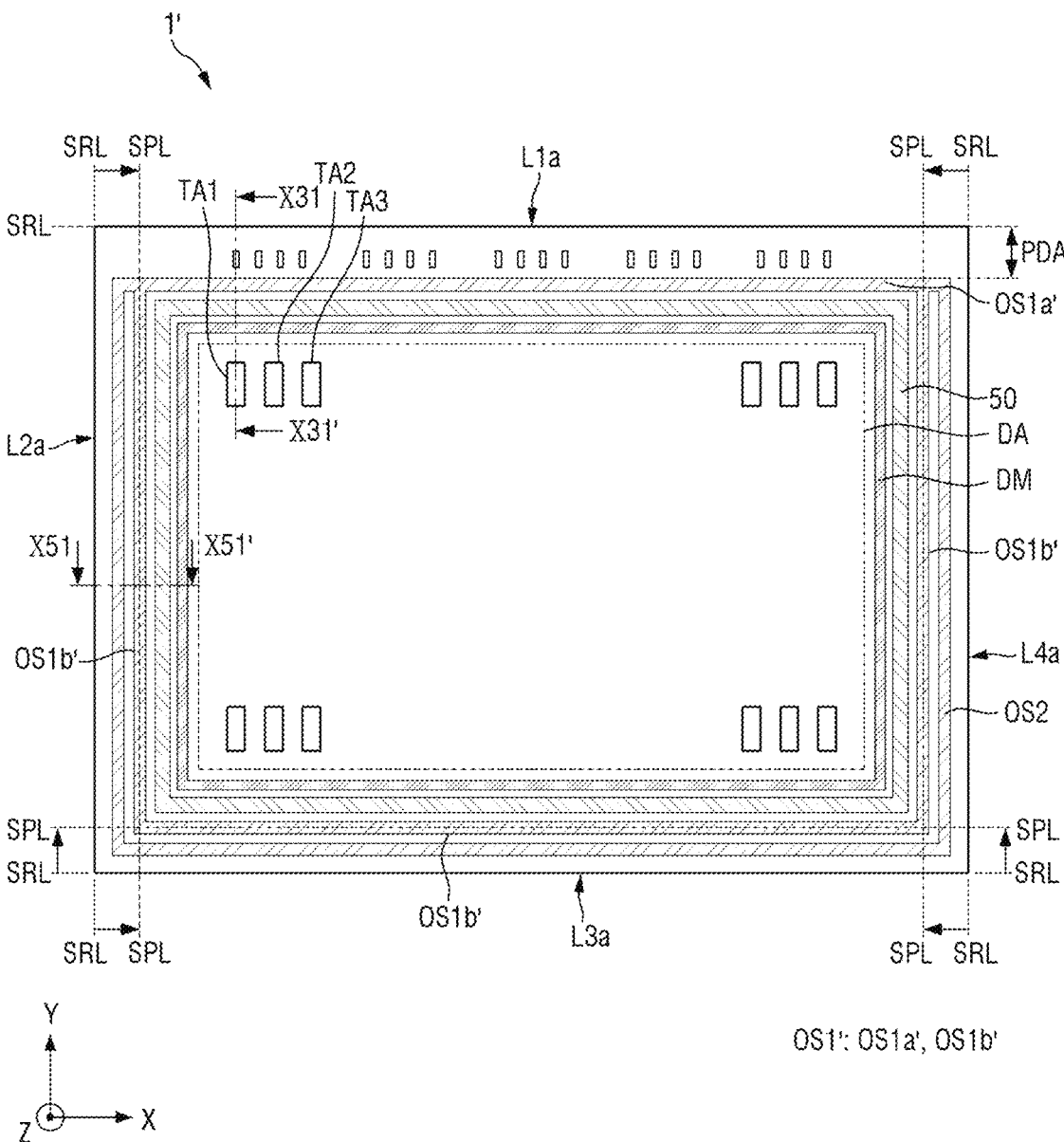
Figure 21:
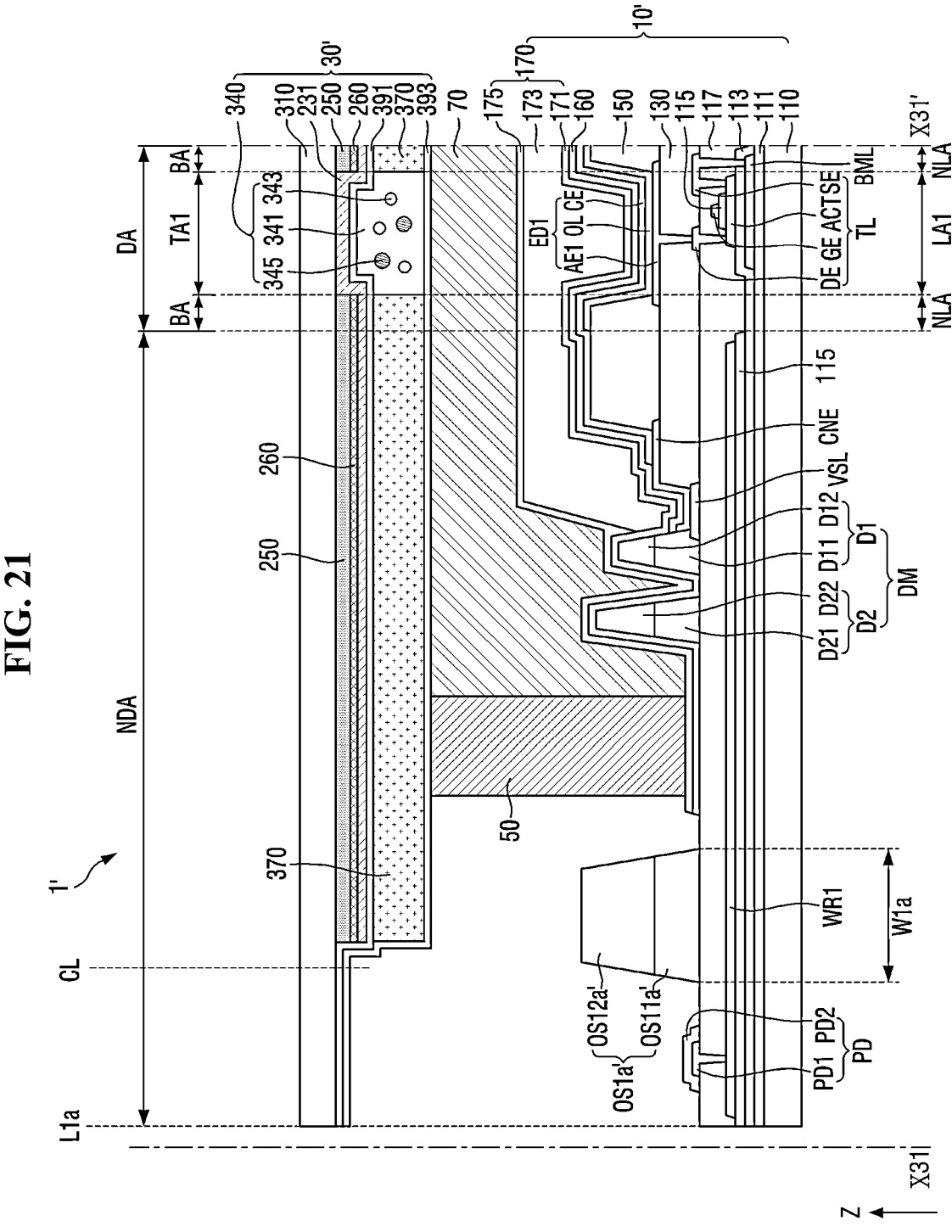
Figure 22:
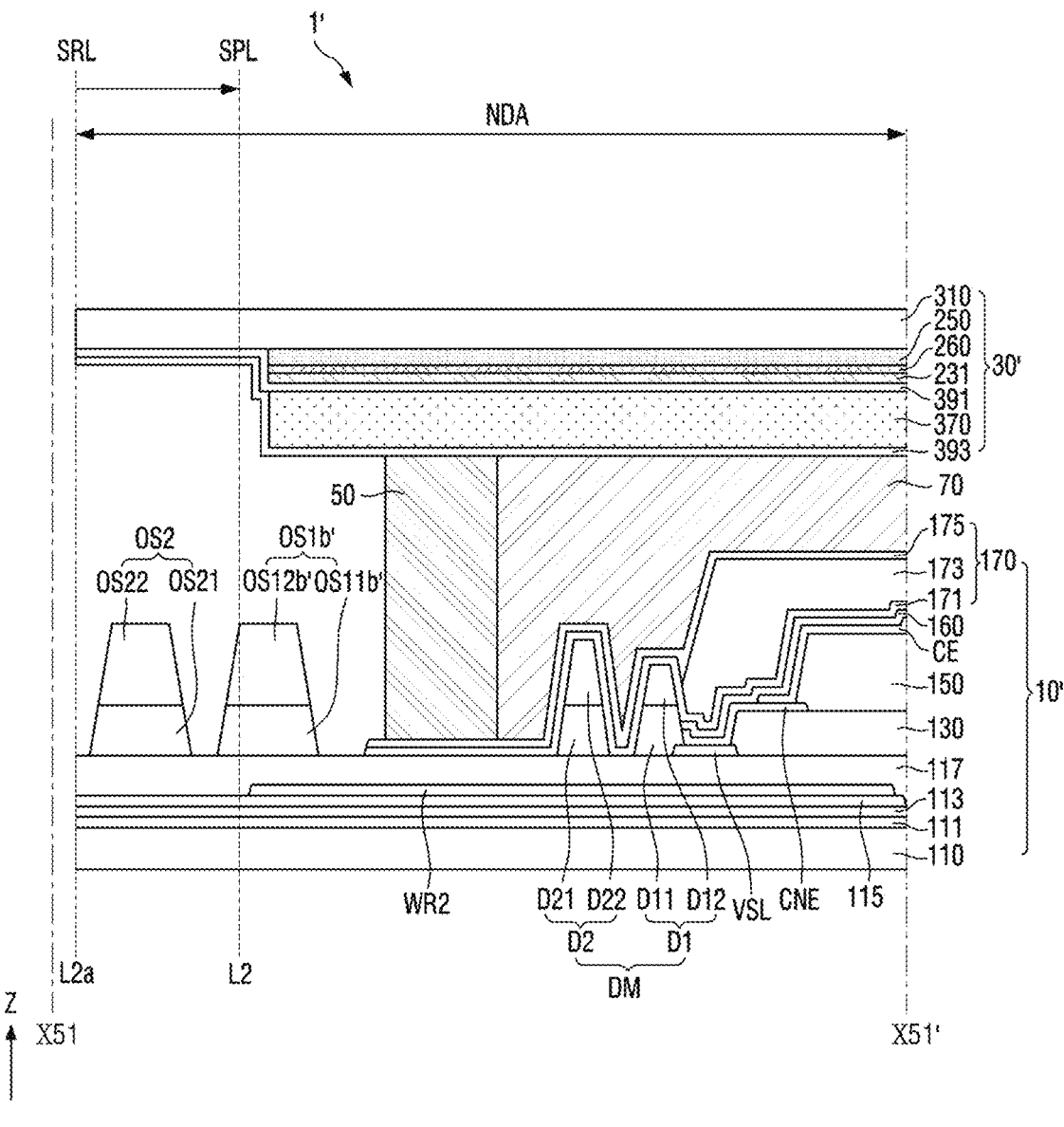
Figure 23:
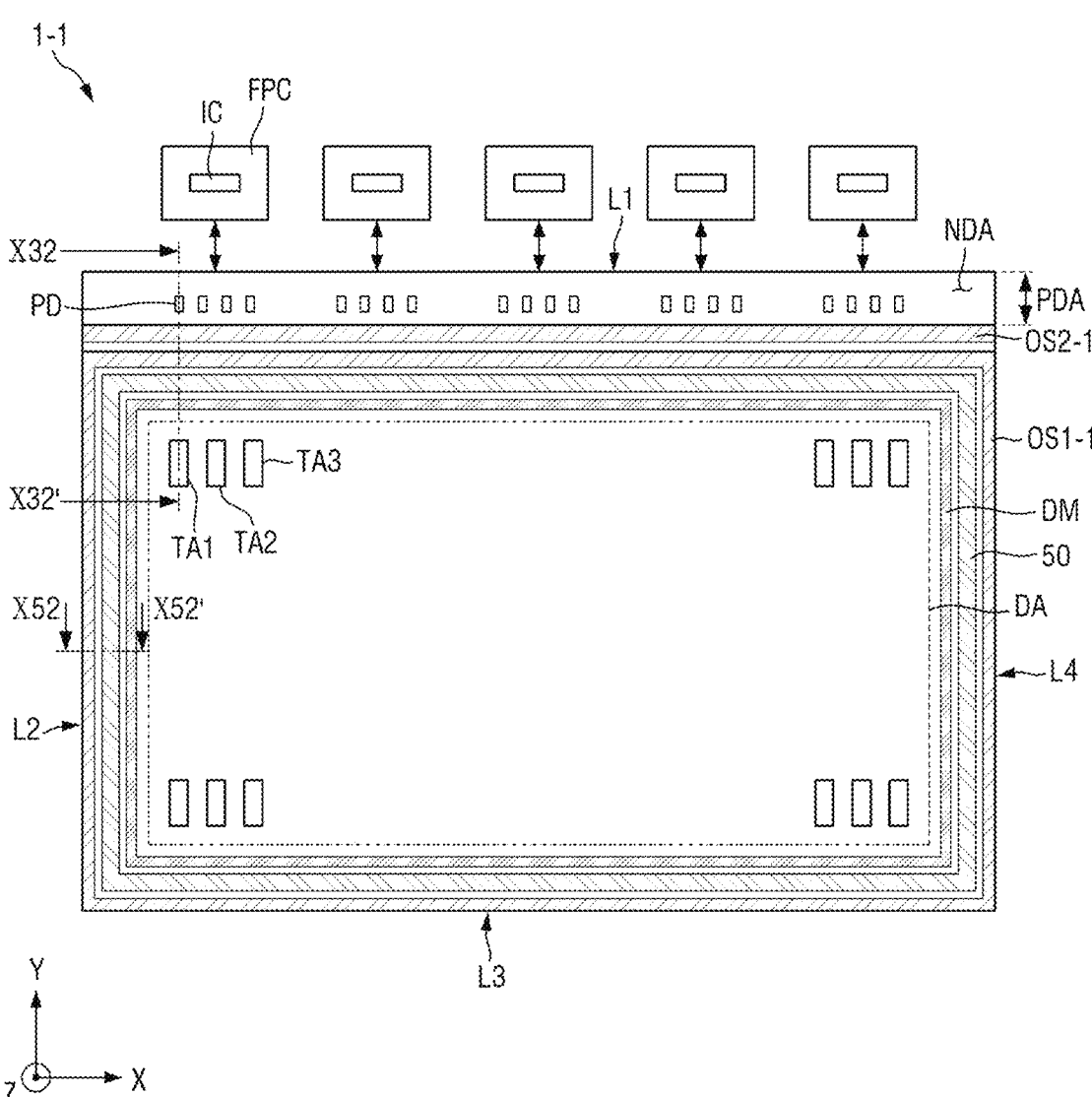
Figure 24:
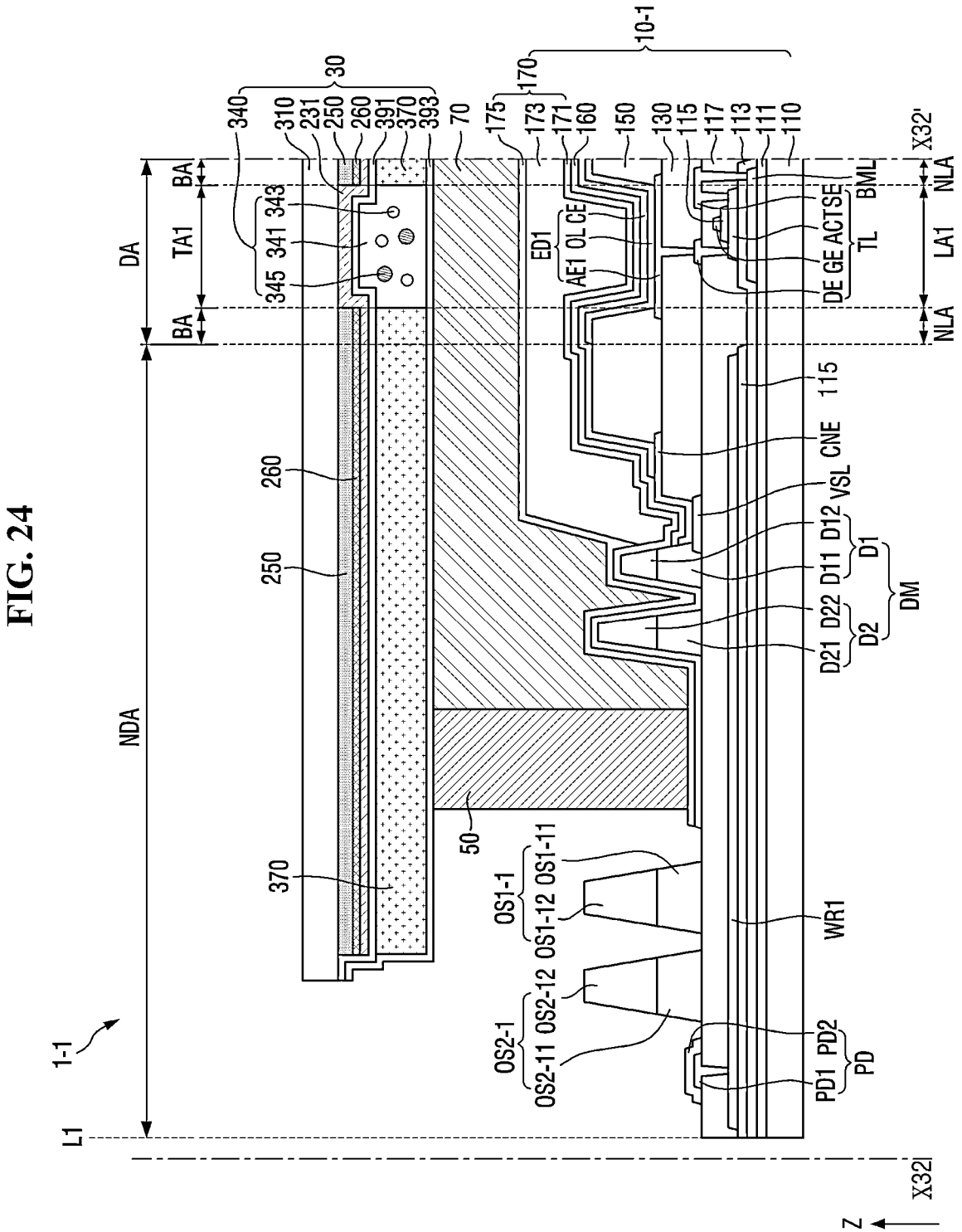
Figure 25:
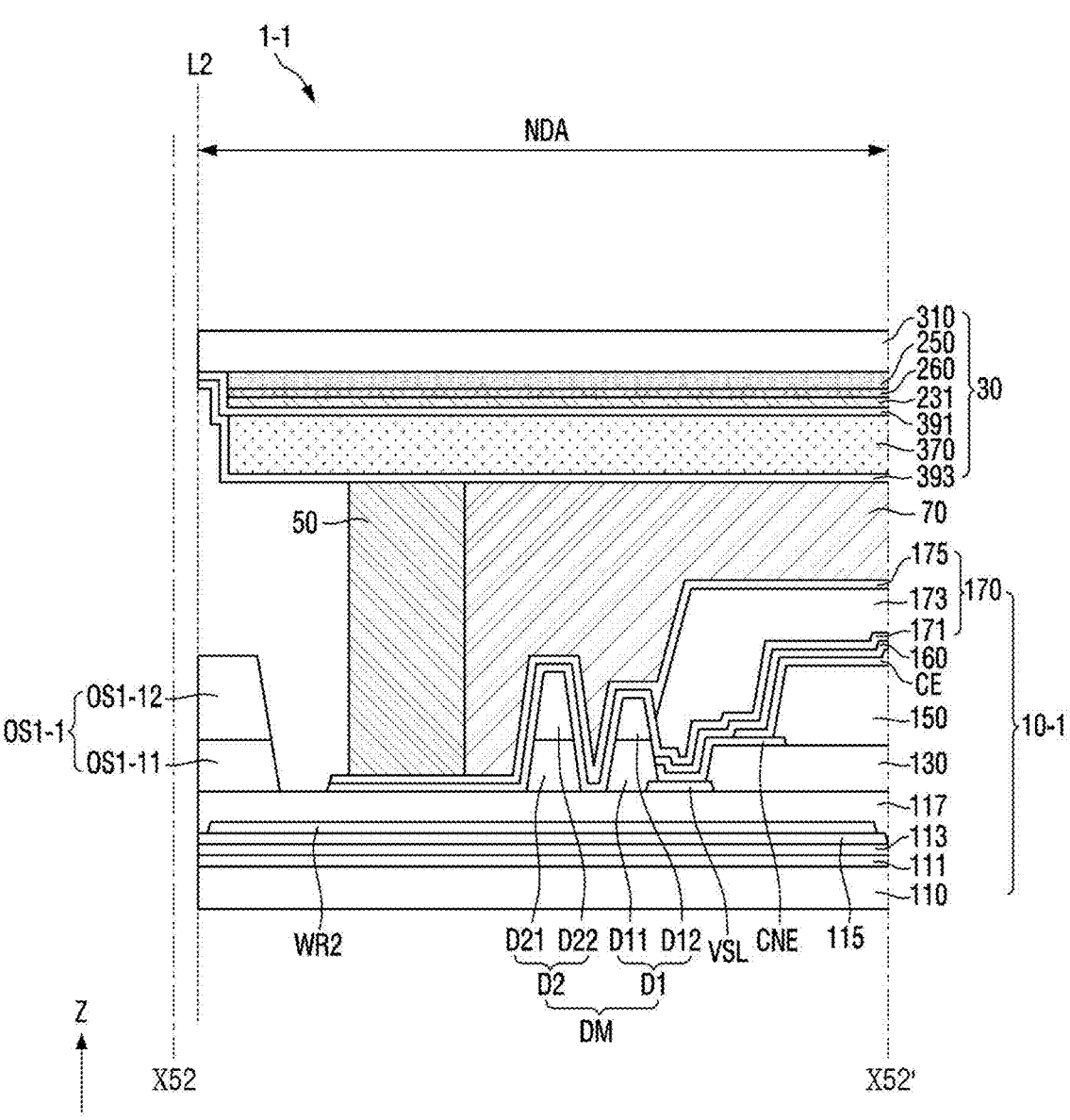
Figure 26:
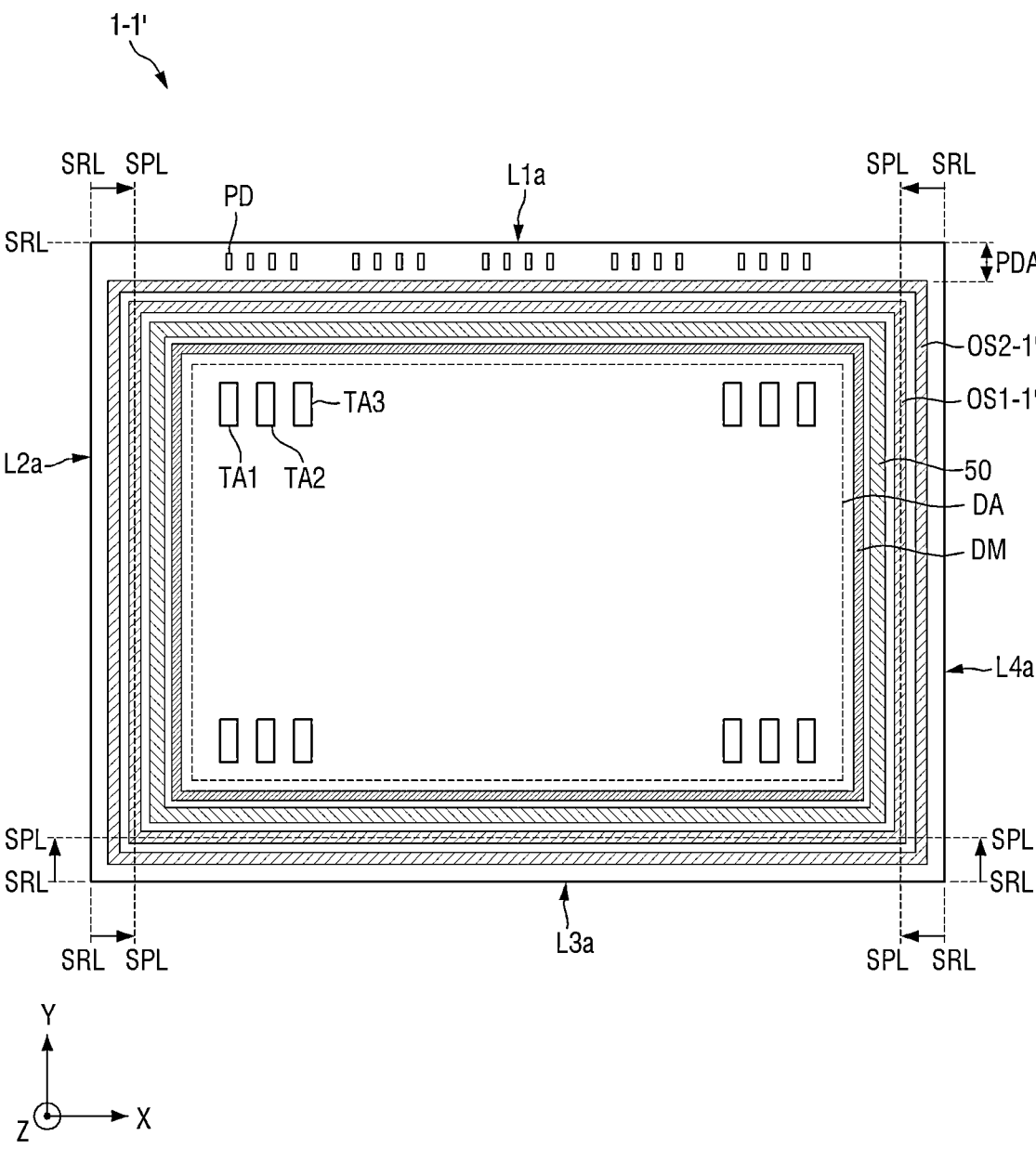
Figure 27:
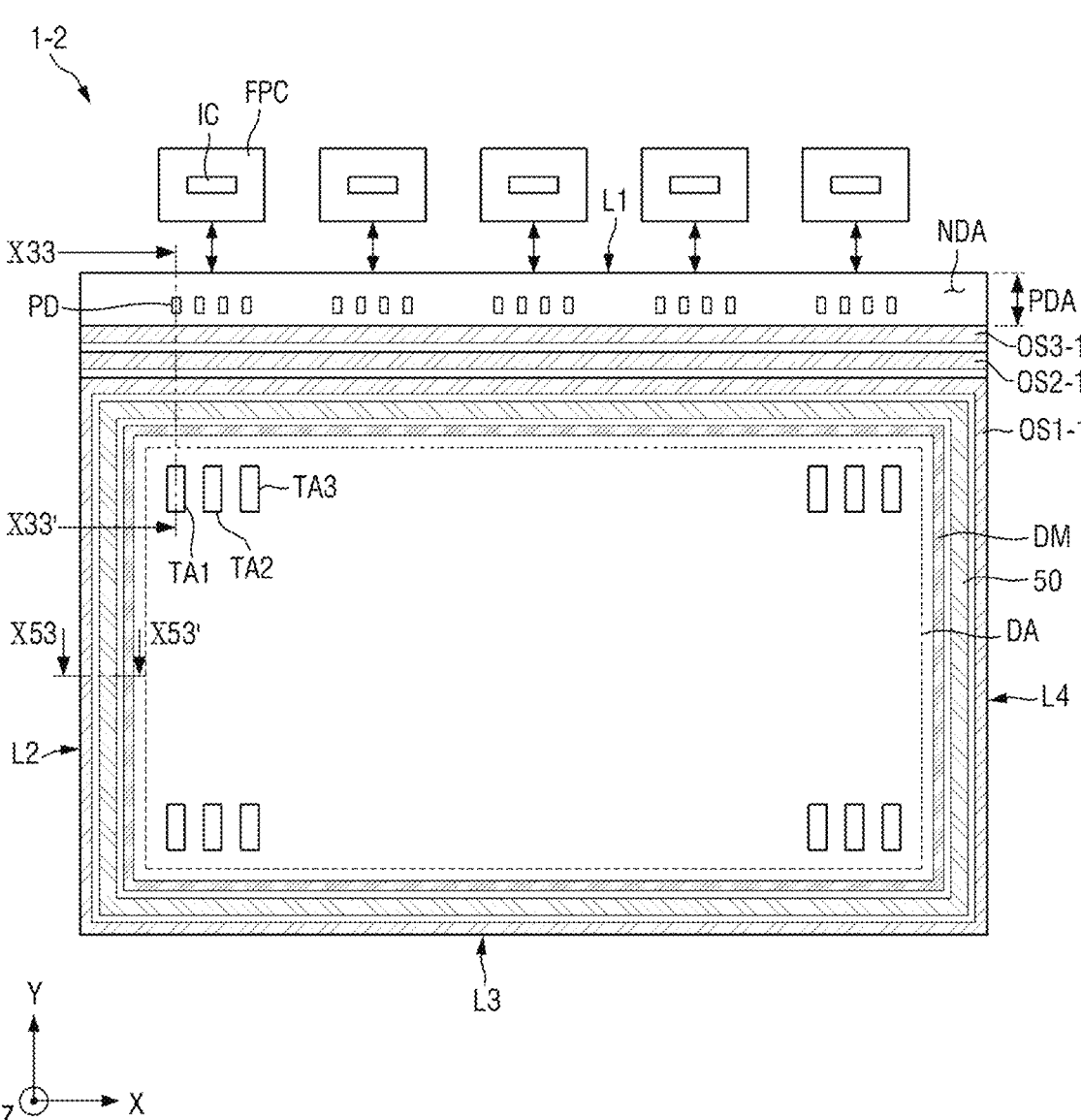
Figure 28:
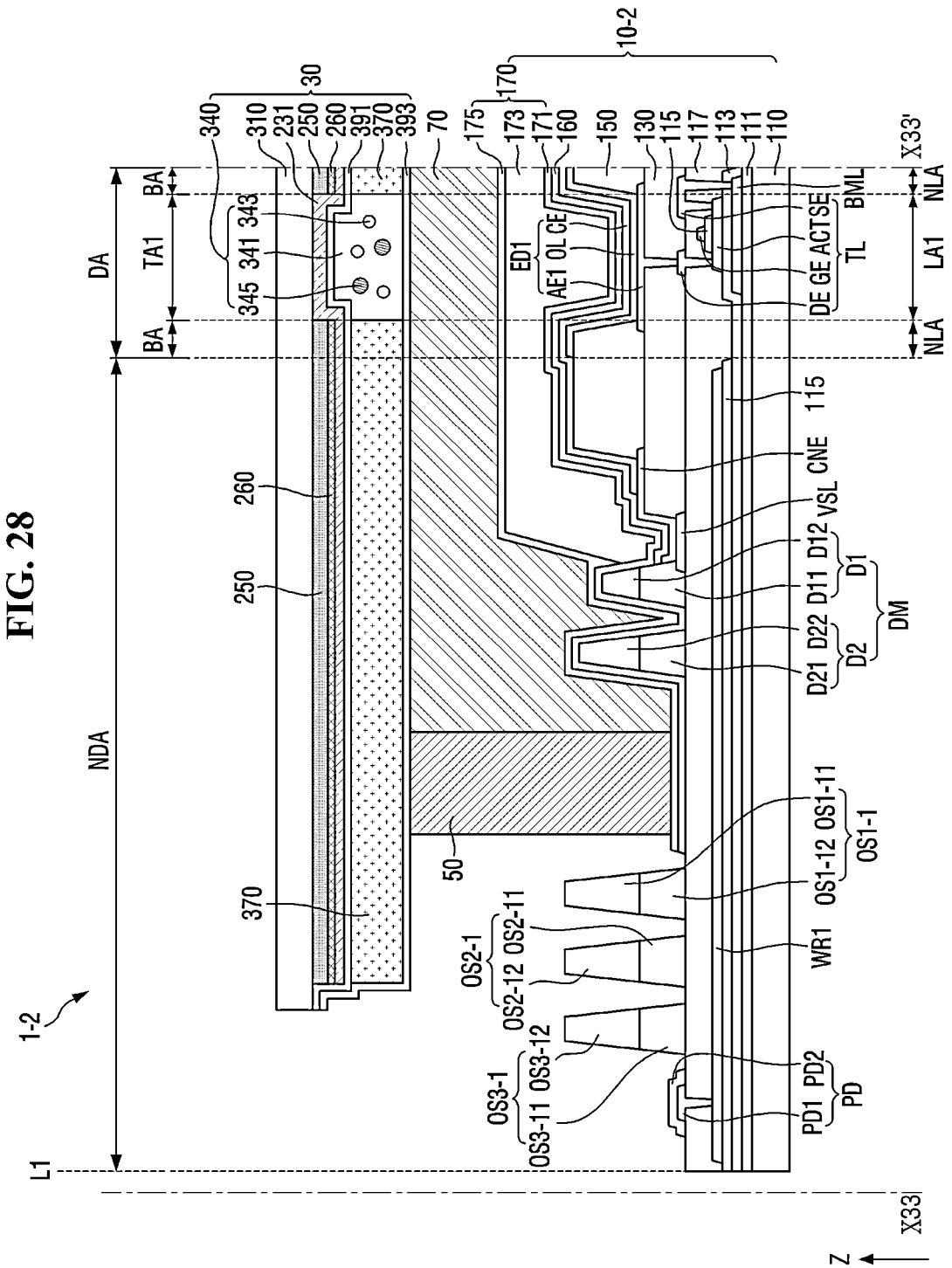
Figure 29:
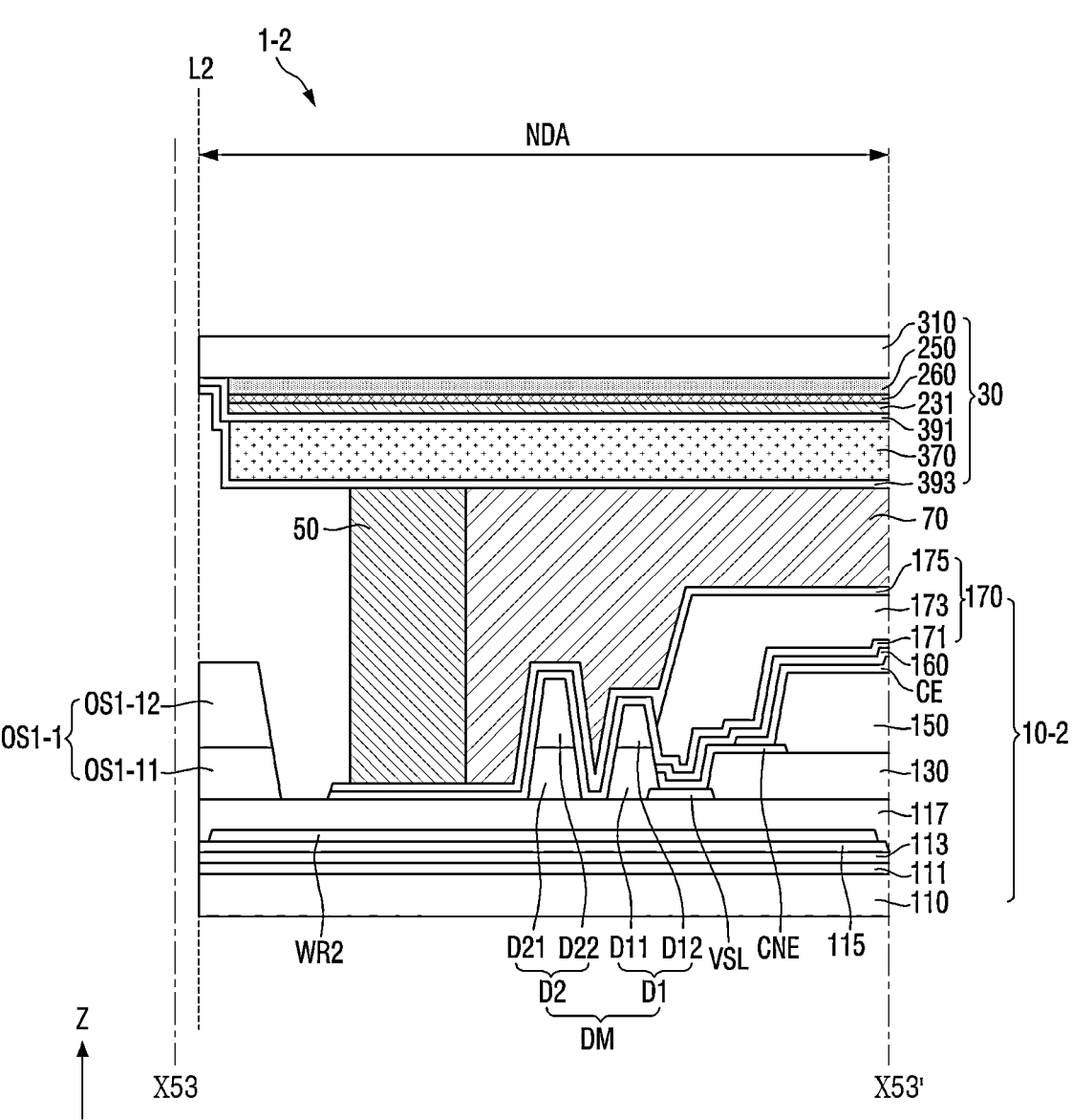
Figure 30:
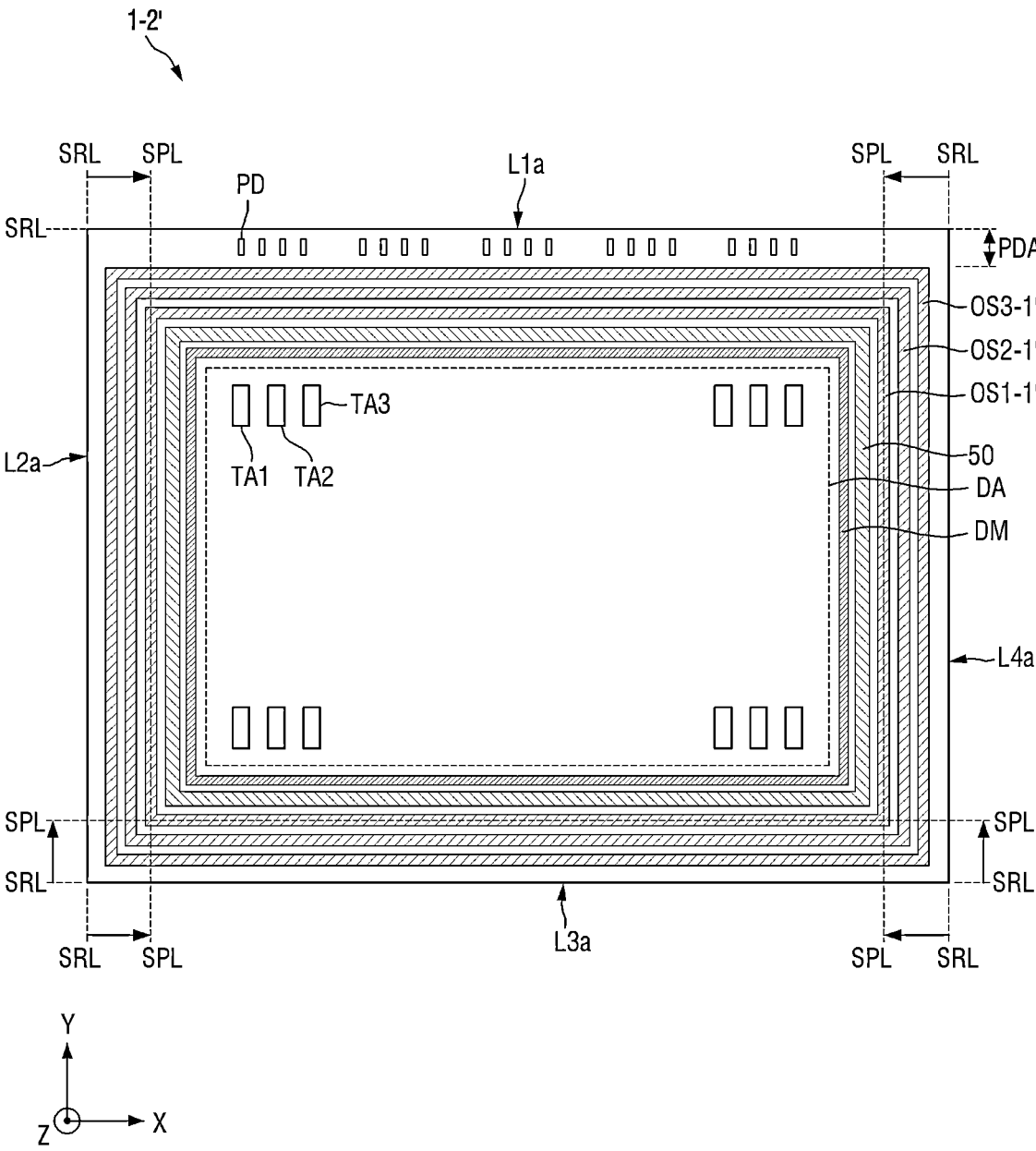
Figure 31:
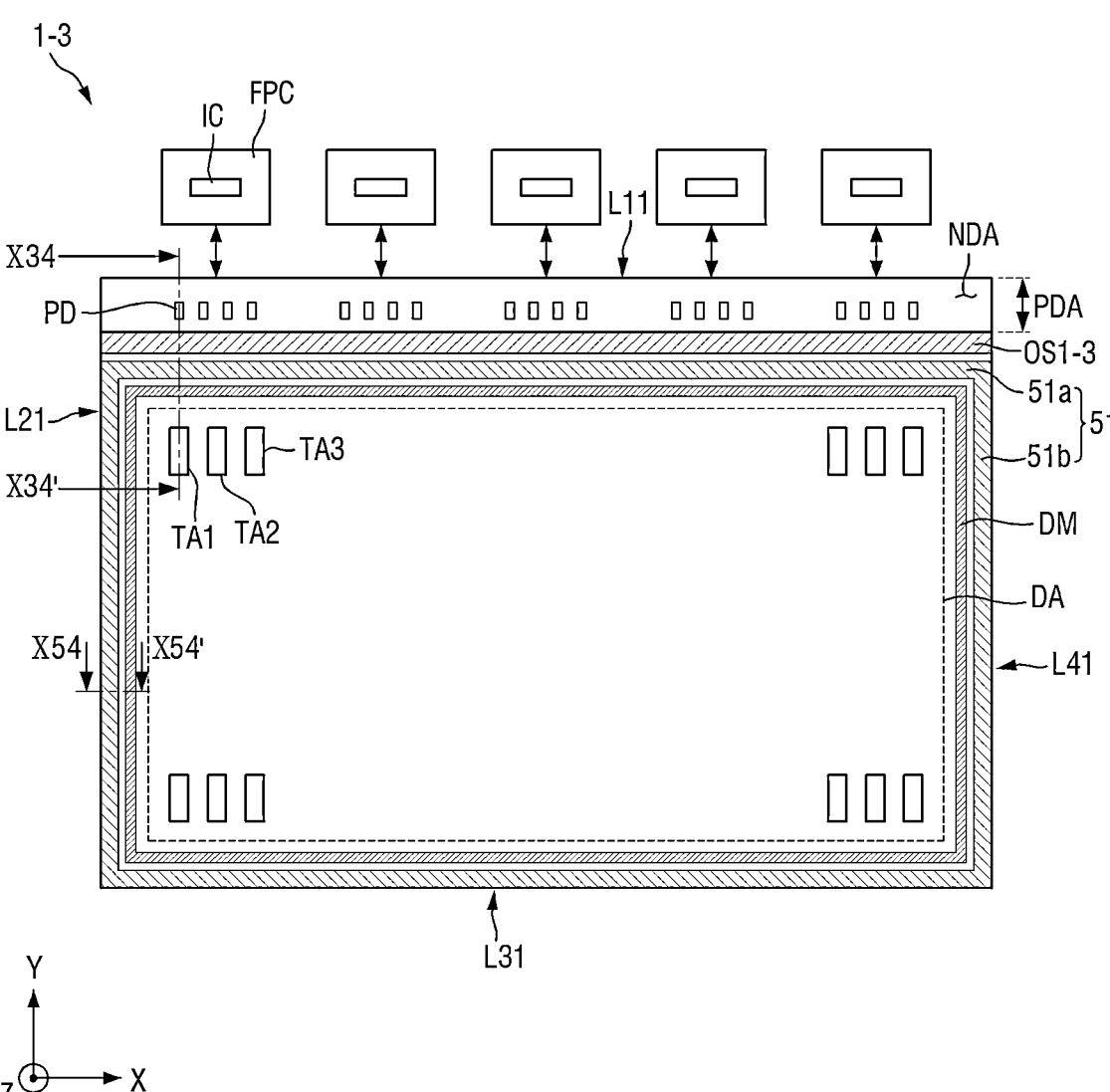
Figure 32:
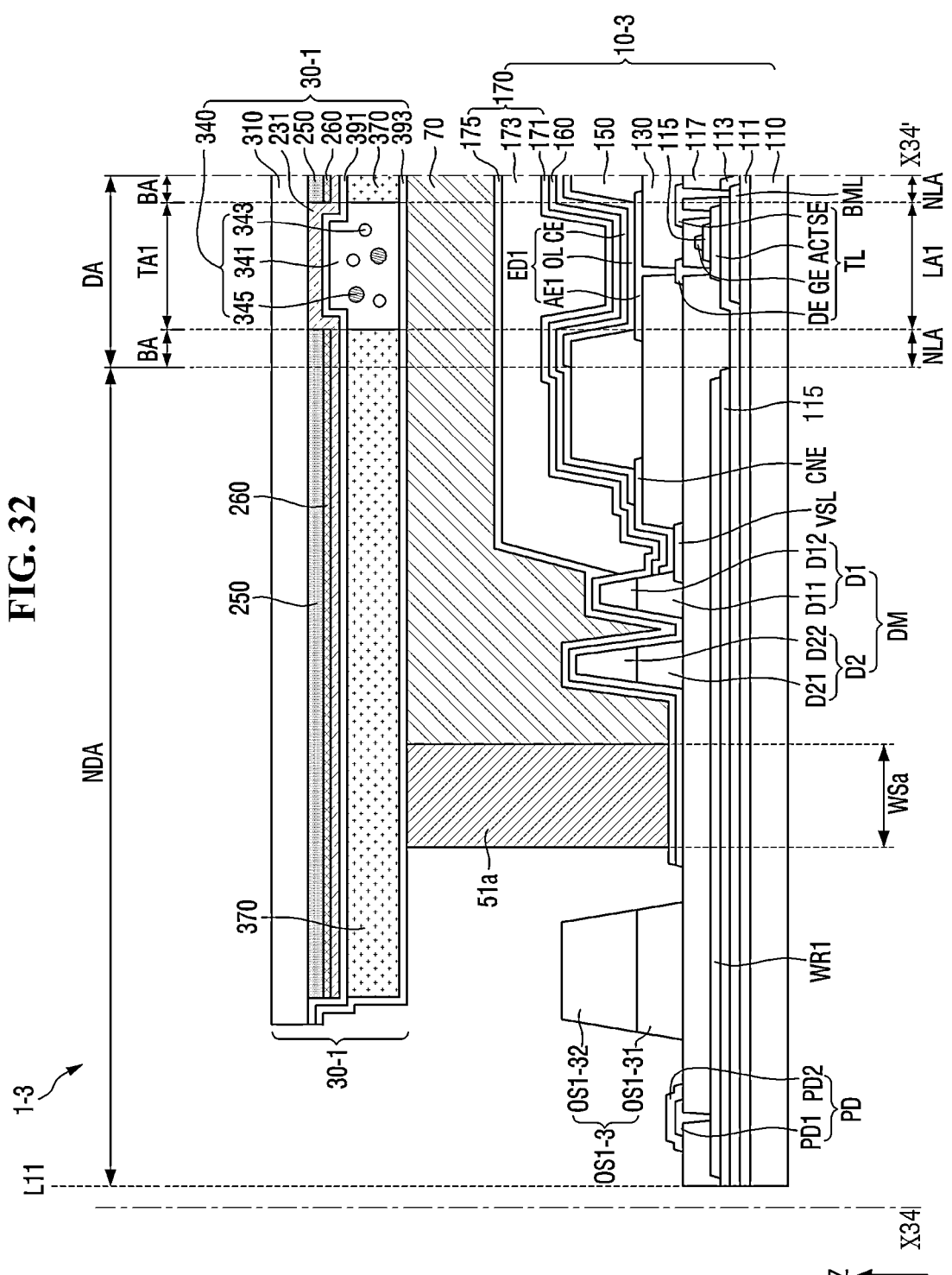
Figure 33:
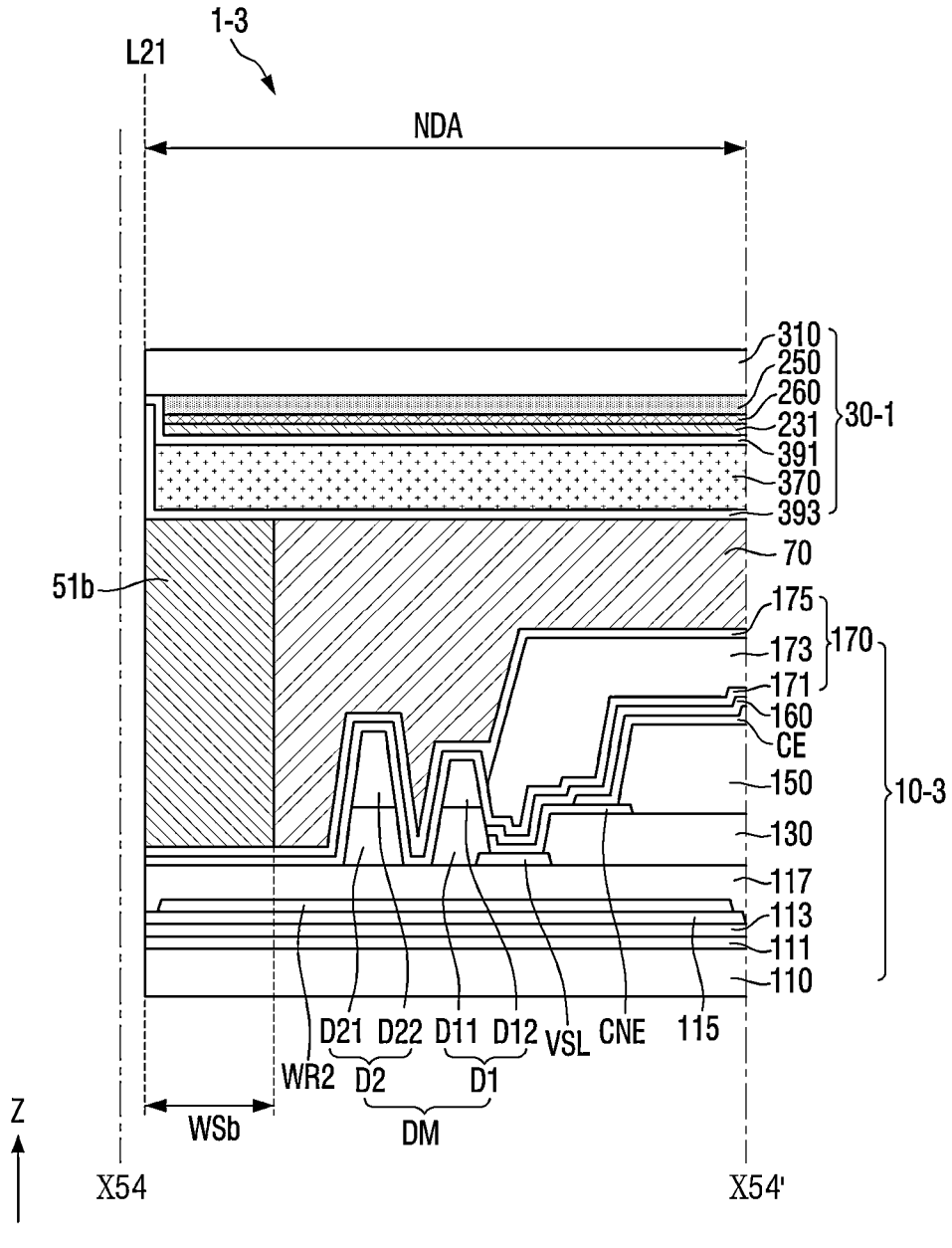
Figure 34:
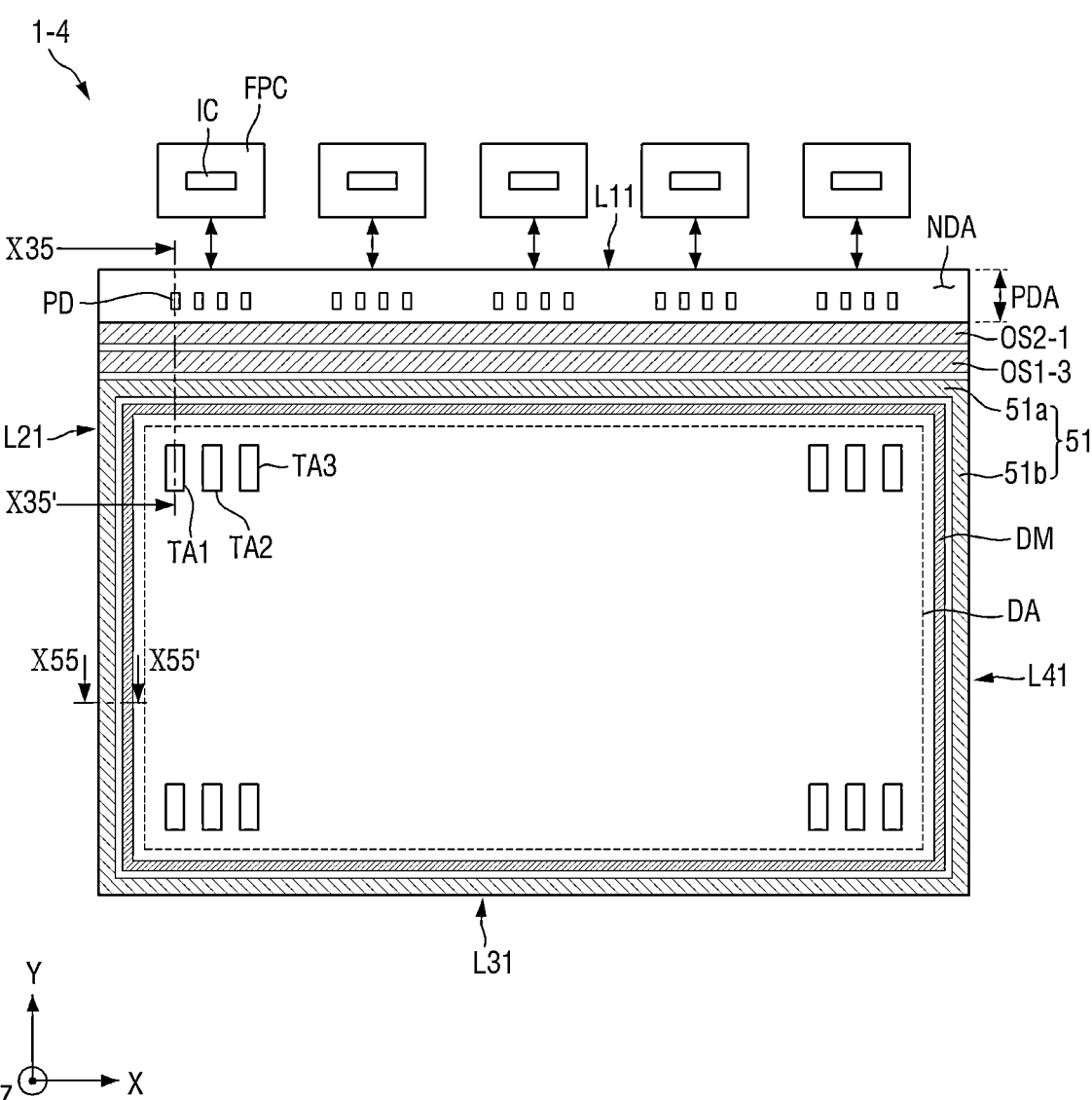
Figure 35:
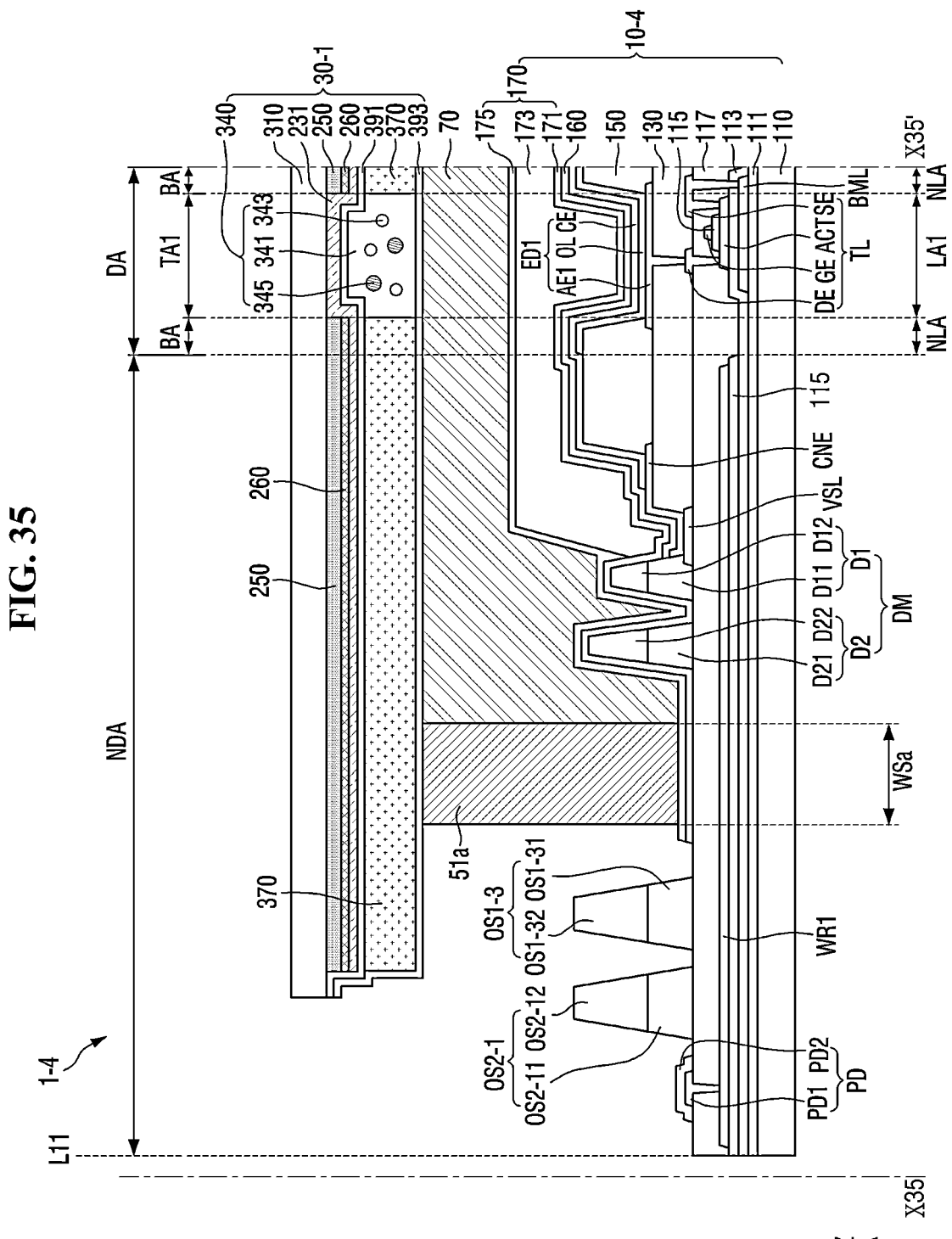
Figure 36:
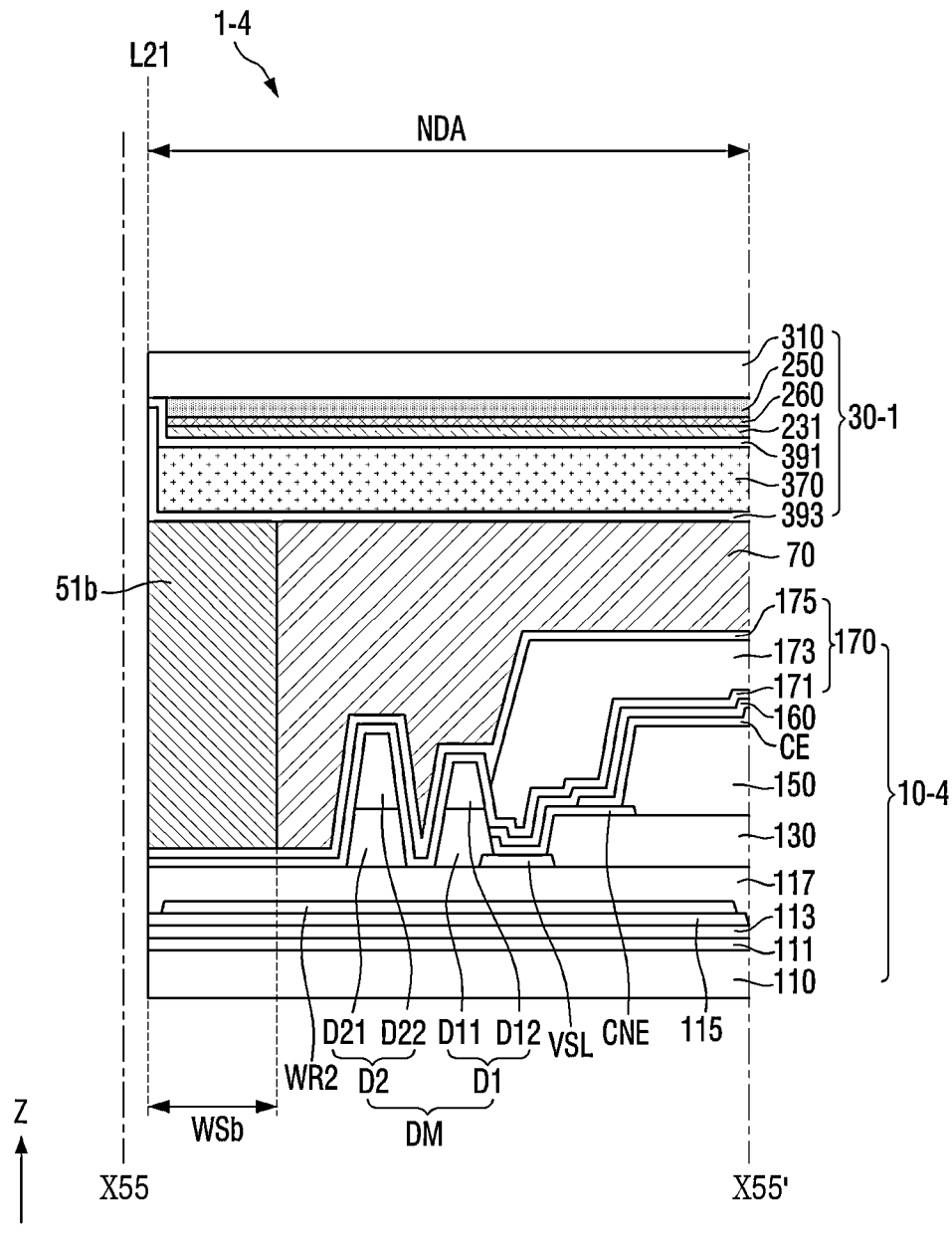
Figure 37:
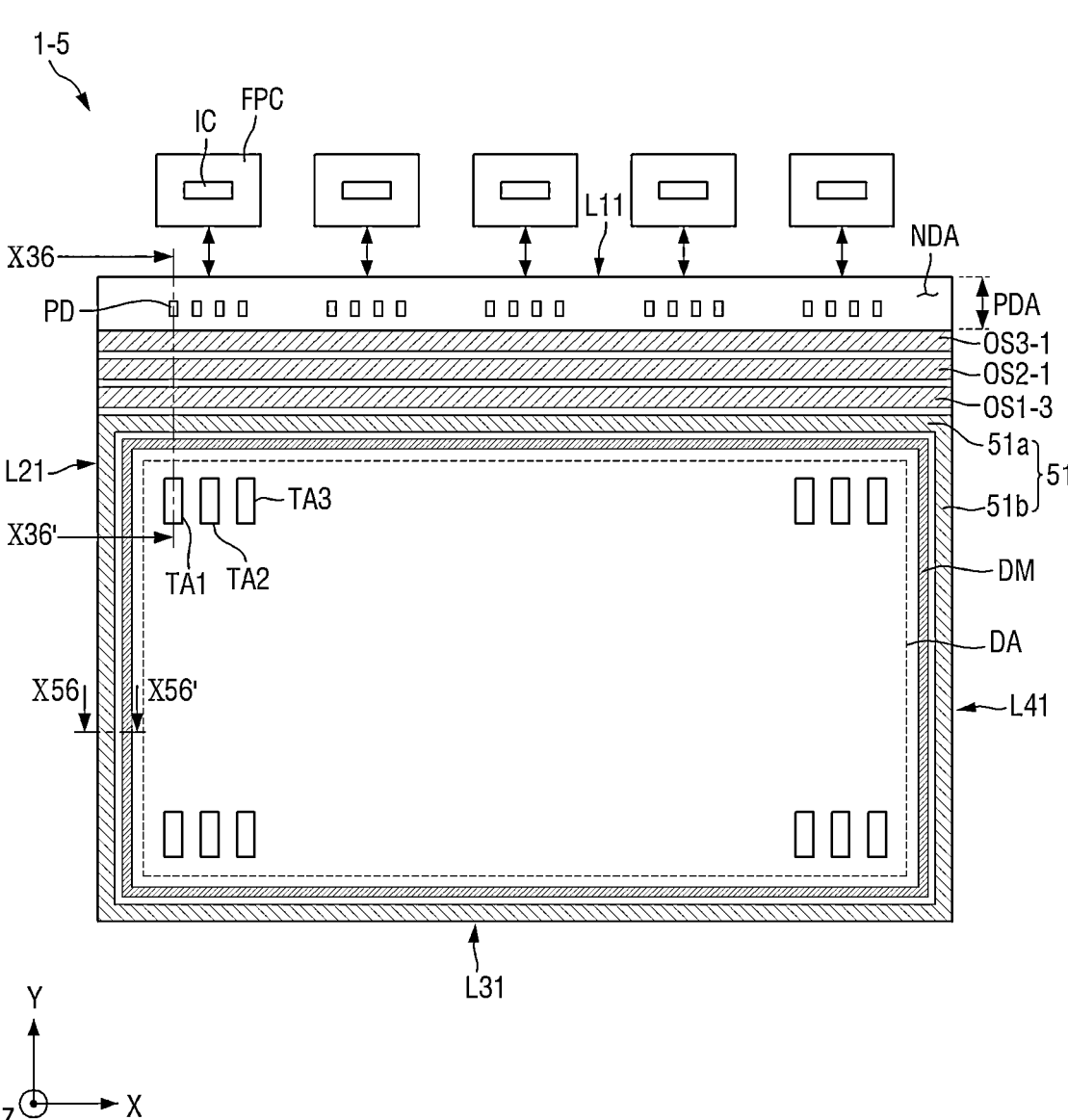
Figure 38:
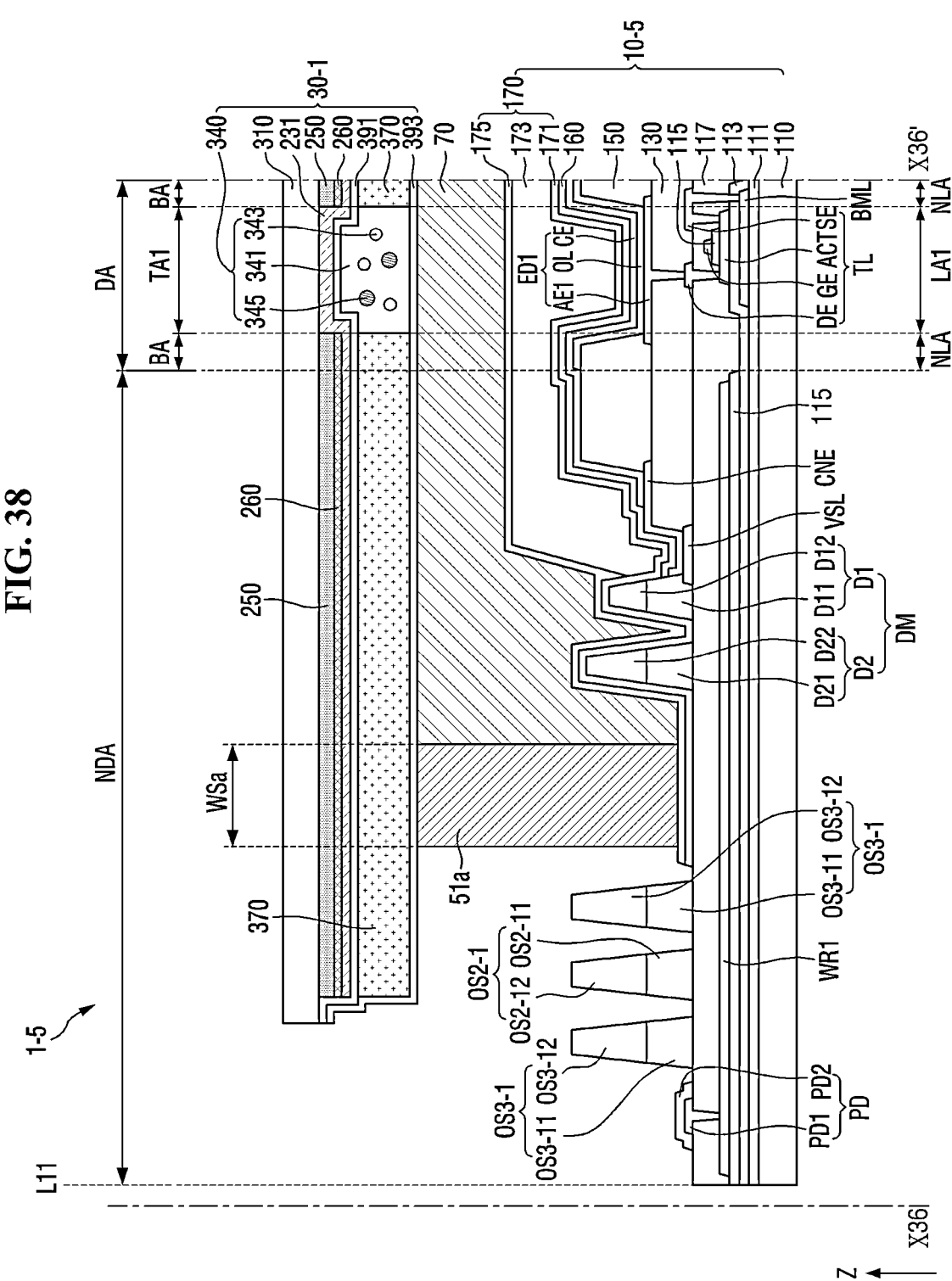
Figure 39:
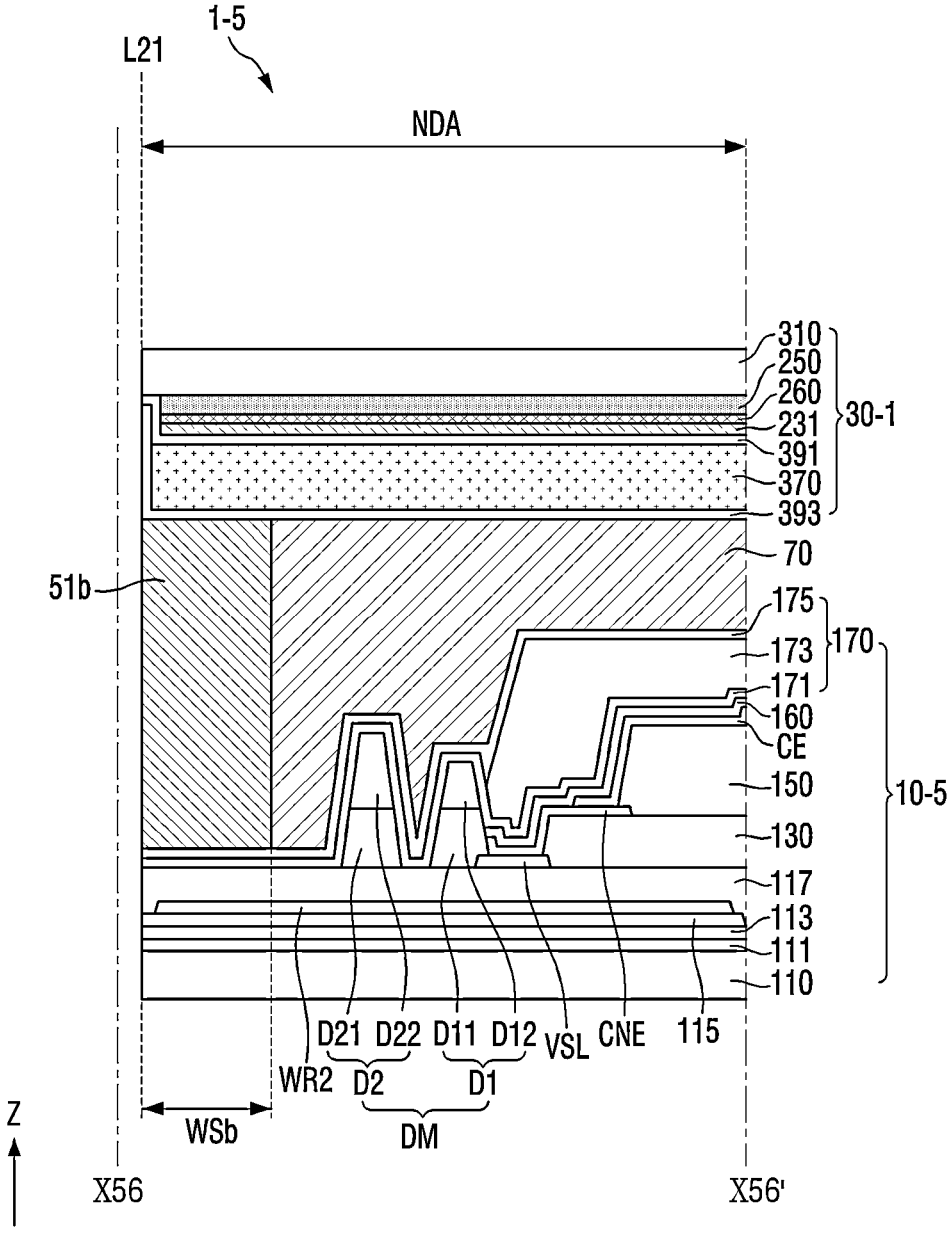

3 pattern, a second wavelength conversion pattern, and a light transmission pattern in the color conversion substrate of the display device according to an embodiment;

FIG. 20 is a plan view of a display device according to an embodiment separated from a mother substrate, more specifically, a plan view of a display device according to an embodiment on which side polishing has not been performed;

FIG. 21 is a cross-sectional view taken along line X31-X31' of FIG. 20 showing the display device on which side polishing has not be performed;

FIG. 22 is a cross-sectional view taken along line X51-X51' of FIG. 20 showing the display device on which side polishing has not be performed;

FIG. 23 is a plan view of a display device according to an embodiment;

FIG. 24 is a cross-sectional view taken along line X32-X32' of the display device of FIG. 23;

FIG. 25 is a cross-sectional view taken along line X52-X52' of the display device of FIG. 23;

FIG. 26 is a plan view of a display device separated from a mother substrate, on which side polishing has not been performed, according to an embodiment;

FIG. 27 is a plan view of a display device according to an embodiment;

FIG. 28 is a cross-sectional view taken along line X33-X33' of the display device of FIG. 27;

FIG. 29 is a cross-sectional view taken along line X53-X53' of the display device of FIG. 27;

FIG. 30 is a plan view of a display device separated from a mother substrate, on which side polishing has not been performed, according to an embodiment;

FIG. 31 is a plan view of a display device according to an embodiment;

FIG. 32 is a cross-sectional view taken along line X34-X34' of the display device of FIG. 31;

FIG. 33 is a cross-sectional view taken along line X54-X54' of the display device of FIG. 31;

FIG. 34 is a plan view of a display device according to an embodiment;

FIG. 35 is a cross-sectional view taken along line X35-X35' of the display device of FIG. 34;

FIG. 36 is a cross-sectional view taken along line X55-X55' of the display device of FIG. 34;

FIG. 37 is a plan view of a display device according to an embodiment;

FIG. 38 is a cross-sectional view taken along line X36-X36' of the display device of FIG. 37; and FIG. 39 is a cross-sectional view taken along line X56-X56' of the display device of FIG. 37.

DETAILED DESCRIPTION

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of at least one selected from the associated listed items. It will be further understood that the terms "comprises" and/or "comprising," or "includes" and/or "including" when used in this specification, specify the presence of stated features, integers, steps, operations, elements, and/or components, but do not preclude the presence or addition of one or more other features, integers, steps, operations, elements, components, and/or groups thereof.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Embodiments are described herein with reference to plan and cross-section illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the disclosure.

Embodiments are described herein with reference to plan and cross-section illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the disclosure.

Hereinafter, embodiments of the disclosure will be described in detail with reference to the accompanying drawings.

Figure 1:
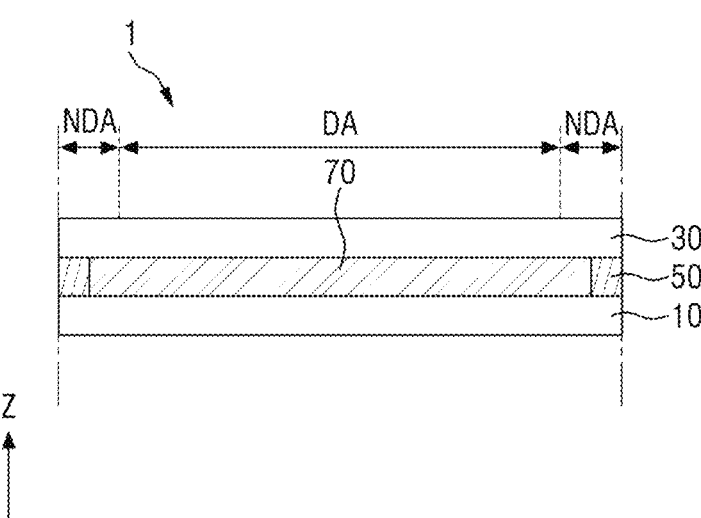
FIG. 1 is a cross-sectional view illustrating the schematic stacked structure of a display device according to an embodiment.

FIG. 1 is a cross-sectional view illustrating the schematic stacked structure of a display device 1 according to an embodiment.

Referring to FIG. 1, an embodiment of the display device 1 may be applied to or included in various electronic devices including small and medium-sized electronic devices such as tablet personal computers ("PC"s), smartphones, car navigation units, cameras, center information displays ("CID"s) provided in cars, wristwatch-type electronic devices, personal digital assistants ("PDA"s), portable multimedia players ("PMP"s) and game machines and medium and large-sized electronic devices such as televisions, external billboards, monitors, PCs and notebook/laptop computers. However, these are merely exemplary, and the display device 1 may also be employed in other electronic devices without departing from the teachings of the disclosure.

The display device 1 may include a display area DA which displays an image and a non-display area NDA which does not display an image. In an embodiment, the non-display area NDA may be located around the display area DA and may surround the display area DA. An image displayed in the display area DA may be viewed by or output to a user in a third direction Z or a thickness direction of the display device 1.

In an embodiment, the display device 1 includes a display substrate 10 and a color conversion substrate 30 facing the display substrate 10 and may further include a sealing member 50 bonding the display substrate 10 and the color conversion substrate 30 to each other and a filler 70 filling a space between the display substrate 10 and the color conversion substrate 30.

The display substrate 10 may include elements and circuits (e.g., pixel circuits such as switching elements) for displaying an image, a pixel defining layer defining a light emitting region and a non-light emitting region in the display area DA, and a self-light emitting element. In an embodiment, the self-light emitting element may include at least one selected from an organic light emitting diode, a quantum dot light emitting diode, an inorganic-based micro light emitting diode (e.g., a micro LED), and an inorganic-based nano light emitting diode (e.g., a nano LED). For case of description, embodiment where the self-light emitting element is an organic light emitting diode will hereinafter be described in detail, but not being limited thereto.

The color conversion substrate 30 may be located on the display substrate 10 and may face the display substrate 10. In an embodiment, the color conversion substrate 30 may include a color conversion pattern that converts the color of incident light. In an embodiment, the color conversion substrate 30 may include at least any one selected from a color filter and a wavelength conversion pattern as the color conversion pattern. In one embodiment, for example, the color conversion substrate 30 may include both the color filter and the wavelength conversion pattern.

The sealing member 50 may be located between the display substrate 10 and the color conversion substrate 30 in the non-display area NDA. The sealing member 50 may be disposed in the non-display area NDA along edges of the display substrate 10 and the color conversion substrate 30 to surround the display area DA in a plan view in the third direction Z. The display substrate 10 and the color conversion substrate 30 may be bonded to each other by the sealing member 50.

In an embodiment, the sealing member 50 may include or be made of an organic material. In one embodiment, for example, the sealing member 50 may include or be made of, but not limited to, epoxy resin.

The filler 70 may be located in the space between the display substrate 10 and the color conversion substrate 30 surrounded by the sealing member 50. The filler 70 may fill the space between the display substrate 10 and the color conversion substrate 30.

In an embodiment, the filler 70 may include or be made of a material capable of transmitting light. In an embodiment, the filler 70 may include or be made of an organic material. In one embodiment, for example, the filler 70 may include or be made of a silicon-based organic material, an epoxy-based organic material, or a mixture of a silicon-based organic material and an epoxy-based organic material.

In an embodiment, the filler 70 may include or be made of a material having an extinction coefficient of substantially zero. A refractive index and an extinction coefficient are correlated, and the extinction coefficient decreases as the refractive index decreases. In an embodiment, where the material of the filler 70 has the refractive index of about 1.7 or less, the extinction coefficient may substantially converge to zero. In an embodiment, the filler 70 may include or be made of a material having a refractive index of about 1.7 or less. Accordingly, light provided by the self-light emitting element may be effectively prevented or minimized from being transmitted and absorbed by the filler 70. In an embodiment, the filler 70 may include or be made of an organic material having a refractive index in a range of about 1.4 to about 1.6.

Figure 2:
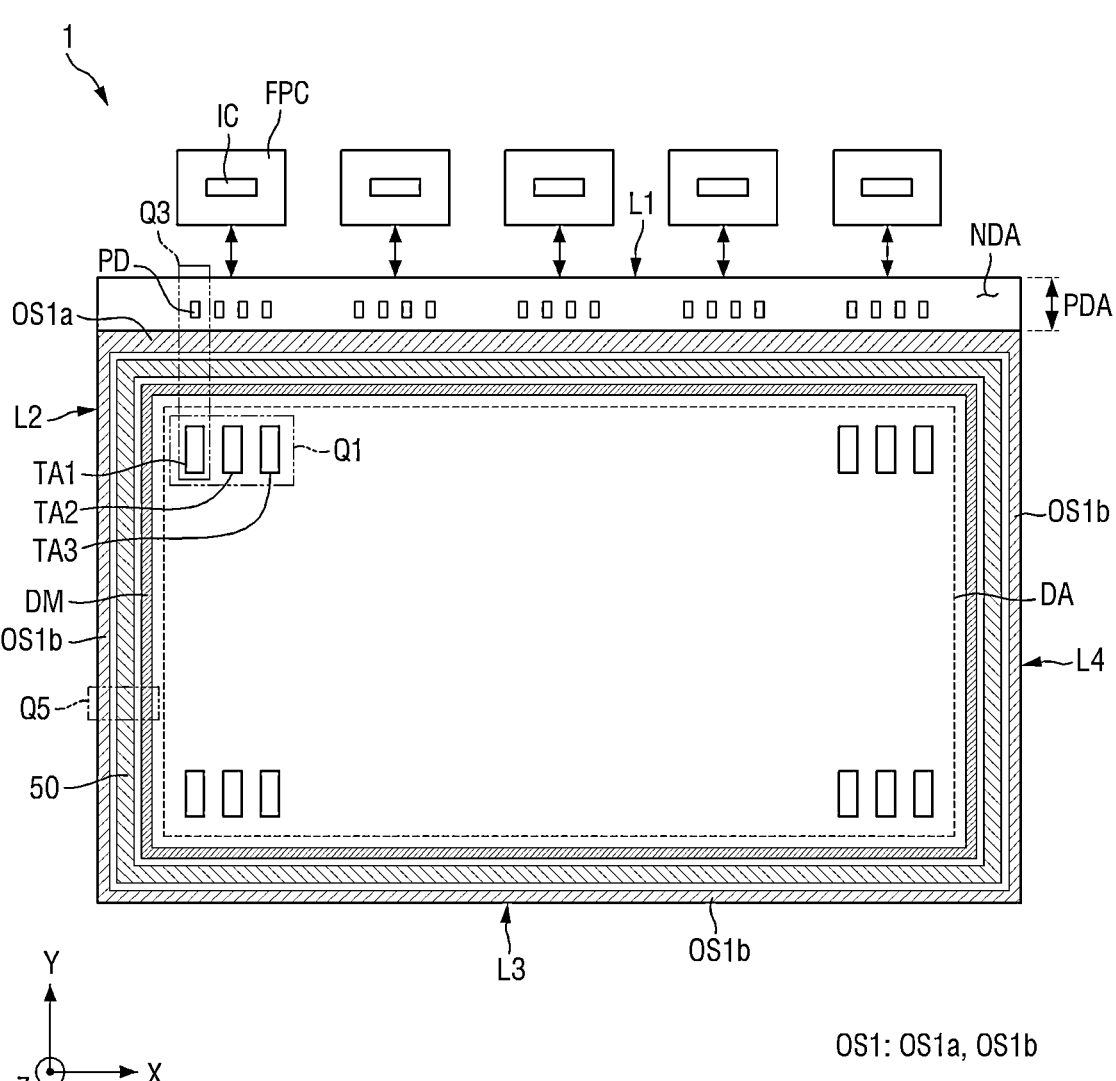
FIG. 2 is a plan view of the display device according to an embodiment.
Figure 3:
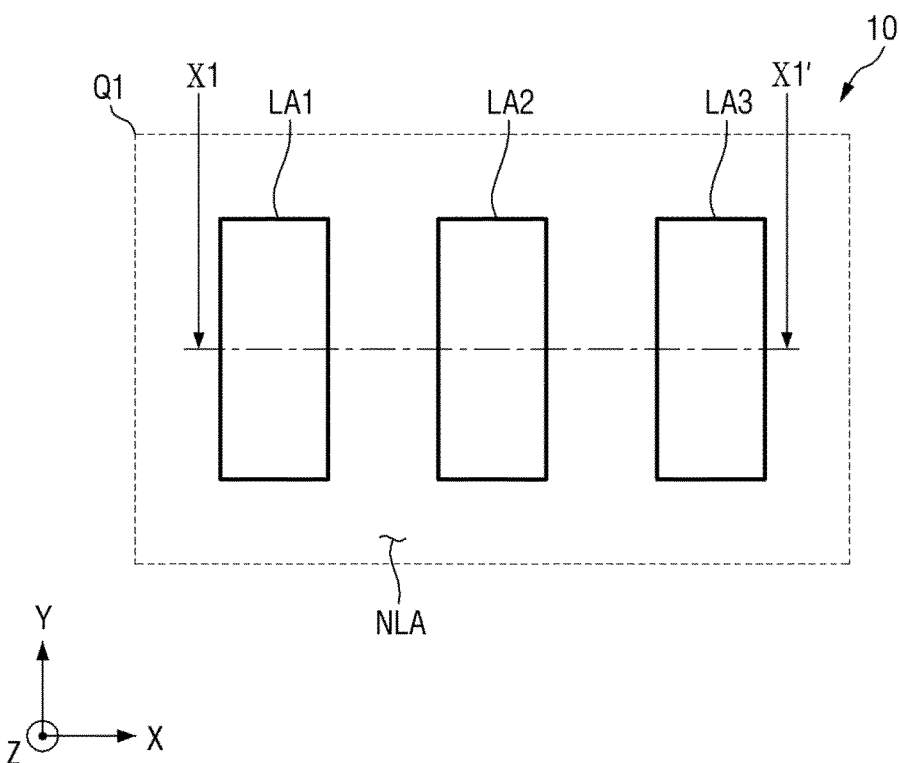
FIG. 3 is an enlarged plan view of part Q1 of FIG. 2, showing a display substrate included in the display device of FIG. 2.
Figure 4:
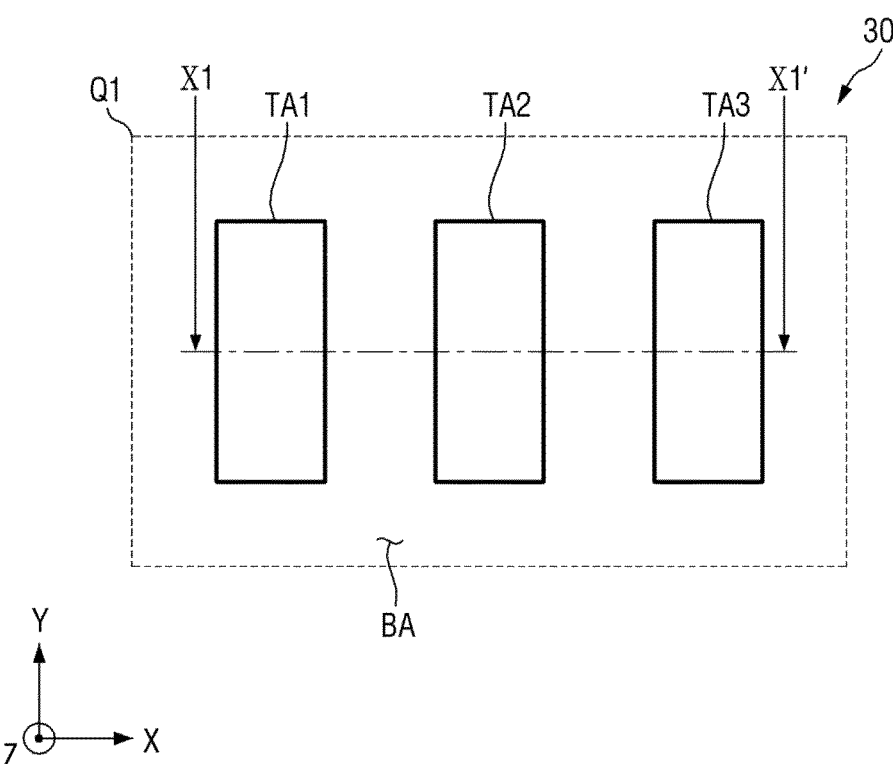
FIG. 4 is an enlarged plan view of part Q1 of FIG. 2, showing a color conversion substrate included in the display device of FIG. 2.
Figure 5:
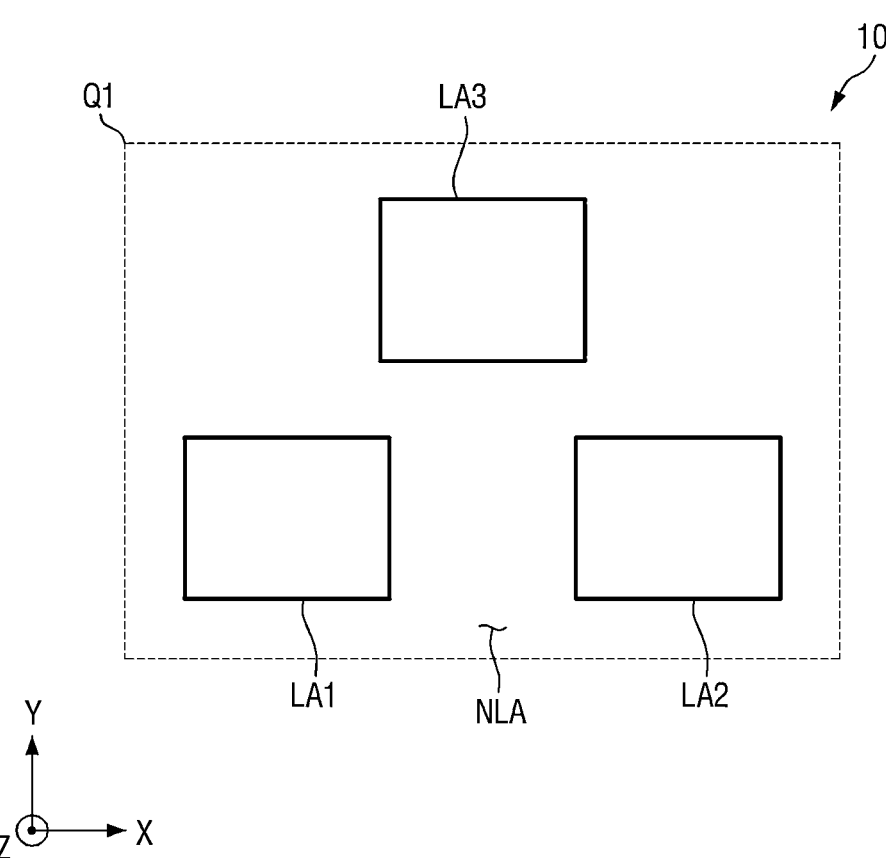
FIG. 5 is a plan view of a modification of FIG. 3.
Figure 6:
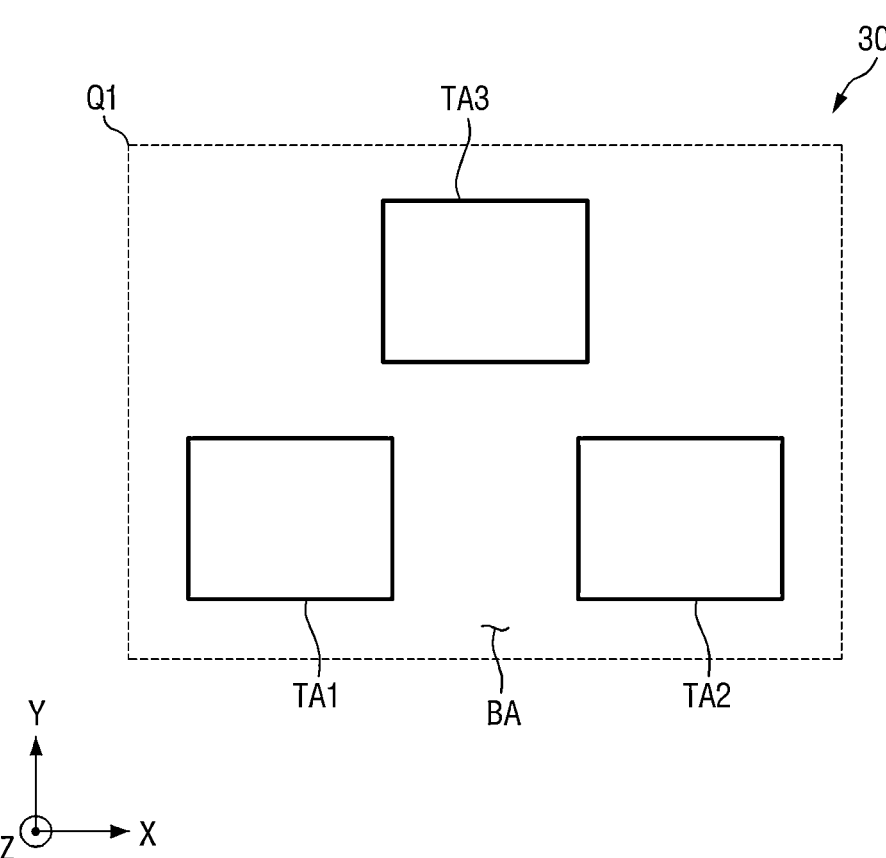
FIG. 6 is a plan view of a modification of FIG. 4.
Figure 7:
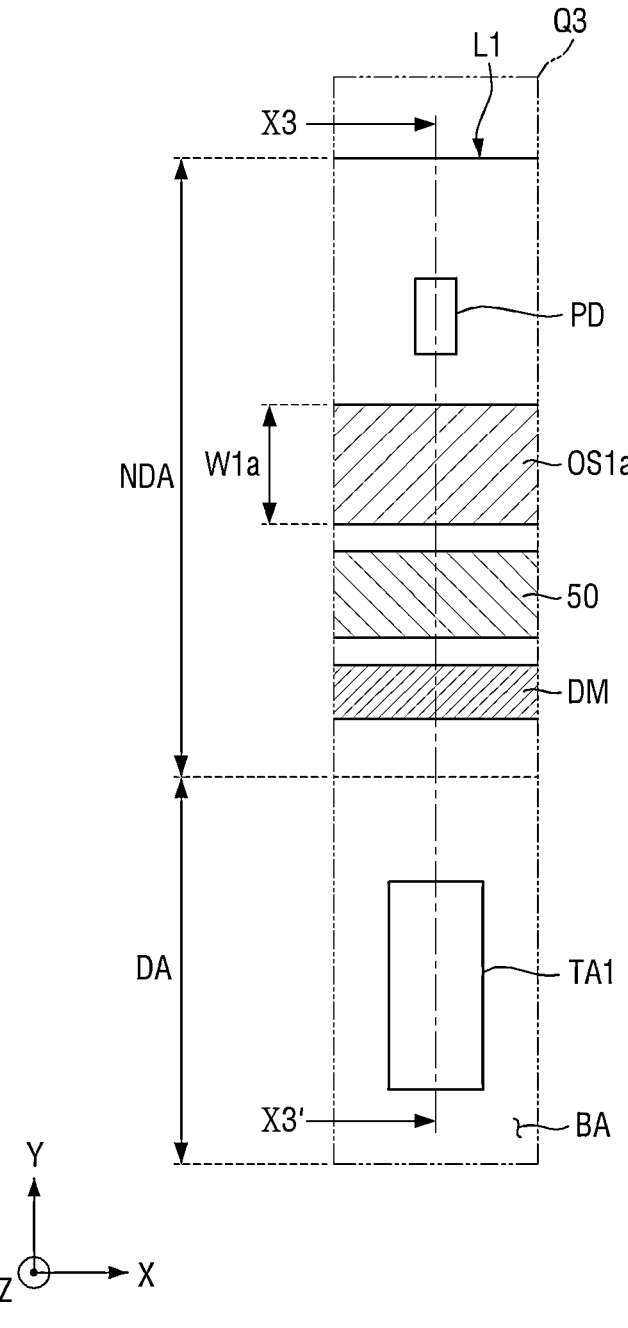
FIG. 7 is an enlarged view of part Q3 of FIG. 2.
Figure 8:
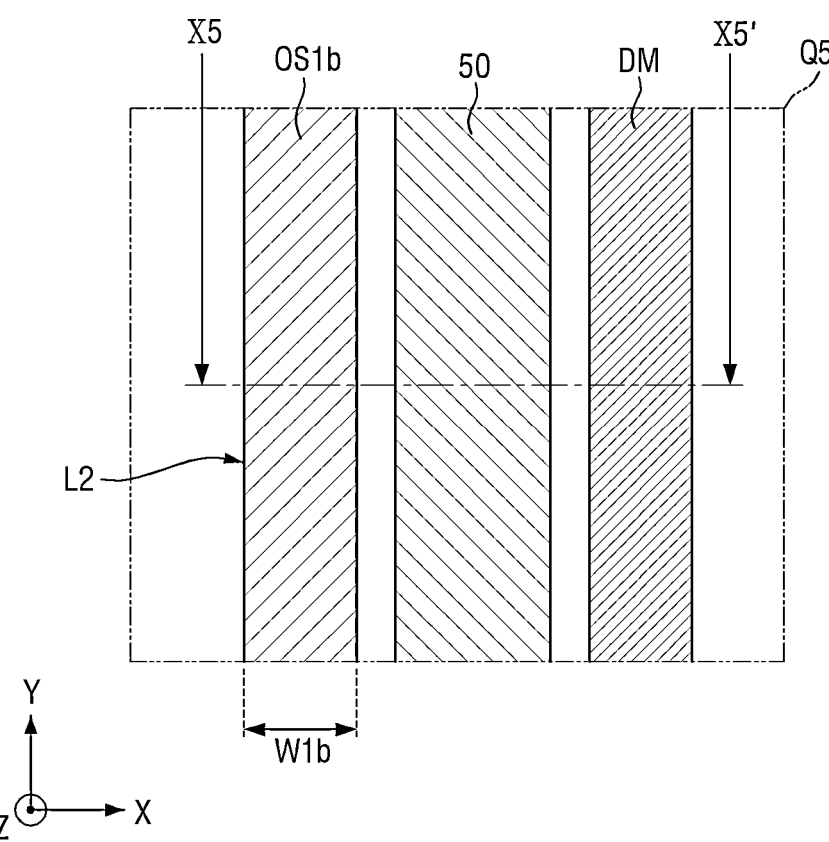
FIG. 8 is an enlarged plan view of part Q5 of FIG. 2.

FIG. 2 is a plan view of the display device 1 according to an embodiment. FIG. 3 is an enlarged plan view of part Q1 of FIG. 2, showing the display substrate 10 included in the display device 1 of FIG. 2. FIG. 4 is an enlarged plan view of part Q1 of FIG. 2, showing the color conversion substrate 30 included in the display device 1 of FIG. 2. FIG. 5 is a plan view of a modification of FIG. 3. FIG. 6 is a plan view of a modification of FIG. 4. FIG. 7 is an enlarged view of part Q3 of FIG. 2. FIG. 8 is an enlarged plan view of part Q5 of FIG. 2.

Referring to FIGS. 2 through 8 in addition to FIG. 1, in an embodiment, the display device 1 may be rectangular in a plan view in the third direction Z as illustrated in FIG. 2. The display device 1 may include two sides extending in a first direction X, that is, a first side L1 and a third side L3, and two sides extending in a second direction Y intersecting the first direction X, that is, a second side L2 and a fourth side L4. Corners at which the sides of the display device 1 meet may be right-angled, but the disclosure is not limited thereto. In an embodiment, lengths of the first side L1 and the third side L3 may be different from lengths of the second side L2 and the fourth side L4. In one embodiment, for example, the first side L1 and the third side L3 may be longer than the second side L2 and the fourth side L4. The planar shape of the display device 1 is not limited to those shown in the drawings, and may be variously modified to be in another shape, e.g., a circular shape or other polygonal shapes.

In an embodiment, the display device 1 may further include flexible circuit boards FPC and driving chips IC.

In an embodiment, as illustrated in FIG. 3, a plurality of light emitting regions and a non-light emitting region NLA may be defined in the display substrate 10 in the display area DA.

In an embodiment, a first light emitting region LA1, a second light emitting region LA2, and a third light emitting region LA3 may be defined in the display area DA of the display substrate 10. Each of the first light emitting region LA1, the second light emitting region LA2, and the third light emitting region LA3 may be a region where light generated by a light emitting element of the display substrate 10 is emitted out of the display substrate 10, and the non-light emitting region NLA may be a region where light is not emitted out of the display substrate 10. In an embodiment, the non-light emitting region NLA may surround each of the first light emitting region LA1, the second light emitting region LA2, and the third light emitting region LA3 in the display area DA.

In an embodiment, light emitted from the first light emitting region LA1, the second light emitting region LA2, and the third light emitting region LA3 may be light of a third color. In an embodiment, the light of the third color may be blue light and may have a peak wavelength in a range of about 440 nanometers (nm) to about 480 nm. Here, the peak wavelength refers to a wavelength at which the intensity of light is maximum.

In an embodiment, the first light emitting region LA1, the second light emitting region LA2, and the third light emitting region LA3 may form one pixel group, and a plurality of pixel groups may be defined in the display area DA.

In an embodiment, the first light emitting region LA1, the second light emitting region LA2, and the third light emitting region LA3 may be sequentially located or arranged along the first direction X as illustrated in FIG. 3. In an embodiment, the first light emitting region LA1, the second light emitting region LA2, and the third light emitting region LA3 forming one pixel group may be repeatedly arranged in the display area DA along the first direction X and the second direction Y or in a matrix form.

However, the disclosure is not limited thereto, and the arrangement of the first light emitting region LA1, the second light emitting region LA2, and the third light emitting region LA3 may be changed variously. In one alternative embodiment, for example, as illustrated in FIG. 5, the first light emitting region LA1 and the second light emitting region LA2 may neighbor each other along the first direction X, and the third light emitting region LA3 may be located on a side of the first light emitting region LA1 and the second light emitting region LA2 along the second direction Y.

For convenience of description, an embodiment where the first light emitting region LA1, the second light emitting region LA2, and the third light emitting region LA3 are arranged as illustrated in FIG. 3 will hereinafter be described in detail.

In such an embodiment, as illustrated in FIG. 4, a plurality of light transmitting regions and a light blocking region BA may be defined in the color conversion substrate 30 in the display area DA. Each of the light transmitting regions may be a region where light emitted from the display substrate 10 is transmitted through the color conversion substrate 30 and provided to the outside of the display device 1. The light blocking region BA may be a region through which light emitted from the display substrate 10 is not transmitted.

In an embodiment, a first light transmitting region TA1, a second light transmitting region TA2 and a third light transmitting region TA3 may be defined in the color conversion substrate 30.

In an embodiment, the first light transmitting region TA1 may correspond to the first light emitting region LA1 or may overlap the first light emitting region LA1. In such an embodiment, the second light transmitting region TA2 may correspond to or overlap the second light emitting region LA2, and the third light transmitting region TA3 may correspond to or overlap the third light emitting region LA3.

In an embodiment, where the first light emitting region LA1, the second light emitting region LA2, and the third light emitting region LA3 are sequentially located along the first direction X as illustrated in FIG. 3, the first light transmitting region TA1, the second light transmitting region TA2, and the third light transmitting region TA3 may be sequentially located along the first direction X as illustrated in FIG. 4.

In an alternative embodiment, where the first light emitting region LA1 and the second light emitting region LA2 neighbor each other along the first direction X, and the third light emitting region LA3 is located on a side of the first light emitting region LA1 and the second light emitting region LA2 along the second direction Y as illustrated in FIG. 5, the first light transmitting region TA1 and the second light emitting region TA2 may neighbor each other along the first direction X, and the third light transmitting region TA3 may be located on a side of the first light transmitting region TA1 and the second light transmitting region TA2 along the second direction Y as illustrated in FIG. 6.

In an embodiment, light of the third color provided by the display substrate 10 may be emitted out of the display device 1 through the first light transmitting region TA1, the second light transmitting region TA2, and the third light transmitting region TA3. When light emitted out of the display device 1 in the first light transmitting region TA1 is referred to as first output light, light emitted out of the display device 1 in the second light transmitting region TA2 is referred to as second output light, and light emitted out of the display device 1 in the third light transmitting region TA3 is referred to as third output light, the first output light may be light of a first color, the second output light may be light of a second color different from the first color, and the third output light may be light of the third color. In an embodiment, the light of the third color may be blue light having a peak wavelength in a range of about 440 nm to about 480 nm as described above, and the light of the first color may be red light having a peak wavelength in a range of about 610 nm to about 650 nm. In such an embodiment, the light of the second color may be green light having a peak wavelength in a range of about 510 nm to about 550 nm.

The light blocking region BA may be located around the first light transmitting region TA1, the second light transmitting region TA2, and the third light transmitting region TA3 of the color conversion substrate 30 in the display area DA. In an embodiment, the light blocking region BA may surround the first light transmitting region TA1, the second light transmitting region TA2, and the third light transmitting region TA3. In such an embodiment, the light blocking region BA may be located in the non-display area NDA of the display device 1.

Referring again to FIG. 2, a dam member DM, the sealing member 50, and a first support member OS1 may be disposed in the non-display area NDA of the display device 1.

The dam member DM may block an organic material (or monomer) from overflowing in a process of forming an encapsulation layer disposed in the display area DA. Accordingly, the organic material of the encapsulation layer may be prevented from extending toward edges of the display device 1.

In an embodiment, the dam member DM may completely surround the display area DA in a plan view in the third direction Z.

The sealing member 50 may bond the display substrate 10 and the color conversion substrate 30 together as described above.

The sealing member 50 may be located outside of the dam member DM in the non-display area NDA and may completely surround the dam member DM and the display area DA in a plan view in the third direction Z.

The first support member OS1 may support masks used in a process of forming elements of the display substrate 10, for example, a light emitting layer, a cathode, a first capping layer, and inorganic layers of the encapsulation layer included in the display substrate 10.

The first support member OS1 may be located outside of the sealing member 50 in the non-display area NDA. In such an embodiment, the first support member OS1 may be located opposite the dam member DM with the sealing member 50 interposed between them. In an embodiment, the first support member OS1 may surround the sealing member 50 in a plan view in the third direction Z.

In an embodiment, the first support member OS1 may include a first portion OS1*a* adjacent to the first side L1 of the display device 1 and a second portion OS1*b* disposed along the second side L2, the third side L3 and the fourth side L4 of the display device 1.

In an embodiment, the first portion OS1*a* and the second portion OS1*b* may be connected to each other, or the first portion OS1*a* is extended from the second portion OS1*b*.

The first portion OS1*a* may extend along the first direction X and may be spaced apart from the first side L1 of the display device 1 along the second direction Y. The first portion OS1*a* may be located between connection pads PD to be described later and the sealing member 50.

The second portion OS1*b* may be disposed along the second side L2, the third side L3 and the fourth side L4 and may be located relatively closer to the edges of the display device 1 or the sides of the display device 1 than the first portion OS1*a*. In such an embodiment, a distance between an edge of the display device 1 and the first portion OS1*a* may be greater than a distance between an edge of the display device 1 and the second portion OS1*b*.

In an embodiment, the second portion OS1*b* may be aligned with the second side L2, the third side L3, and the fourth side L4 of the display device 1.

In an embodiment, a width of the first portion OS1*a* of the first support member OS1 and a width of the second portion OS1*b* of the first support member OS1 may be different from each other.

In one embodiment, for example, as illustrated in FIGS. 7 and 8, a width W1*a* of the first portion OS1*a* may be greater than a width W1*b* of the second portion OS1*b*. In such an embodiment, a part of the first support member OS1 which is located between the connection pads PD and the display area DA may be wider than a part of the first support member OS1 which is not located between the connection pads PD and the display area DA.

The non-display area NDA of the display device 1 may include a pad area PDA, and a plurality of connection pads PD may be located in the pad area PDA.

In an embodiment, the connection pads PD may be located in a part adjacent to a long side of the non-display area NDA, for example, located in a region adjacent to the first side L1 of the non-display area NDA. The connection pads PD may be electrically connected to pixel circuits located in the display area DA by connection wirings or the like.

In an embodiment, the connection pads PD may be located outside of the first support member OS1. In such an embodiment, the connection pads PD may be located relatively farther away from the display area DA than the first support member OS1. In an embodiment, the connection pads PD may be located between the first portion OS1*a* of the first support member OS1 and the first side L1 of the display device 1.

The display substrate 10 (see FIG. 1) of the display device 1 may include the dam member DM, the first support member OS1, and the connection pads PD described above.

The flexible circuit boards FPC may be connected to the connection pads PD. The flexible circuit boards FPC may electrically connect a circuit board which provides signals, power, etc. for driving the display device 1 to the display substrate 10 (see FIG. 1).

The driving chips IC may be electrically connected to the circuit board to receive data and signals. In an embodiment, the driving chips IC may be data driving chips and may receive a data control signal and image data from the circuit board and generate and output data voltages corresponding to the image data.

In an embodiment, the driving chips IC may be mounted on the flexible circuit boards FPC. In one embodiment, for example, the driving chips IC may be mounted on the flexible circuit boards FPC in the form of chips on film ("COF").

The data voltages provided by the driving chips IC and the power provided by the circuit board may be transferred to the pixel circuits of the display substrate 10 (see FIG. 1) via the flexible circuit boards FPC and the connection pads PD.

Figure 9:
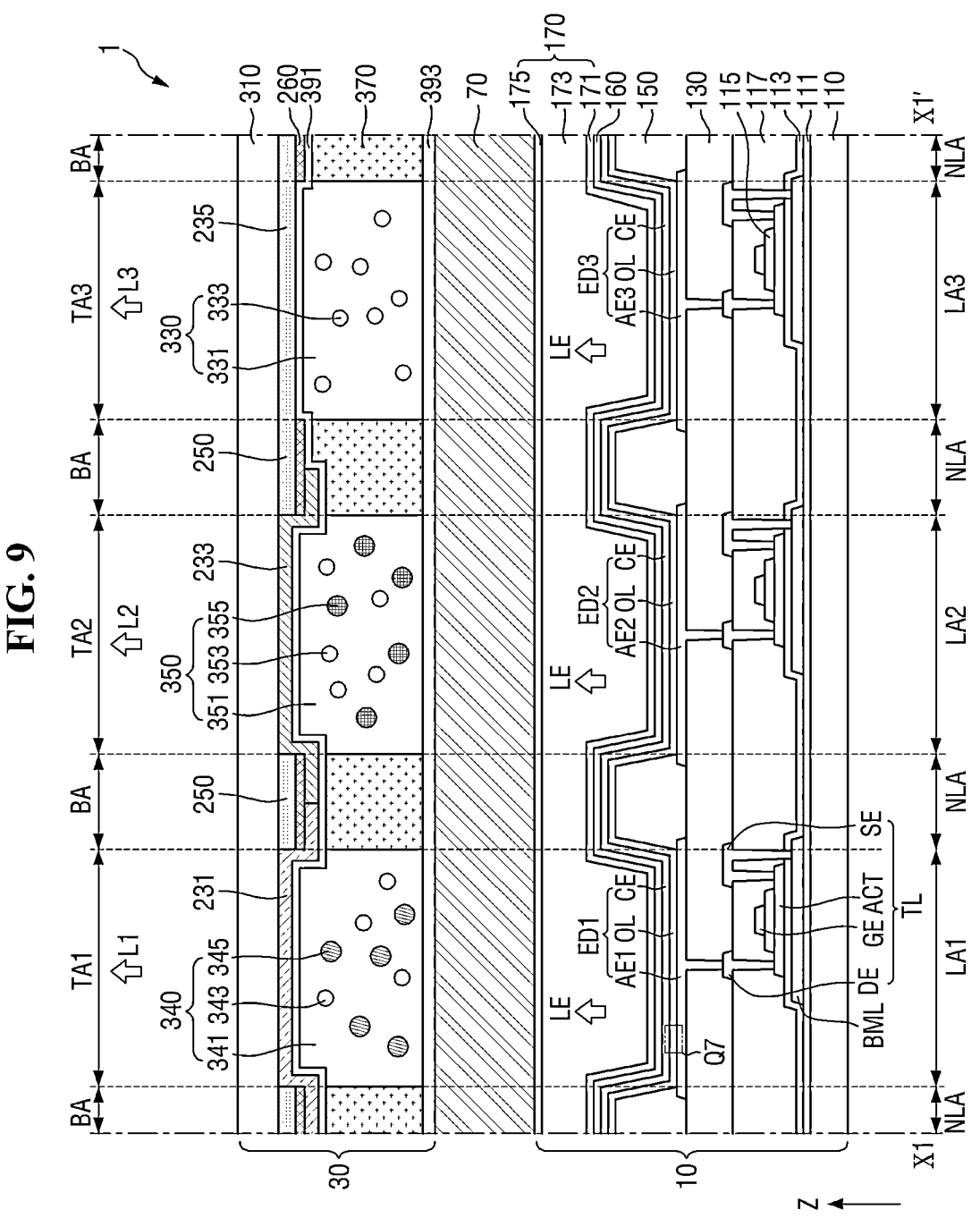
FIG. 9 is a cross-sectional view taken along line X1-X1' of the display device of FIGS. 3 and 4.
Figure 10:
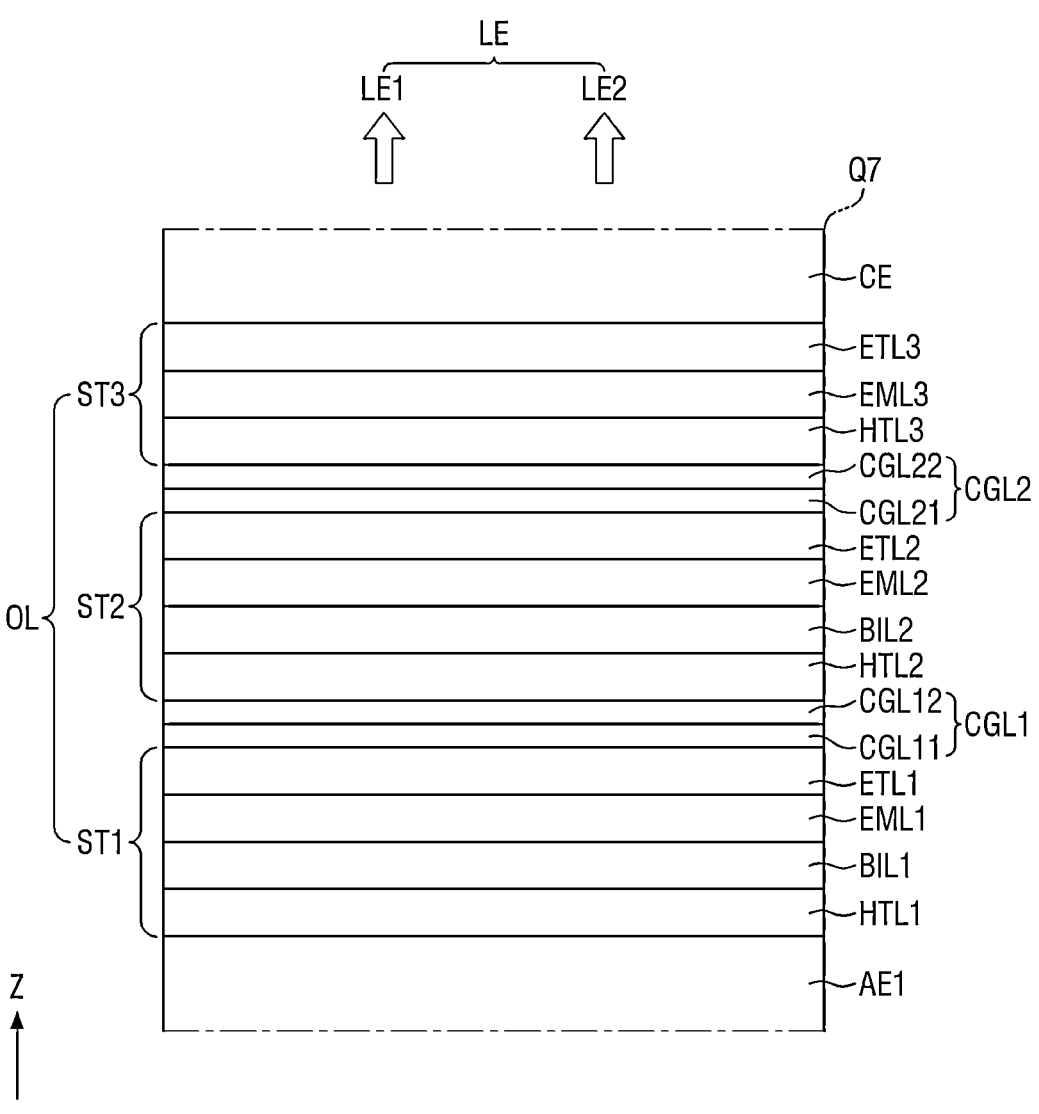
FIG. 10 is an enlarged cross-sectional view of part Q7 of FIG. 9.
Figure 11:
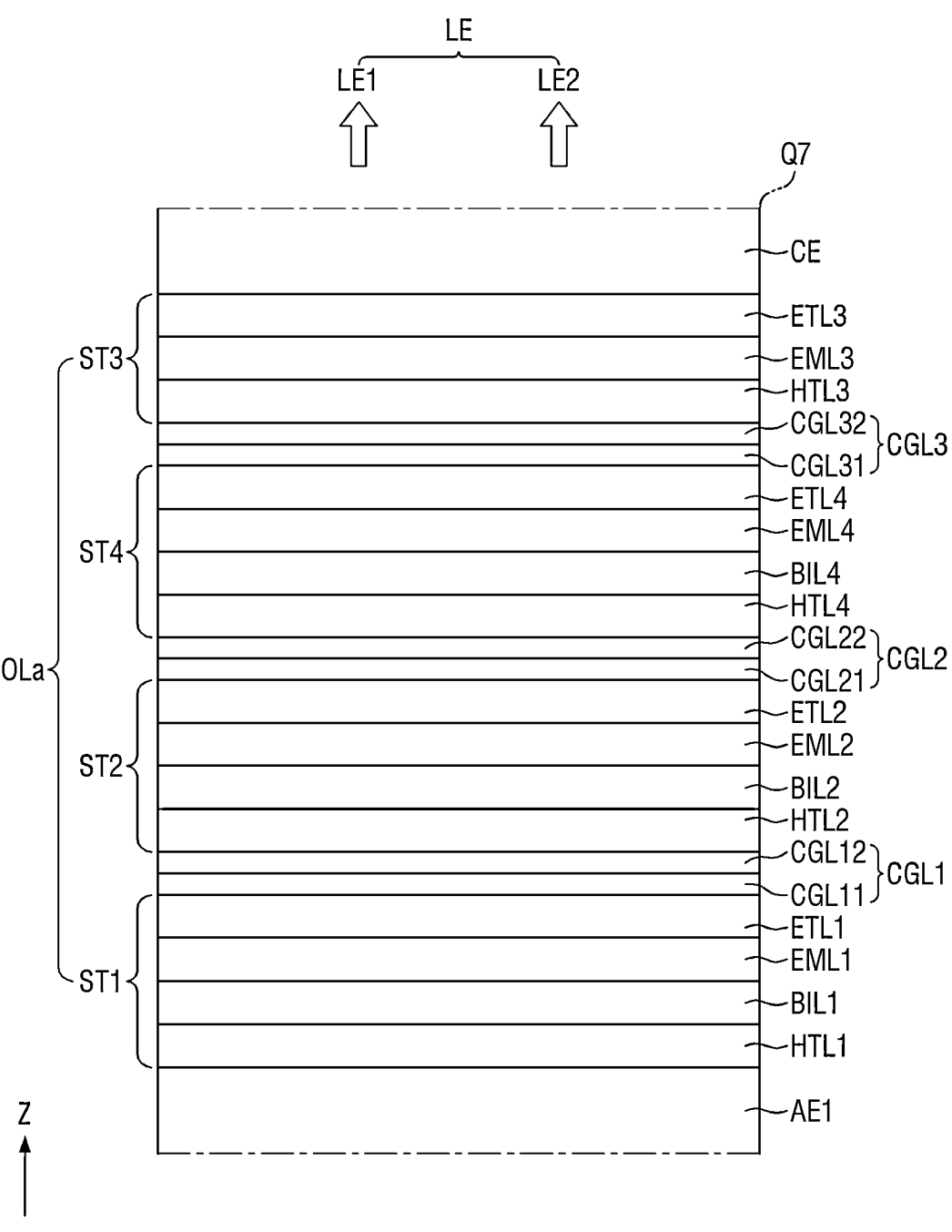
FIG. 11 is a cross-sectional view of a modification of the structure illustrated in FIG. 10.
Figure 12:
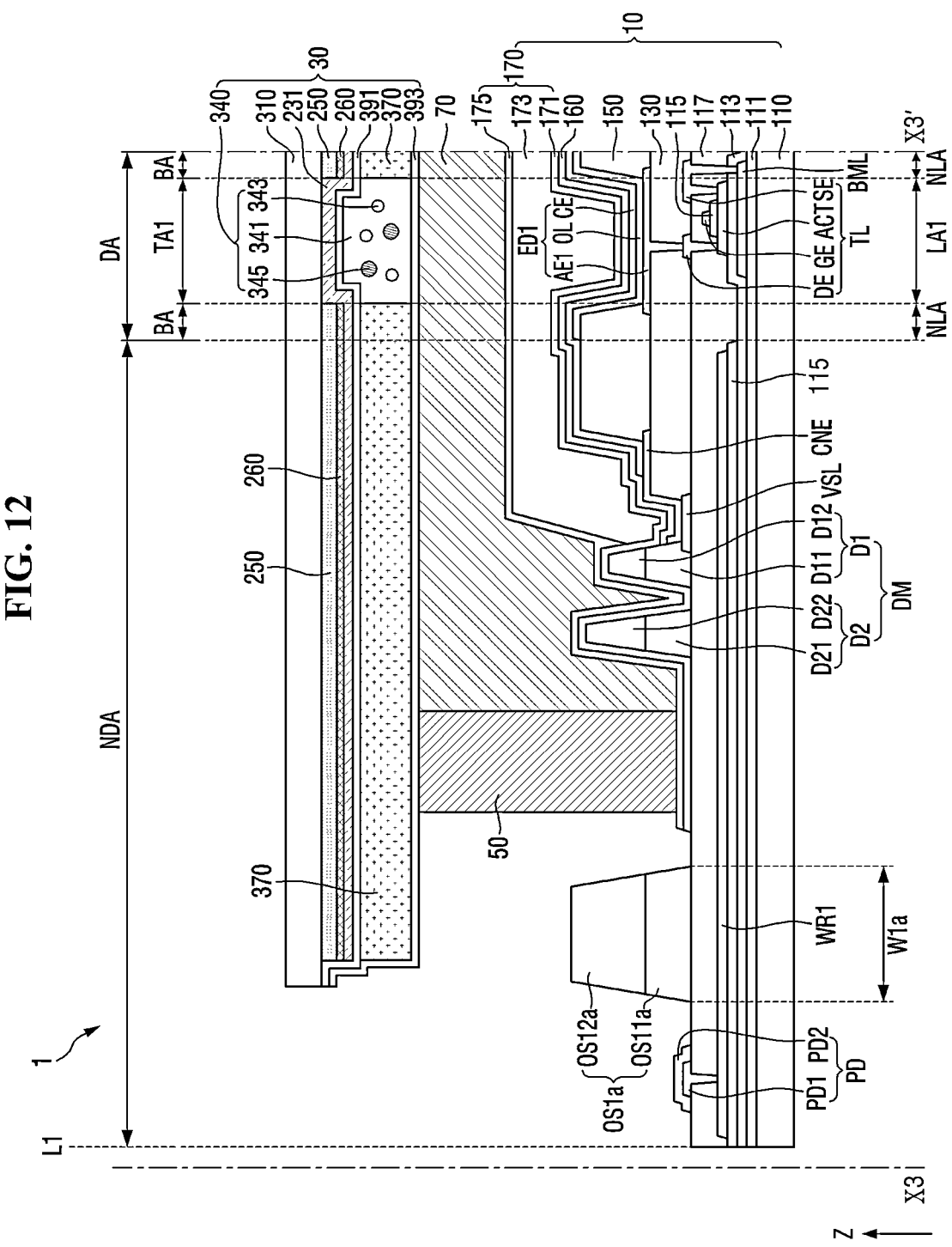
FIG. 12 is a cross-sectional view taken along line X3-X3' of the display device, of FIG. 7.
Figure 13:
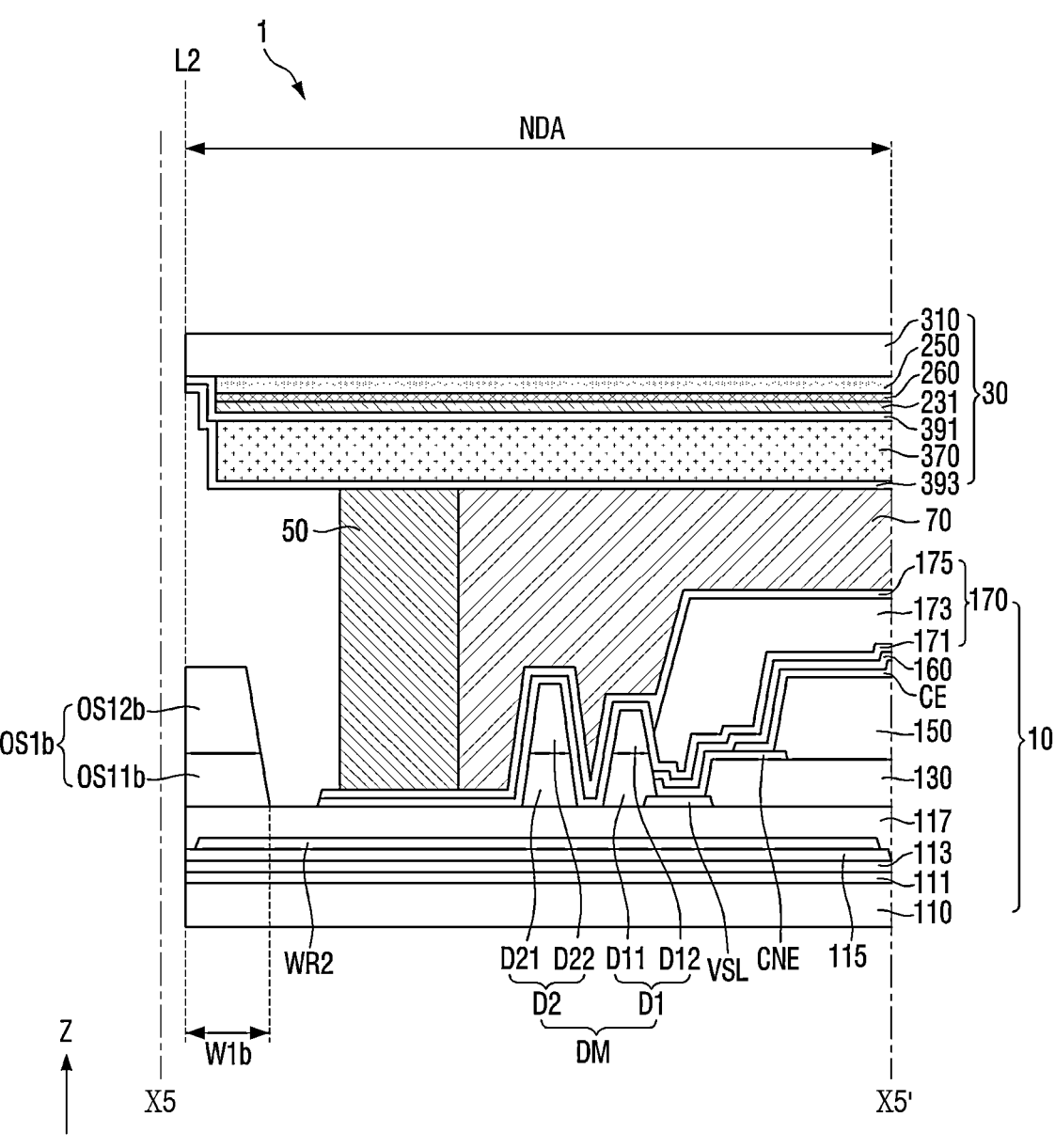
FIG. 13 is a cross-sectional view taken along line X5-X5' of the display device of FIG. 8.
Figure 14:
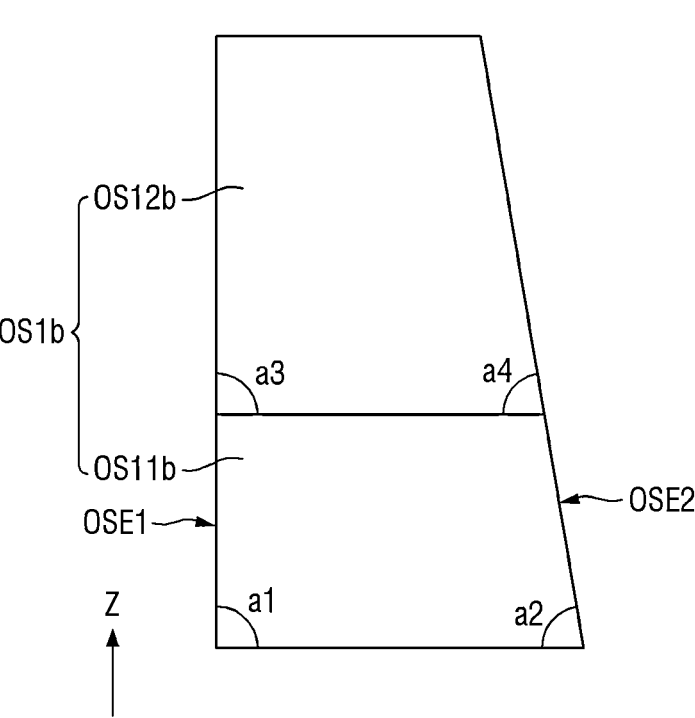
FIG. 14 is an enlarged cross-sectional view of a second portion of a first support member illustrated in FIG. 13.

The structure of the display device 1 will now be described in greater detail FIG. 9 is a cross-sectional view taken along line X1-X1' of the display device 1 of FIGS. 3 and 4. FIG. 10 is an enlarged cross-sectional view of part Q7 of FIG. 9. FIG. 11 is a cross-sectional view of a modification of the structure illustrated in FIG. 10. FIG. 12 is a cross-sectional view taken along line X3-X3' of the display device 1 of FIG. 7. FIG. 13 is a cross-sectional view taken along line X5-X5' of the display device 1 of FIG. 8. FIG. 14 is an enlarged cross-sectional view of the second portion OS1*b* of the first support member OS1 illustrated in FIG. 13.

Referring to FIGS. 9 through 14 in addition to FIGS. 1 through 8, an embodiment of the display device 1 may include the display substrate 10 and the color conversion substrate 30 as described above and may further include the filler 70 located between the display substrate 10 and the color conversion substrate 30.

The display substrate 10 will now be described.

In an embodiment, a first base 110 in the display substrate 10 may include or be made of a light transmitting material. In an embodiment, the first base 110 may be a glass substrate or a plastic substrate. In an embodiment, where the first base 110 is a plastic substrate, the first base 110 may have flexibility.

In an embodiment, the light emitting regions LA1 through LA3 and the non-light emitting region NLA may be defined in the first base 110 of the display area DA as described above.

In an embodiment, the first side L1, the second side L2, the third side L3 and the fourth side L4 of the display device 1 may be defined by or the same as four sides of the first base 110. In such an embodiment, the first side L1, the second side L2, the third side L3 and the fourth side L4 of the display device 1 may also be referred to as a first side L1, a second side L2, a third side L3 and a fourth side L4 of the first base 110.

A buffer layer 111 may be further located on the first base 110 in the display substrate 10. The buffer layer 111 may be located on the first base 110 and disposed in the display area DA and the non-display area NDA. The buffer layer 111 may block foreign substances or moisture introduced through the first base 110. In one embodiment, for example, the buffer layer 111 may include an inorganic material such as $SiO_2$, $SiN_x$ or SiON and may have a single layer or multilayer structure.

A light blocking pattern BML may be located on the buffer layer 111 in the display substrate 10. The light blocking pattern BML may block external light or light of a light emitting element from entering a semiconductor layer ACT to be described later, thereby preventing and reducing generation of leakage current due to light in a thin-film transistor TL to be described later.

In an embodiment, the light blocking pattern BML may include or be made of a material blocking light and having conductivity. In one embodiment, for example, the light blocking pattern BML may include at least one metal selected from silver (Ag), nickel (Ni), gold (Au), platinum (Pt), aluminum (Al), copper (Cu), molybdenum (Mo), titanium (Ti) and neodymium (Nd), or an alloy thereof. In an embodiment, the light blocking pattern BML may have a single layer structure or a multilayer structure. In one embodiment, for example, where the light blocking pattern BML has a multilayer structure, the light blocking pattern BML may be, but is not limited to, a stacked structure of titanium (Ti)/copper (Cu)/indium tin oxide ("ITO") or a stacked structure of titanium (Ti)/copper (Cu)/aluminum oxide ($Al_2O_3$).

In an embodiment, the light blocking pattern BML may be provided in plural to correspond to each semiconductor layer ACT and overlap the semiconductor layer ACT. In an embodiment, a width of the light blocking pattern BML may be greater than a width of the semiconductor layer ACT.

In an embodiment, the light blocking pattern BML may be a part of a wiring that electrically connects a data line, a power supply line, a thin-film transistor not illustrated in the drawings, and a thin-film transistor TL illustrated in the drawings to each other. In an embodiment, the light blocking pattern BML may include or be made of a material having smaller resistance than a second conductive layer or a source electrode SE and a drain electrode DE included in the second conductive layer.

A first insulating layer 113 may be located on the light blocking pattern BML in the display substrate 10. In an embodiment, the first insulating layer 113 may be located in the display area DA and the non-display area NDA. The first insulating layer 113 may cover the light blocking pattern BML. In an embodiment, the first insulating layer 113 may include an inorganic material such as $SiO_2$, $SiN_x$, SiON, $Al_2O_3$, $TiO_2$, $Ta_2O$, $HfO_2$, or $ZrO_2$.

The semiconductor layer ACT may be located on the first insulating layer 113 in the display substrate 10. In an embodiment, the semiconductor layer ACT may be disposed to correspond to each of the first light emitting region LA1, the second light emitting region LA2, and the third light emitting region LA3 of the display area DA.

In an embodiment, the semiconductor layer ACT may include an oxide semiconductor. In one embodiment, for example, the semiconductor layer ACT may include or be made of a Zn oxide-based material such as Zn oxide, In—Zn oxide or Ga—In—Zn oxide and may be an In—Ga—Zn—O (IGZO) semiconductor having metals such as indium (In) and gallium (Ga) contained in ZnO. However, the disclosure is not limited thereto, and the semiconductor layer ACT may also include amorphous silicon or polysilicon.

In an embodiment, the semiconductor layer ACT may be disposed to overlap each light blocking pattern BML. Thus, the generation of photocurrent in the semiconductor layer ACT may be suppressed.

A first conductive layer may be located on the semiconductor layer ACT in the display substrate 10 and may include a gate electrode GE, a first gate metal WR1, and a second gate metal WR2. The gate electrode GE may be located in the display area DA and may overlap the semiconductor layer ACT. In an embodiment, as illustrated in FIG. 12, the first gate metal WR1 may include a part of a wiring that electrically connects a connection pad PD (see FIG. 2) to elements located in the display area DA (see FIG. 2), for example, a thin-film transistor TL and a light emitting element.

In an embodiment, as illustrated in FIG. 13, the second gate metal WR2 may be located in the non-display area NDA. In an embodiment, the second gate metal WR2 may include a part of a conductor constituting a gate driving circuit. In such an embodiment, the second gate metal WR2 may include at least a part of a guard ring that prevents inflow of static electricity from the outside.

The gate electrode GE, the first gate metal WR1, and the second gate metal WR2 may include at least one selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in consideration of adhesion to an adjacent layer, surface flatness of a layer to be stacked, and process-ability. Each of the gate electrode GE, the first gate metal WR1, and the second gate metal WR2 may be formed as a single layer or a multilayer.

A gate insulating layer 115 may be located between the semiconductor layer ACT and the first conductive layer or between the semiconductor layer ACT and the gate electrode GE in the display area DA. In an embodiment, the gate electrode GE and the gate insulating layer 115 may function as a mask that masks a channel region of the semiconductor layer ACT, and a width of each of the gate electrode GE and the gate insulating layer 115 may be smaller than the width of the semiconductor layer ACT.

In an embodiment, the gate insulating layer 115 may not be disposed over the entire surface of the first base 110 but may be partially patterned. In an embodiment, the width of the patterned gate insulating layer 115 may be greater than the width of the gate electrode GE or the first conductive layer.

In an embodiment, the gate insulating layer 115 may include an inorganic material. In one embodiment, for example, the gate insulating layer 115 may include at least one inorganic material listed above in the description of the first insulating layer 113.

The gate insulating layer 115 may be located between the first gate metal WR1 and the first insulating layer 113 and between the second gate metal WR2 and the first insulating layer 113 in the non-display area NDA.

A second insulating layer 117 may be located on the gate insulating layer 115 in the display substrate 10 to cover the semiconductor layer ACT and the gate electrode GE. The second insulating layer 117 may be located in the display area DA and the non-display area NDA. In an embodiment, the second insulating layer 117 may function as a planarization layer that provides a flat surface.

In an embodiment, the second insulating layer 117 may include an organic material. In one embodiment, for example, the second insulating layer 117 may include, but is not limited to, at least one selected from photo acryl ("PAC"), polystylene, polymethyl methacrylate ("PMMA"), polyacrylonitrile ("PAN"), polyamide, polyimide, polyarylether, heterocyclic polymer, parylene, fluorine-based polymer, epoxy resin, benzocyclobutene series resin, siloxane series resin, and silane resin.

The second conductive layer may be located on the second insulating layer 117 in the display substrate 10. The second conductive layer may include the source electrode SE, the drain electrode DE, a power supply wiring VSL, and a first pad electrode PD1 of the connection pad PD.

The source electrode SE and the drain electrode DE may be located in the display area DA and spaced apart from each other.

Each of the drain electrode DE and the source electrode SE may penetrate or be disposed through the second insulating layer 117 and may be connected to the active layer ACT.

In an embodiment, the source electrode SE may penetrate the first insulating layer 113 and the second insulating layer 117 and may be connected to the light blocking pattern BML. In an embodiment where the light blocking pattern BML is a part of a wiring that transmits a signal or a voltage, the source electrode SE may be connected and electrically coupled to the light blocking pattern BML to receive a voltage or the like provided to the wiring. In an alternative embodiment, where the light blocking pattern BML is a floating pattern rather than a separate pattern, a voltage or the like provided to the source electrode SE may be transferred to the light blocking pattern BML.

Alternatively, the drain electrode DE may penetrate or be disposed through the first insulating layer 113 and the second insulating layer 117 and may be connected to the light blocking pattern BML. In an embodiment where the light blocking pattern BML is not a wiring to which a separate signal is provided, a voltage or the like applied to the drain electrode DE may be transferred to the light blocking pattern BML.

The semiconductor layer ACT, the gate electrode GE, the source electrode SE, and the drain electrode DE described above may constitute a thin-film transistor TL. In an embodiment, the thin-film transistor TL may be located in each of the first light emitting region LA1, the light emitting region LA2, and the third light emitting region LA3. In an embodiment, a part of the thin-film transistor TL may be located in the non-light emitting region NLA.

The power supply wiring VSL may be located in the non-display area NDA. A driving voltage provided to a cathode CE, for example, an ELVSS voltage, may be provided to the power supply wiring VSL.

The first pad electrode PD1 of the connection pad PD may be located in the pad area PDA (see FIG. 2) of the non-display area NDA. In an embodiment, the first pad electrode PD1 may penetrate the second insulating layer 117 and may be electrically connected to a first wiring layer WR.

Each of the source electrode SE, the drain electrode DE, the power supply wiring VSL, and the first pad electrode PD1 of the connection pad PD may include aluminum (Al), copper (Cu) or titanium (Ti) and may be formed as a multilayer or a single layer. In an embodiment, each of the source electrode SE, the drain electrode DE, the power supply wiring VSL, and the first pad electrode PD1 of the connection pad PD may have a multilayer structure of Ti/Al/Ti.

A third insulating layer 130 may be located on the second insulating layer 117 in the display substrate 10. The third insulating layer 130 may cover the thin-film transistors TL in the display area DA and expose a part of the power supply wiring VSL in the non-display area NDA.

In an embodiment, the third insulating layer 130 may be a planarization layer. In an embodiment, the third insulating layer 130 may include or be made of an organic material. In one embodiment, for example, the third insulating layer 130 may include acrylic resin, epoxy resin, imide resin, or ester resin. In an embodiment, the third insulating layer 130 may include a photosensitive organic material.

In an embodiment, a first anode AE1, a second anode AE2 and a third anode AE3 may be located on the third insulating layer 130 in the display area DA. In such an embodiment, in the non-display area NDA, a connection electrode CNE and a second pad electrode PD2 of the connection pad PD may be located on the third insulating layer 130.

The first anode AE1 may overlap the first light emitting region LA1, and at least a part of the first anode AE1 may extend to the non-light emitting region NLA. The second anode AE2 may overlap the second light emitting region LA2, and at least a part of the second anode AE2 may extend to the non-light emitting region NLA. The third anode AE3 may overlap the third light emitting region LA3, and at least a part of the third anode AE3 may extend to the non-light emitting region NLA. The first anode AE1 may penetrate or be disposed through the third insulating layer 130 and may be connected to the drain electrode DE of a thin-film transistor TL corresponding to the first anode AE1. The second anode AE2 may penetrate or be disposed through the third insulating layer 130 and may be connected to the drain electrode DE of a thin-film transistor TL corresponding to the second anode AE2. The third anode AE3 may penetrate or be disposed through the third insulating layer 130 and may be connected to the drain electrode DE of a thin-film transistor TL corresponding to the third anode AE3.

In an embodiment, the first anode AE1, the second anode AE2, and the third anode AE3 may be reflective electrodes. In such an embodiment, each of the first anode AE1, the second anode AE2, and the third anode AE3 may be a metal layer including a metal such as Ag, Mg, Al, Pt, Pd, Au, Ni, Nd, Ir or Cr. In an embodiment, each of the first anode AE1, the second anode AE2, and the third anode AE3 may further include a metal oxide layer stacked on the metal layer. In an embodiment, each of the first anode AE1, the second anode AE2, and the third anode AE3 may have a two-layer structure of ITO/Ag, Ag/ITO, ITO/Mg or ITO/MgF or a three-layer structure of ITO/Ag/ITO.

The connection electrode CNE may be electrically connected to the power supply wiring VSL in the non-display area NDA and may directly contact the power supply wiring VSL.

The second pad electrode PD2 may be located on the first pad electrode PD1 in the non-display area NDA. The second pad electrode PD2 may directly contact the first pad electrode PD1 and may be electrically connected to the first pad electrode PD1.

In an embodiment, the connection electrode CNE and the second pad electrode PD2 may include or be made of the same material as the first anode AE1, the second anode AE2 and the third anode AE3 and may be formed in the process of manufacturing the first anode AE1, the second anode AE2 and the third anode AE3.

A pixel defining layer 150 may be located on the first anode AE1, the second anode AE2, and the third anode AE3 in the display substrate 10. In such an embodiment, an opening exposing the first anode AE1, an opening exposing the second anode AE2 and an opening exposing the third anode AE3 may be defined through the pixel defining layer 150, and may define the first light emitting region LA1, the second light emitting region LA2, the third light emitting region LA3 and the non-light emitting region NLA. In an embodiment, a region of the first anode AE1 which is not covered by the pixel defining layer 150 may be the first light emitting region LA1. In such an embodiment, a region of the second anode AE2 which is not covered by the pixel defining layer 150 may be the second light emitting region LA2, and a region of the third anode AE3 which is not covered by the pixel defining layer 150 may be the third light emitting region LA3. In such an embodiment, a region where the pixel defining layer 150 is located may be the non-light emitting region NLA.

In an embodiment, the pixel defining layer 150 may include an organic insulating material such as polyacrylates resin, epoxy resin, phenolic resin, polyamides resin, polyimides resin, unsaturated polyesters resin, polyphenyle-nethers resin, polyphenylenesulfides resin or benzocy-clobutene ("BCB").

In an embodiment, the pixel defining layer 150 may overlap a color pattern 250 and a light blocking pattern 260 to be described later.

In an embodiment, the pixel defining layer 150 may overlap a bank pattern 370 to be described later.

In an embodiment, as illustrated in FIGS. 9 and 12, a light emitting layer OL may be located on the first anode AE1, the second anode AE2, and the third anode AE3 in the display substrate 10.

In an embodiment, the light emitting layer OL may be in the shape of a continuous layer formed over the light emitting regions LA1 through LA3 and the non-light emitting region NLA. In an embodiment, the light emitting layer OL is located only in the display area DA as shown in the drawings, but the disclosure is not limited thereto. In an alternative embodiment, a part of the light emitting layer OL may be further located in the non-display area NDA. The light emitting layer OL will be described in greater detail later.

The cathode CE may be located on the light emitting layer OL in the display substrate 10. A part of the cathode CE may be further located in the non-display area NDA as illustrated in FIG. 12. The cathode CE may be electrically connected to the connection electrode CNE and may contact the connection electrode CNE in the non-display area NDA. A driving voltage (e.g., the ELVSS voltage) provided to the power supply wiring VSL may be transferred to the cathode CE via the connection electrode CNE.

In an embodiment, the cathode CE may have translucency or transparency. In an embodiment where the cathode CE has translucency, the cathode CE may include Ag, Mg, Cu, Al, Pt, Pd, Au, Ni, Nd, Ir, Cr, Li, Ca, LiF/Ca, LiF/Al, Mo, Ti, or a compound or mixture thereof (e.g., a mixture of Ag and Mg). In such an embodiment, a thickness of the cathode CE is tens to hundreds of angstroms, such that the cathode CE may have translucency.

In an embodiment, where the cathode CE has transparency, the cathode CE may include a transparent conductive oxide ("TCO"). In one embodiment, for example, the cathode CE may include tungsten oxide (WxOx), titanium oxide ($TiO_2$), ITO, indium zinc oxide ("IZO"), zinc oxide (ZnO), indium tin zinc oxide ("ITZO"), or magnesium oxide (MgO).

In an embodiment, the cathode CE may completely cover the light emitting layer OL. In an embodiment, as illustrated in FIG. 12, an end of the cathode CE may be located relatively outward than an end of the light emitting layer OL, and the end of the light emitting layer OL may be completely covered by the cathode CE.

The first anode AE1, the light emitting layer OL and the cathode CE may constitute a first light emitting element ED1, the second anode AE2, the light emitting layer OL and the cathode CE may constitute a second light emitting element ED2, and the third anode AE3, the light emitting layer OL and the cathode CE may constitute a third light emitting element ED3. Each of the first light emitting element ED1, the second light emitting element ED2, and the third light emitting element ED3 may emit output light LE In an embodiment, as illustrated in FIG. 10, the output light LE finally emitted from the light emitting layer OL may be a mixture of a first component LE1 and a second component LE2. Each of the first component LE1 and the second component LE2 in the output light LE may have a peak wavelength of about 440 nm to about 480 nm. In such an embodiment, the output light LE may be blue light.

As illustrated in FIG. 10, in an embodiment, the light emitting layer OL may have a structure in which a plurality of light emitting layers overlap or are stacked one on another, for example, may have a tandem structure. In one embodiment, for example, the light emitting layer OL may include a first stack ST1 including a first light emitting layer EML1, a second stack ST2 located on the first stack ST1 and including a second light emitting layer EML2, a third stack ST3 located on the second stack ST2 and including a third light emitting layer EML3, a first charge generation layer CGL1 located between the first stack ST1 and the second stack ST2, and a second charge generation layer CGL2 located between the second stack ST2 and the third stack ST3. The first stack ST1, the second stack ST2, and the third stack ST3 may overlap each other.

The first light emitting layer EML1, the second light emitting layer EML2, and the third light emitting layer EML3 may overlap each other.

In an embodiment, the first light emitting layer EML1, the second light emitting layer EML2 and the third light emitting layer EML3 may all emit light of the third color, for example, blue light. In one embodiment, for example, each of the first light emitting layer EML1, the second light emitting layer EML2 and the third light emitting layer EML3 may be a blue light emitting layer and may include an organic material.

In an embodiment, at least one selected from the first light emitting layer EML1, the second light emitting layer EML2 and the third light emitting layer EML3 may emit first blue light having a first peak wavelength, and at least another one selected from the first light emitting layer EML1, the second light emitting layer EML2 and the third light emitting layer EML3 may emit second blue light having a second peak wavelength different from the first peak wavelength. In one embodiment, for example, one of the first light emitting layer EML1, the second light emitting layer EML2 and the third light emitting layer EML3 may emit the first blue light having the first peak wavelength, and the other two of the first light emitting layer EML1, the second light emitting layer EML2 and the third light emitting layer EML3 may emit the second blue light having the second peak wavelength. In such an embodiment, the output light LE finally emitted from the light emitting layer OL may be a mixture of the first component LE1 and the second component LE2, the first component LE1 may be the first blue light having the first peak wavelength, and the second component LE2 may be the second blue light having the second peak wavelength.

In an embodiment, one of the first peak wavelength and the second peak wavelength may be in a range of about 440 nm to about 460 nm. The other one of the first peak wavelength and the second peak wavelength may be in a range of about 460 nm to about 480 nm. However, the range of the first peak wavelength and the range of the second peak wavelength are not limited thereto. In one embodiment, for example, the range of the first peak wavelength and the range of the second peak wavelength may all include about 460 nm. In an embodiment, one of the first blue light and the second blue light may be light of a deep blue color, and the other one of the first blue light and the second blue light may be light of a sky blue color.

According to an embodiment, the output light LE emitted from the light emitting layer OL is blue light and may include a long wavelength component and a short wavelength component. Therefore, the light emitting layer OL may finally emit blue light having a broader or wide emission peak as the output light LE, thereby improving color visibility at a side viewing angle compared with a conventional light emitting element that emits blue light having a sharp or narrow emission peak.

In an embodiment, each of the first light emitting layer EML1, the second light emitting layer EML2 and the third light emitting layer EML3 may include a host and a dopant. The host is not particularly limited as long as it is a commonly used material. In one embodiment, for example, the host may include tris(8-hydroxyquinolino)aluminum ("Alq3"), 4,4'-bis(N-carbazolyl)-1,1'-biphenyl ("CBP"), poly(n-vinylcabazole) ("PVK"), 9,10-di(naphthalene-2-yl) anthracene ("ADN"), 4,4',4''-tris(carbazol-9-yl)-triph-enylamine ("TCTA"), 1,3,5-tris(N-phenylbenzimidazole-2-yl)benzene ("TPBi"), 3-tert-butyl-9,10-di(naphth-2-yl) anthracene ("TBADN"), distyrylarylene ("DSA"), 4,4'-bis (9-carbazolyl)-2,2''-dimethyl-biphenyl ("CDBP"), or 2-methyl-9,10-bis(naphthalen-2-yl)anthracene) ("MADN").

Each of the first light emitting layer EML1, the second light emitting layer EML2 and the third light emitting layer EML3 which emit blue light may include a fluorescent material containing any one of spiro-DPVBi, spiro-6P, distyryl-benzene ("DSB"), distyryl-arylene (DSA), a polyfluorene ("PFO")-based polymer, and a poly (p-phe-nylene vinylene) ("PPV")-based polymer. Alternatively, each of the first light emitting layer EML1, the second light emitting layer EML2 and the third light emitting layer EML3 may include a phosphorescent material containing an organometallic complex such as (4,6-F2ppy)2Irpic.

As described above, at least one selected from the first light emitting layer EML1, the second light emitting layer EML2 and the third light emitting layer EML3 and at least another one selected from the first light emitting layer EML1, the second light emitting layer EML2 and the third light emitting layer EML3 emit light in different wavelength ranges from each other. In such an embodiment, the first light emitting layer EML1, the second light emitting layer EML2 and the third light emitting layer EML3 may include a same material as each other, and a method of adjusting a resonance distance may be used to emit blue light in different wavelength ranges. Alternatively, at least one selected from the first light emitting layer EML1, the second light emitting layer EML2 and the third light emitting layer EML3 and at least another one selected from the first light emitting layer EML1, the second light emitting layer EML2 and the third light emitting layer EML3 may include differ-ent materials from each other to emit blue light in different wavelength ranges.

However, the disclosure is not limited thereto. The first light emitting layer EML1, the second light emitting layer EML2, and the third light emitting layer EML3 may all emit blue light having a peak wavelength of about 440 nm to about 480 nm, and may include or be made of a same material as each other.

Alternatively, one of the first light emitting layer EML1, the second light emitting layer EML2 and the third light emitting layer EML3 may emit the first blue light having the first peak wavelength, another one of the first light emitting layer EML1, the second light emitting layer EML2 and the third light emitting layer EML3 may emit the second blue light having the second peak wavelength different from the first peak wavelength, and the other one of the first light emitting layer EML1, the second light emitting layer EML2 and the third light emitting layer EML3 may emit third blue light having a third peak wavelength different from the first peak wavelength and the second peak wavelength. In an embodiment, one of the first peak wavelength, the second peak wavelength, and the third peak wavelength may be in a range of about 440 nm to about 460 nm. In such an embodiment, another one of the first peak wavelength, the second peak wavelength, and the third peak wavelength may be in a range of about 460 nm to about 470 nm, and the other one of the first peak wavelength, the second peak wave-length, and the third peak wavelength may be in a range of about 470 nm to about 480 nm.

According to an embodiment, the output light LE emitted from the light emitting layer OL is blue light and includes a long wavelength component, a medium wavelength compo-nent, and a short wavelength component. Therefore, the light emitting layer OL may finally emit blue light having a broader emission peak as the output light LE and improve color visibility at a side viewing angle.

According to embodiments described above, light effi-ciency can be increased, and the life of the display device can be extended as compared with a conventional light emitting element that does not employ a tandem structure, that is, a structure in which a plurality of light emitting layers are stacked.

Alternatively, at least any one selected from the first light emitting layer EML1, the second light emitting layer EML2 and the third light emitting layer EML3 may emit light of the third color, for example, blue light, and at least another one selected from the first light emitting layer EML1, the second light emitting layer EML2 and the third light emitting layer EML3 may emit light of the second color, for example, green light. In an embodiment, blue light emitted from at least any one selected from the first light emitting layer EML1, the second light emitting layer EML2 and the third light emitting layer EML3 may have a peak wavelength in a range of about 440 nm to about 480 nm or in a range of about 460 nm to about 480 nm. Green light emitted from at least another one selected from the first light emitting layer EML1, the second light emitting layer EML2 and the third light emitting layer EML3 may have a peak wavelength in a range of about 510 nm to about 550 nm.

In one embodiment, for example, one of the first light emitting layer EML1, the second light emitting layer EML2 and the third light emitting layer EML3 may be a green light emitting layer that emits green light, and the other two of the first light emitting layer EML1, the second light emitting layer EML2 and the third light emitting layer EML3 may be blue light emitting layers that emit blue light. In such an embodiment where the other two of the first light emitting layer EML1, the second light emitting layer EML2 and the third light emitting layer EML3 are blue light emitting layers, blue light emitted from the two blue light emitting layers may have a same peak wavelength range as each other or different peak wavelength ranges from each other.

According to an embodiment, the output light LE emitted from the light emitting layer OL may be a mixture of the first component LE1 which is blue light and the second component LE2 which is green light. In one embodiment, for example, when the first component LE1 is deep blue light and the second component LE2 is green light, the output light LE may be light having a sky blue color. Similarly to the above-described embodiments, the output light LE emitted from the light emitting layer OL is a mixture of blue light and green light and includes a long wavelength component and a short wavelength component. Therefore, the light emitting layer OL may finally emit blue light having a broader emission peak as the output light LE and improve color visibility at a side viewing angle. In addition, since the second component LE2 of the output light LE is green light, a green light component of light provided from the display device 1 to the outside can be supplemented. Accordingly, the color reproducibility of the display device 1 can be improved.

In an embodiment, a green light emitting layer among the first light emitting layer EML1, the second light emitting layer EML2, and the third light emitting layer EML3 may include a host and a dopant. The host included in the green light emitting layer is not particularly limited as long as it is a commonly used material. In one embodiment, for example, the host may include Alq3, CBP, PVK, ADN, TCTA, TPBi, TBADN, DSA, CDBP, or 2MADN.

The dopant included in the green light emitting layer may be, for example, a fluorescent material including Alq3 or a phosphorescent material such as fac tris(2-phenylpyridine) iridium ("Ir(ppy)3"), bis(2-phenylpyridine)(acetylacetonate)iridium(III) (Ir(ppy)2("acac")), or 2-phenyl-4-methyl-pyridine iridium ("Ir(mpyp)3").

The first charge generation layer CGL1 may be located between the first stack ST1 and the second stack ST2. The first charge generation layer CGL1 may inject electric charges into each light emitting layer. The first charge generation layer CGL1 may control the charge balance between the first stack ST1 and the second stack ST2. The first charge generation layer CGL1 may include an n-type charge generation layer CGL11 and a p-type charge generation layer CGL12. The p-type charge generation layer CGL12 may be disposed on the n-type charge generation layer CGL11 and may be located between the n-type charge generation layer CGL11 and the second stack ST2.

The first charge generation layer CGL1 may have a structure in which the n-type charge generation layer CGL11 and the p-type charge generation layer CGL12 are in contact with each other. The n-type charge generation layer CGL11 is disposed closer to the anode AE1 (AE2 of FIG. 7, AE3 of FIG. 7) among the anode AE1 (AE2 of FIG. 7, AE3 of FIG. 7) and the cathode CE. The p-type charge generation layer CGL12 is disposed closer to the cathode CE among the anode AE1 (AE2 of FIG. 7, AE3 of FIG. 7) and the cathode CE. The n-type charge generation layer CGL11 supplies electrons to the first light emitting layer EML1 adjacent to the anode AE1 (AE2 of FIG. 7, AE3 of FIG. 7), and the p-type charge generation layer CGL12 supplies holes to the second light emitting layer EML2 included in the second stack ST2. In such an embodiment, the first charge generation layer CGL1 is disposed between the first stack ST1 and the second stack ST2 to provide electric charges to each light emitting layer, such that luminous efficiency may be improved, and a driving voltage may be lowered.

The first stack ST1 may be located on the first anode AE1, the second anode AE2 (see FIG. 7) and the third anode AE3 (see FIG. 7) and may further include a first hole transport layer HTL1, a first electron blocking layer BIL1 and a first electron transport layer ETL1.

The first hole transport layer HTL1 may be located on the first anode AE1, the second anode AE2 (see FIG. 7), and the third anode AE3 (see FIG. 7). The first hole transport layer HTL1 may facilitate the transportation of holes and may include a hole transport material. The hole transport material may include, but is not limited to, a carbazole derivative such as N-phenylcarbazole or polyvinylcarbazole; a fluorene derivative; a triphenylamine derivative such as N,N'-bis(3-methylphenyl)-N,N'-diphenyl-[1,1-biphenyl]-4, 4'-diamine ("TPD") or 4,4',4"-tris(N-carbazolyl)triphenylamine ("TCTA");
N,N'-di(1-naphthyl)-N,N'-diphenylbenzidine) ("NPB"); or 4,4'-Cyclohexylidene bis[N,N-bis(4-methylphenyl)benzenamine] ("TAPC").

The first electron blocking layer BIL1 may be located on the first hole transport layer HTL1 and may be located between the first hole transport layer HTL1 and the first light emitting layer EML1. The first electron blocking layer BIL1 may include a hole transport material and a metal or a metal compound to prevent electrons generated by the first light emitting layer EML1 from entering the first hole transport layer HTL1. In an embodiment, the first hole transport layer HTL1 and the first electron blocking layer BIL1 may be formed as a single layer in which respective materials thereof are mixed.

The first electron transport layer ETL1 may be located on the first light emitting layer EML1 and may be located between the first charge generation layer CGL1 and the first light emitting layer EML1. In an embodiment, the first electron transport layer ETL1 may include an electron transport material such as Alq3, TPBi, 2,9-dimethyl-4,7-diphenyl-1,10-phenanthroline ("BCP"), 4,7-diphenyl-1,10-phenanthroline ("Bphen"), 3-(4-biphenyl)-4-phenyl-5-tert-butylphenyl-1,2,4-triazole ("TAZ"), 4-(naphthalen-1-yl)-3, 5-diphenyl-4H-1,2,4-triazole ("NTAZ"), 2-(4-biphenylyl)-5-(4-tert-butylphenyl)-1,3,4-oxadiazole ("tBu-PBD"), bis (2-methyl-8-quinolinolato-N1,O8)-(1,1'-biphenyl-4-olato) aluminum ("BAlq"), berylliumbis(benzoquinolin-10-olate) ("Bebq2"), ADN, or a mixture thereof. However, the disclosure is not limited to the type of the electron transport material. The second stack ST2 may be located on the first charge generation layer CGL1 and may further include a second hole transport layer HTL2, a second electron blocking layer BIL2 and a second electron transport layer ETL2.

The second hole transport layer HTL2 may be located on the first charge generation layer CGL1. The second hole transport layer HTL2 may include or be made of a same material as the first hole transport layer HTL1 or may include at least one material selected from the materials listed above for the first hole transport layer HTL1. The second hole transport layer HTL2 may be a single layer or defined by a plurality of layers.

The second electron blocking layer BIL2 may be located on the second hole transport layer HTL2 and may be located between the second hole transport layer HTL2 and the second light emitting layer EML2. The second electron blocking layer BIL2 may have the same material and structure as the first electron blocking layer BIL1 or may include at least one material selected from the materials listed above for the first electron blocking layer BIL1.

The second electron transport layer ETL2 may be located on the second light emitting layer EML2 and may be located between the second charge generation layer CGL2 and the second light emitting layer EML2. The second electron transport layer ETL2 may have the same material and structure as the first electron transport layer ETL1 or may include at least one material selected from the materials listed above for the first electron transport layer ETL1. The second electron transport layer ETL2 may be a single layer or defined by a plurality of layers.

The second charge generation layer CGL2 may be located on the second stack ST2 and may be located between the second stack ST2 and the third stack ST3.

The second charge generation layer CGL2 may have the same structure as the first charge generation layer CGL1 described above. In one embodiment, for example, the second charge generation layer CGL2 may include an n-type charge generation layer CGL21 disposed closer to the second stack ST2 and a p-type charge generation layer CGL22 disposed closer to the cathode CE. The p-type charge generation layer CGL2 may be disposed on the n-type charge generation layer CGL21.

The second charge generation layer CGL2 may have a structure in which the n-type charge generation layer CGL21 and the p-type charge generation layer CGL22 are in contact with each other. The first charge generation layer CGL1 and the second charge generation layer CGL2 may include or be made of different materials or the same material.

The third stack ST3 may be located on the second charge generation layer CGL2 and may further include a third hole transport layer HTL3 and a third electron transport layer ETL3.

The third hole transport layer HTL3 may be located on the second charge generation layer CGL2. The third hole transport layer HTL3 may include or be made of the same material as the first hole transport layer HTL1 or may include at least one material selected from the materials listed above for the first hole transport layer HTL1. The third hole transport layer HTL3 may be a single layer or defined by a plurality of layers. In an embodiment where the third hole transport layer HTL3 is defined by a plurality of layers, the layers may include different materials from each other.

The third electron transport layer ETL3 may be located on the third light emitting layer EML3 and may be located between the cathode CE and the third light emitting layer EML3. The third electron transport layer ETL3 may have the same material and structure as the first electron transport layer ETL1 or may include at least one material selected from the materials listed above for the first electron transport layer ETL1. The third electron transport layer ETL3 may be a single layer or defined by a plurality of layers. In an embodiment where the third electron transport layer ETL3 is defined a plurality of layers, the layers may include different materials from each other.

Although not illustrated in the drawing, a hole injection layer may be further located between the first stack ST1 and the first anode AE1, between the second anode AE2 (see FIG. 7) and the third anode AE3 (see FIG. 7), between the second stack ST2 and the first charge generation layer CGL1, or between the third stack ST3 and the second charge generation layer CGL2. The hole injection layer may facilitate the injection of holes into the first light emitting layer EML1, the second light emitting layer EML2 and the third light emitting layer EML3. In an embodiment, the hole injection layer may include or be made of, but not limited to, any at least one selected from copper phthalocyanine ("CuPc"), poly(3,4-ethylenedioxythiphene) ("PEDOT"), polyaniline ("PANI"), and N,N-dinaphthyl-N,N'-diphenyl benzidine ("NPD"). In an embodiment, the hole injection layer may be located between the firs stack ST1 and the first anode AE1, between the second anode AE2 (see FIG. 7) and the third anode AE3 (see FIG. 7), between the second stack ST2 and the first charge generation layer CGL1, and between the third stack ST3 and the second charge generation layer CGL2.

Although not illustrated in the drawings, an electron injection layer may be further located between the third electron transport layer ETL3 and the cathode CE, between the second charge generation layer CGL2 and the second stack ST2, or between the first charge generation layer CGL1 and the first stack ST1. The electron injection layer may facilitate the injection of electrons and may include Alq3, PBD, TAZ, spiro-PBD, BAlq, or SAlq, but the disclosure is not limited thereto. In an embodiment, the electron injection layer may be a metal halide compound and may be, for example, at least one selected from $MgF_2$, LiF, NaF, KF, RbF, CsF, FrF, LiI, NaI, KI, RbI, CsI, FrI, and CaF2, but the disclosure is not limited thereto. Alternatively, the electron injection layer may include a lanthanum material such as Yb, Sm, or Eu. Alternatively, the electron injection layer may include both a metal halide material and a lanthanum material such as RbI:Yb or KI:Yb. In an embodiment where the electron injection layer includes both a metal halide material and a lanthanum material, the electron injection layer may be formed by co-deposition of the metal halide material and the lanthanum material. In an embodiment, the electron injection layer may be located between the third electron transport layer ETL3 and the cathode CE, between the second charge generation layer CGL2 and the second stack ST2 and between the first charge generation layer CGL1 and the first stack ST1.

The structure of the light emitting layer OL may also be modified from the above structure. In one alternative embodiment, for example, the light emitting layer OL may be modified as illustrated in FIG. 11. In such an embodiment, as illustrated in FIG. 11, the light emitting layer OLa may further include a fourth stack ST4 located between the third stack ST3 and the second stack ST2 and may further include a third charge generation layer CGL3 located between the third stack ST3 and the second stack ST2.

The fourth stack ST4 may include a fourth light emitting layer EML4 and may further include a fourth hole transport layer HTL4, a third electron blocking layer BIL4 and a fourth electron transport layer ETL4.

Each of the first light emitting layer EML1, the second light emitting layer EML2, the third light emitting layer EML3 and the fourth light emitting layer EML4 included in the light emitting layer OLa may emit light of the third color, for example, blue light. At least one selected from the first light emitting layer EML1, the second light emitting layer EML2, the third light emitting layer EML3 and the fourth light emitting layer EML4 and at least another one selected from the first light emitting layer EML1, the second light emitting layer EML2, the third light emitting layer EML3 and the fourth light emitting layer EML4 may emit blue light having different peak wavelength ranges from each other.

Alternatively, at least any one selected from the first light emitting layer EML1, the second light emitting layer EML2, the third light emitting layer EML3 and the fourth light emitting layer EML4 may emit green light, and at least another one selected from the first light emitting layer EML1, the second light emitting layer EML2, the third light emitting layer EML3 and the fourth light emitting layer EML4 may emit blue light. In one embodiment, for example, one of the first light emitting layer EML1, the second light emitting layer EML2, the third light emitting layer EML3 and the fourth light emitting layer EML4 may be a green light emitting layer, and the other three of the first light emitting layer EML1, the second light emitting layer EML2, the third light emitting layer EML3 and the fourth light emitting layer EML4 may all be blue light emitting layers.

The fourth hole transport layer HTL4 may be located on the second charge generation layer CGL2. The fourth hole transport layer HTL4 may include or be made of the same material as the first hole transport layer HTL1 or may include at least one material selected from the materials listed above for the first hole transport layer HTL1. The fourth hole transport layer HTL4 may be a single layer or defined by a plurality of layers. In an embodiment where the fourth hole transport layer HTL4 is defined by a plurality of layers, the layers may include different materials from each other.

The third electron blocking layer BIL3 may be located on the fourth hole transport layer HTL4 and may be located between the fourth hole transport layer HTL4 and the fourth light emitting layer EML4. The third electron blocking layer BIL3 may have the same material and structure as the first electron blocking layer BIL1 or may include at least one material selected from the materials listed above for the first electron blocking layer BIL1. In an alternative embodiment, the third electron blocking layer BIL3 may be omitted.

The fourth electron transport layer ETL4 may be located on the fourth light emitting layer EML4 and may be located between the third charge generation layer CGL3 and the fourth light emitting layer EML4. The fourth electron transport layer ETL4 may have the same material and structure as the first electron transport layer ETL1 or may include at least one material selected from the materials listed above for the first electron transport layer ETL1. The fourth electron transport layer ETL4 may be a single layer or defined by a plurality of layers. In an embodiment where the fourth electron transport layer ETL4 is composed of a plurality of layers, the layers may include different materials from each other.

The third charge generation layer CGL3 may have the same structure as the first charge generation layer CGL1 described above. In one embodiment, for example, the third charge generation layer CGL3 may include an n-type charge generation layer CGL31 disposed closer to the second stack ST2 and a p-type charge generation layer CGL32 disposed closer to the cathode CE. The p-type charge generation layer CGL32 may be disposed on the n-type charge generation layer CGL31.

Although not illustrated in the drawing, the electron injection layer may be further located between the fourth stack ST4 and the third charge generation layer CGL3. In such an embodiment, the hole injection layer may be further located between the fourth stack ST4 and the second charge generation layer CGL2.

In an embodiment, as shown in FIGS. 10 and 11, the light emitting layer OL or OLa may not include a red light emitting layer and thus may not emit light of the first color, for example, red light. In such an embodiment, the output light LE may not include a light component whose peak wavelength is in a range of about 610 nm to about 650 nm and may include only a light component whose peak wavelength is in a range of about 440 nm to about 550 nm.

In an embodiment, as illustrated in FIGS. 12 and 13, the dam member DM and the first support member OS1 may be located on the second insulating layer 117 in the non-display area NDA.

The dam member DM may be located relatively outward than the power supply wiring VSL. In such an embodiment, as illustrated in FIG. 12, the power supply wiring VSL may be located between the dam member DM and the display area DA.

In an embodiment, a part of the dam member DM may overlap the power supply wiring VSL.

In an embodiment, the dam member DM may include a plurality of dams. In one embodiment, for example, the dam member DM may include a first dam D1 and a second dam D2.

The first dam D1 may partially overlap the power supply wiring VSL and may be spaced apart from the third insulating layer 130 with the power supply wiring VSL interposed between them. In an embodiment, the first dam D1 may include a first lower dam pattern D11 located on the second insulating layer 117 and a first upper dam pattern D12 located on the first lower dam pattern D11.

The second dam D2 may be located outside of the first dam D1 and spaced apart from the first dam D1. In an embodiment, the second dam D2 may include a second lower dam pattern D21 located on the second insulating layer 117 and a second upper dam pattern D22 located on the second lower dam pattern D21.

In an embodiment, the first lower dam pattern D11 and the second lower dam pattern D21 may include or be made of the same material as the third insulating layer 130 and may be formed simultaneously with the third insulating layer 130 during a same process.

In an embodiment, the first upper dam pattern D12 and the second upper dam pattern D2 may include or be made of the same material as the pixel defining layer 150 and may be formed simultaneously with the pixel defining layer 150 during a same process.

In an embodiment, the first dam D1 and the second dam D2 may have different heights from each other. In one embodiment, for example, the height of the second dam D2 may be greater than the height of the first dam D1. In such an embodiment, as the distance from the display area DA increases, the heights of dams included in the dam member DM may gradually increase. Accordingly, an organic material may be more effectively blocked from overflowing in the process of forming an organic layer 173 included in an encapsulation layer 170 to be described later.

The first support member OS1 may be located relatively outward than the dam member DM. In such an embodiment, as illustrated in FIGS. 12 and 13, the dam member DM may be located between the first portion OS1a of the first support member OS1 and the display area DA and between the second portion OS1b of the first support member OS1 and the display area DA. The first support member OS1 may support masks used in the process of manufacturing the light emitting layer OL, the cathode CE, a first capping layer 160 and the encapsulation layer 170 as described above, that is, may function as a mask support.

In an embodiment, as shown in FIG. 12, the first portion OS1a of the first support member OS1 may overlap the first gate metal WR1 including a wiring connected to the connection pad PD.

In an embodiment, the first portion OS1a of the first support member OS1 may include a first lower support pattern OS11a located on the second insulating layer 117 and a first upper support pattern OS12a located on the first lower support pattern OS11a.

In an embodiment, the second portion OS1b of the first support member OS1 may include a second lower support pattern OS11b located on the second insulating layer 117 and a second upper support pattern OS12b located on the second lower support pattern OS11b.

In an embodiment, the first lower support pattern OS11a and the second lower support pattern OS11b may include or be made of the same material as the third insulating layer 130 and may be formed simultaneously with the third insulating layer 130 during a same process.

In an embodiment, the first upper support pattern OS12a and the second upper support pattern OS12b may include or be made of the same material as the pixel defining layer 150 and may be formed simultaneously with the pixel defining layer 150 during a same process.

As described above, in an embodiment, the second portion OS1b of the first support member OS1 may be substantially aligned with the edges of the display device 1 or the edges of the first base 110.

In an embodiment, the second portion OS1b of the first support member OS1 may overlap the second gate metal WR2 including a part of the gate driving circuit.

In an embodiment, two side surfaces of the second portion OS1b of the first support member OS1 may have different inclination angles from each other.

In one embodiment, for example, as illustrated in FIG. 14, a surface aligned with the edges of the display device 1 among both side surfaces of the second portion OS1b may be referred to as a first side surface OSE1, and a side surface facing the first side surface OSE1 may be referred to as a second side surface OSE2. In such an embodiment, an inclination angle a1 of the second lower support pattern OS11b at the first side surface OSE1 may be different from an inclination angle a2 of the second lower support pattern OS11b at the second side surface OSE2. In an embodiment, the inclination angle a1 of the second lower support pattern OS11b may be greater than the inclination angle a2 of the second lower support pattern OS11b. In an embodiment, an inclination angle a3 of the second upper support pattern OS12b at the first side surface OSE1 may be different from an inclination angle a4 of the second upper support pattern OS12b at the second side surface OSE2. In an embodiment, the inclination angle a3 of the second upper support pattern OS12b may be greater than the inclination angle a4 of the second upper support pattern OS12b. The first side surface OSE1 of the first lower support pattern OS1a may be a surface polished in a manufacturing process of the display device 1, and the second side surface OSE2 of the second lower support pattern OS11b may be a surface not polished in the manufacturing process of the display device 1. Accordingly, both side surfaces of the second lower support pattern OS11b may have different inclination angles from each other.

As illustrated in FIGS. 9, 12 and 13, the first capping layer 160 may be located on the cathode CE. The first capping layer 160 may be disposed in or to cover all of the first light emitting region LA1, the second light emitting region LA2, the third light emitting region LA3, and the non-light emitting region NLA. The first capping layer 160 may improve viewing angle characteristics and increase external luminous efficiency.

The first capping layer 160 may include an inorganic material and/or an organic material having light transmitting properties. In an embodiment, the first capping layer 160 may be an inorganic layer, an organic layer, or an organic layer including inorganic particles. In one embodiment, for example, the first capping layer 160 may include a triamine derivative, a carbazole biphenyl derivative, an arylenedi-amine derivative, or Alq3.

In an embodiment, the first capping layer 160 may include or be made of a mixture of a high refractive index material and a low refractive index material. Alternatively, the first capping layer 160 may include two layers having different refractive indices from each other, for example, a high refractive index layer and a lower refractive index layer.

In an embodiment, the first capping layer 160 may completely cover the cathode CE. In an embodiment, as illustrated in FIGS. 12 and 13, an end of the first capping layer 160 may be located relatively outward than an end of the cathode CE, and the end of the cathode CE may be completely covered by the first capping layer 160.

The encapsulation layer 170 may be disposed on the first capping layer 160. The encapsulation layer 170 protects elements located under the encapsulation layer 170, for example, the light emitting elements ED1 through ED3 from external foreign substances such as moisture. The encapsulation layer 170 is disposed in all of the first light emitting region LA1, the second light emitting region LA2, the third light emitting region LA3, and the non-light emitting region NLA. In an embodiment, the encapsulation layer 170 may directly cover the cathode CE. In an embodiment, a capping layer (not illustrated) may be further disposed between the encapsulation layer 170 and the cathode CE to cover the cathode CE. In such an embodiment, the encapsulation layer 170 may directly cover the capping layer. The encapsulation layer 170 may be a thin-film encapsulation layer.

In an embodiment, the encapsulation layer 170 may include a lower inorganic layer 171, the organic layer 173, and an upper inorganic layer 175 sequentially stacked on the first capping layer 160.

In an embodiment, the lower inorganic layer 171 may cover the first light emitting element ED1, the second light emitting element ED2, and the third light emitting element ED3 in the display area DA. The lower inorganic layer 171 may cover the dam member DM in the non-display area NDA and extend to the outside of the dam member DM. In an embodiment, an end of the lower inorganic layer 171 may be spaced apart from the first support member OS1 and may be located between the first portion OS1a of the first support member OS1 and the dam member DM and between the second portion OS1b of the first support member OS1 and the dam member DM.

In an embodiment, the lower inorganic layer 171 may completely cover the first capping layer 160. In an embodiment, as illustrated in FIGS. 12 and 13, an end of the lower inorganic layer 171 may be located relatively outward than an end of the first capping layer 160, and the end of the first capping layer 160 may be completely covered by the lower inorganic layer 171.

The organic layer 173 may be located on the lower inorganic layer 171. The organic layer 173 may cover the first light emitting element ED1, the second light emitting element ED2, and the third light emitting element ED3 in the display area DA. In an embodiment, a part of the organic layer 173 may be located in the non-display area NDA but may not be located outside of the dam member DM. In an embodiment, as shown in FIGS. 12 and 13, a part of the organic layer 173 may be located inside the first dam D1, but the disclosure is not limited thereto. In an alternative embodiment, a part of the organic layer 173 may be accommodated in a space between the first dam D1 and the second dam D2, and an end of the organic layer 173 may be located in a region between the first dam D1 and the second dam D2.

The upper inorganic layer 175 may be located on the organic layer 173. The upper inorganic layer 175 may cover the organic layer 173. In an embodiment, the upper inorganic layer 175 may directly contact the lower inorganic layer 171 in the non-display area NDA to form an inorganic-inorganic bond, and an end of the upper inorganic layer 175 may be located between the dam member DM and the first support member OS1. In an embodiment, the end of the upper inorganic layer 175 and the end of the lower inorganic layer 171 may be substantially aligned with each other.

In an embodiment where the lower inorganic layer 171 and the upper inorganic layer 175 are spaced apart from the first support member OS1, the first support member OS1 may absorb external impacts even if a side polishing process for polishing side surfaces of the display device 1 is performed in the manufacturing process of the display device 1. In such an embodiment, the first support member OS1 may function as a crack dam. Therefore, an impact may be effectively prevented from being transmitted to the lower inorganic layer 171 and the upper inorganic layer 175 to generate cracks or propagate generated cracks. Accordingly, the reliability of the display device 1 may be improved.

In an embodiment, each of the lower inorganic layer 171 and the upper inorganic layer 175 may include or be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride.

In an embodiment, each of the lower inorganic layer 171 and the upper inorganic layer 175 may be a single layer, but the disclosure is not limited thereto. Alternatively, at least one of the lower inorganic layer 171 and the upper inorganic layer 175 may have a multilayer structure, that is, a structure in which a plurality of layers, each including or made of an inorganic material, are stacked one on another.

In an embodiment, the organic layer 173 may include or be made of acrylic resin, methacrylic resin, polyisoprene, vinyl resin, epoxy resin, urethane resin, cellulose resin, or perylene resin.

However, the structure of the encapsulation layer 170 is not limited to the above example and may be variously modified.

The color conversion substrate 30 will now be described in detail with reference to FIGS. 15 through 19 in addition to FIGS. 1 through 14.

Figure 15:
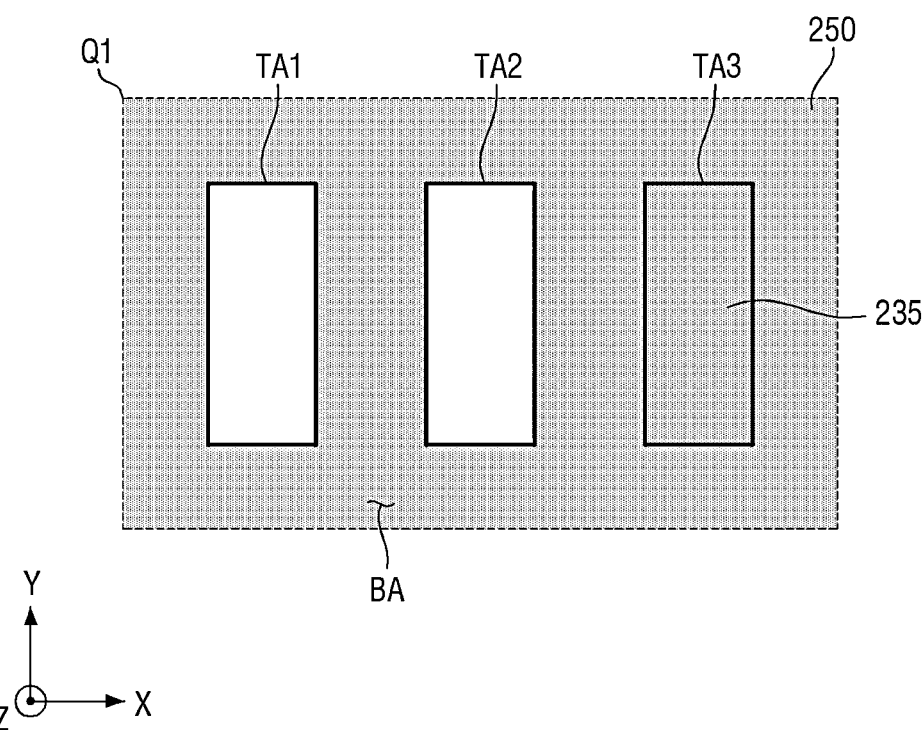
FIG. 15 is a plan view illustrating the schematic arrangement of a third color filter and a color pattern in the color conversion substrate of the display device according to an embodiment.
Figure 16:
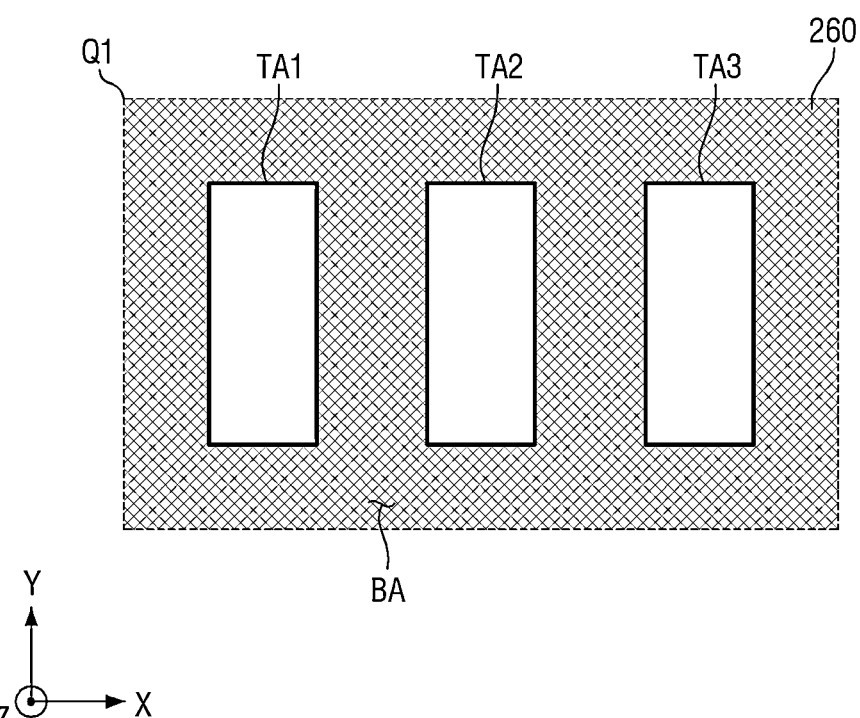
FIG. 16 is a plan view illustrating the schematic arrangement of a light blocking pattern in the color conversion substrate of the display device according to an embodiment.
Figure 17:
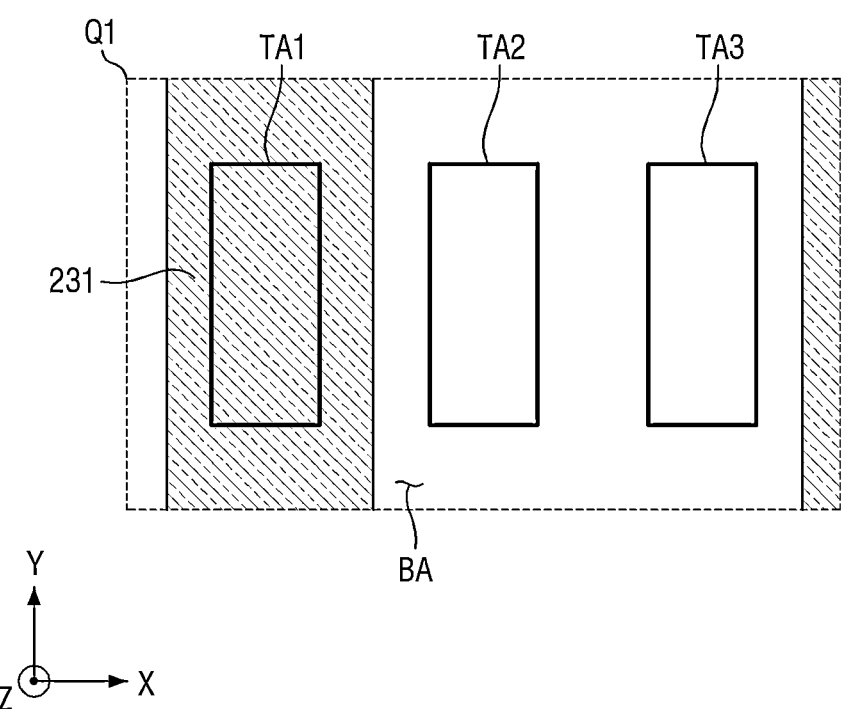
FIG. 17 is a plan view illustrating the schematic arrangement of a first color filter in the color conversion substrate of the display device according to an embodiment.
Figure 18:
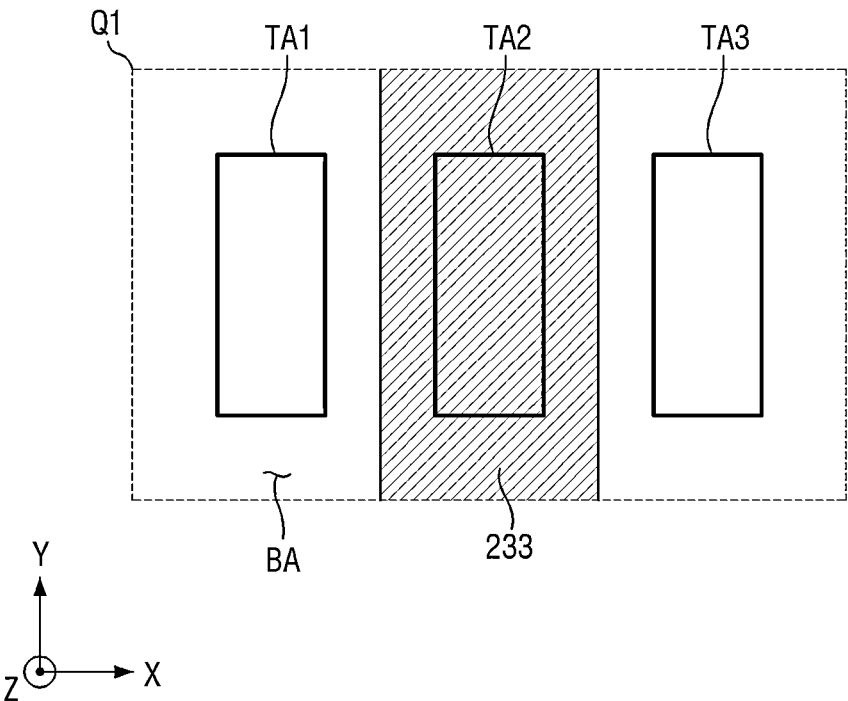
FIG. 18 is a plan view illustrating the schematic arrangement of a second color filter in the color conversion substrate of the display device according to an embodiment.
Figure 19:
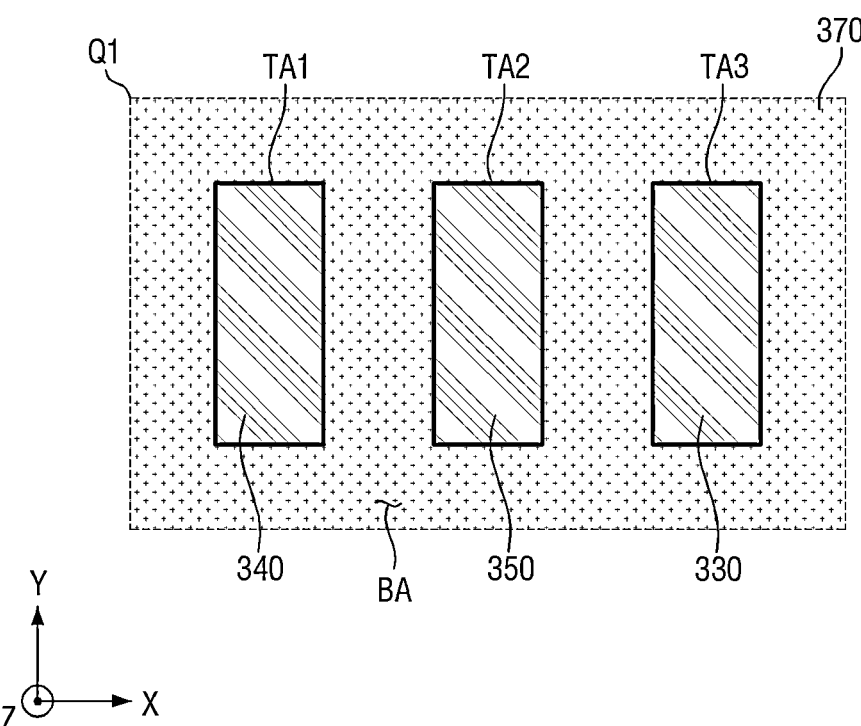
FIG. 19 is a plan view illustrating the schematic arrangement of a bank pattern, a first wavelength conversion

FIG. 15 is a plan view illustrating the schematic arrangement of a third color filter 235 and the color pattern 250 in the color conversion substrate 30 of the display device 1 according to an embodiment. FIG. 16 is a plan view illustrating the schematic arrangement of the light blocking pattern 260 in the color conversion substrate 30 of the display device 1 according to an embodiment. FIG. 17 is a plan view illustrating the schematic arrangement of a first color filter 231 in the color conversion substrate 30 of the display device 1 according to an embodiment. FIG. 18 is a plan view illustrating the schematic arrangement of a second color filter 233 in the color conversion substrate 30 of the display device 1 according to an embodiment. FIG. 19 is a plan view illustrating the schematic arrangement of the bank pattern 370, a first wavelength conversion pattern 340, a second wavelength conversion pattern 350, and a light transmission pattern 330 in the color conversion substrate 30 of the display device 1 according to an embodiment.

A second base 310 of the color conversion substrate 30 illustrated in FIGS. 9, 12 and 13 may include or be made of a light transmitting material.

In an embodiment, the second base 310 may include a glass substrate or a plastic substrate. In an embodiment, the second base 310 may further include a separate layer located on the glass substrate or the plastic substrate, for example, an insulating layer such as an inorganic layer.

In an embodiment, the light transmitting regions TA1 through TA3 and the light blocking region BA may be defined in the second base 310 as described above.

As illustrated in FIGS. 9, 12 and 13, the third color filter 235 and the color pattern 250 may be located on a surface of the second base 310 which faces the display substrate 10.

The third color filter 235 may overlap the third light emitting region LA3 or the third light transmitting region TA3.

The third color filter 235 may transmit only light of the third color (e.g., blue light) and block or absorb light of the first color (e.g., red light) and light of the second color (e.g., green light). In an embodiment, the third color filter 235 may be a blue color filter and may include a blue colorant such as a blue dye or a blue pigment. As used herein, the term 'colorant' is a concept encompassing both a dye and a pigment.

The color pattern 250 may overlap the non-light emitting region NLA or the light blocking region BA. In an embodiment, the color pattern 250 may be further located in the non-display area NDA.

The color pattern 250 may absorb a part of light introduced from the outside of the display device 1 into the display device 1, thereby reducing reflected light due to external light. If a considerable part of external light is reflected, distortion of the color gamut of the display device 1 may occur. In an embodiment, the color pattern 250 is located in the non-light emitting region NLA and the non-display area NDA, such that color distortion due to reflection of external light may be substantially reduced.

In an embodiment, the color pattern 250 may include a blue colorant such as a blue dye or a blue pigment. In an embodiment, the color pattern 250 may include or be made of the same material as the third color filter 235 and may be formed simultaneously with the third color filter 235 during a same process. In an embodiment where the color pattern 250 includes a blue colorant, external light or reflected light transmitted through the color pattern 250 may be blue light. A user's eye color sensibility varies according to the color of light. More specifically, light of a blue wavelength band may be perceived less sensitively by a user than light of a green wavelength band and light of a red wavelength band. Therefore, in such an embodiment where the color pattern 250 includes a blue colorant, a user may perceive reflected light relatively less sensitively.

In an embodiment, as illustrated in FIG. 15, the color pattern 250 may be disposed over the entire light blocking region BA. In an embodiment, as illustrated in FIG. 15, the color pattern 250 and the third color filer 235 may be connected to each other, or the color pattern 250 and the third color filer 235 may be integrally formed as a single unitary unit.

In an embodiment, as illustrated in FIGS. 9, 12 and 13, the light blocking pattern 260 may be located on the surface of the second base 310 which faces the display substrate 10. The light blocking pattern 260 may overlap the light blocking region BA to block transmission of light. In an embodiment, the light blocking pattern 260 may be disposed in a substantially lattice shape in a plan view in the third direction Z as illustrated in FIG. 16.

In an embodiment, the light blocking pattern 260 may include an organic light blocking material and may be formed by coating and exposing the organic light blocking material.

As described above, external light may cause distortion of the color gamut of the display device 1. In an embodiment, the light blocking pattern 260 is located on the second base 310, such that at least a part of the external light is absorbed by the light blocking pattern 260. Therefore, color distortion due to reflection of external light may be reduced. In an embodiment, the light blocking pattern 260 may prevent color mixing due to intrusion of light between adjacent light transmitting regions, thereby further improving the color gamut.

In an embodiment, the light blocking pattern 260 may be located on the color pattern 250. In such an embodiment, the light blocking pattern 260 may be located opposite the second base 310 with the color pattern 250 interposed between them.

In an embodiment where the color pattern 250 is located between the light blocking pattern 260 and the second base 310, the light blocking pattern 260 may not contact the second base 310.

In an alternative embodiment, the light blocking pattern 260 may be omitted.

In an embodiment, as illustrated in FIG. 9, the first color filter 231 and the second color filter 233 may be located on the surface of the second base 310 which faces the display substrate 10.

The first color filter 231 may overlap the first light emitting region LA1 or the first light transmitting region TA1, and the second color filter 233 may overlap the second light emitting region LA2 or the second light transmitting region TA2.

In an embodiment, the first color filter 231 may block or absorb light of the third color (e.g., blue light). That is, the first color filter 231 may function as a blue light blocking filter that blocks blue light. In an embodiment, the first color filter 231 may transmit only light of the first color (e.g., red light) and block or absorb light of the third color (e.g., blue light) and block or absorb light of the second color (e.g., green light). In one embodiment, for example, the first color filter 231 may be a red color filter and may include a red colorant.

The second color filter 233 may block or absorb light of the third color (e.g., blue light). That is, the second color filter 233 may also function as a blue light blocking filter. In an embodiment, the second color filter 233 may transmit only light of the second color (e.g., green light) and block or absorb light of the third color (e.g., blue light) and light of the first color (e.g., red light). In one embodiment, for example, the second color filter 233 may be a green color filter and may include a green colorant.

In an embodiment, a part of the first color filter 231 may be further located in the light blocking region BA as illustrated in FIGS. 9 and 17, and a part of the second color filter 233 may also be further located in the light blocking region BA as illustrated in FIGS. 9 and 18.

In an embodiment, a part of the first color filter 231 may be further located in the blocking region BA between the first light transmitting region TA1 and the second light transmitting region TA2 and between the first light transmitting region TA1 and the third light transmitting region TA3.

In an embodiment, a part of the second color filter 233 may be further located in the light blocking region BA between the first transmitting region TA1 and the second light transmitting region TA2 and between the second light transmitting region TA2 and the third light transmitting region TA3.

In such an embodiment, the first color filter 231 and the second color filter 233 overlap each other, and the first color filter 231 and the second color filter 233 may also overlap each other in the light blocking region BA between the first light transmitting region TA1 and the second light transmitting region TA2. A part of the light blocking region BA, in which the first color filter 231 and the second color filter 233 overlap each other, may function as a light blocking member that blocks transmission of light.

In an alternative embodiment, the first color filter 231 and the second color filter 233 may be located over the entire light blocking region BA and may overlap each other in the entire light blocking region BA.

In an embodiment, the first color filter 231 and the second color filter 233 may overlap the color pattern 250 in the light blocking region BA. In one embodiment, for example, the color pattern 250 may overlap the first color filter 231 and the second color filter 233 in the light blocking region BA between the first light transmitting region TA1 and the second light transmitting region TA2. In such an embodiment, the color pattern 250 may overlap the second color filter 233 in the light blocking region BA between the second light transmitting region TA2 and the third light transmitting region TA3. In such an embodiment, the color pattern 250 may overlap the first color filter 231 in the light blocking region BA between the third light transmitting region TA3 and the first light transmitting region TA1.

In the light blocking region BA, a part where the first color filter 231 and the color pattern 250 overlap and a part where the second color filter 233 and the color pattern 250 overlap may function as light blocking members. In the light blocking region BA, the part where the first color filter 231 and the color pattern 250 overlap and the part where the second color filter 233 and the color pattern 250 overlap may absorb at least a part of external light, thereby reducing color distortion due to reflection of the external light. In addition, light emitted to the outside may be prevented from intruding between adjacent light emitting regions and thus causing color mixing. Accordingly, the color gamut of the display device 1 can be further improved.

In an embodiment, at least one selected from the first color filter 231 and the second color filter 233 may be further located in the non-display area NDA. In one embodiment, for example, as illustrated in FIGS. 12 and 13, the first color filter 231 may be further located in the non-display area NDA and may overlap the color pattern 250 in the non-display area NDA. The color pattern 250 and the first color filter 231 overlapping each other may function as light blocking members in the non-display area NDA. In an embodiment where the light blocking pattern 260 is omitted, the first color filter 231 may be located directly on the color pattern 250 in the non-display area NDA.

In an embodiment, as illustrated in FIGS. 9, 12 and 13, a second capping layer 391 may be located on the surface of the second base 310 to cover the light blocking pattern 260, the color pattern 250, the first color filter 231, the second color filter 233, and the third color filter 235. In an embodiment, the second capping layer 391 may directly contact the first color filter 231, the second color filter 233, and the third color filter 235. In an embodiment, the second capping layer 391 may directly contact the light blocking pattern 260.

The second capping layer 391 may prevent impurities such as moisture or air from being introduced from the outside and damaging or contaminating the light blocking pattern 260, the color pattern 250, the first color filter 231, the second color filter 233, and the third color filter 235. In addition, the second capping layer 391 may prevent the colorants contained in the first color filter 231, the second color filter 233 and the third color filter 235 from being diffused to other elements such as the first wavelength conversion pattern 340 and the second wavelength conversion pattern 350. In an embodiment, the second capping layer 391 may include or be made of an inorganic material. In one embodiment, for example, the second capping layer 391 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

In an embodiment, the second capping layer 391 may cover side surfaces of the color pattern 250, the light blocking pattern 260, and the first color filter 231 in the non-display area NDA. In an embodiment, the second capping layer 391 may directly contact the second base 310 in the non-display area NDA.

The bank pattern 370 may be located on a surface of the second capping layer 391 which faces the display substrate 10. In an embodiment, the bank pattern 370 may be located directly on the surface of the second capping layer 391 and may directly contact the second capping layer 391.

In an embodiment, the bank pattern 370 may overlap the non-light emitting region NLA or the light blocking region BA. In an embodiment, the bank pattern 370 may surround the first light transmitting region TA1, the second light transmitting region TA2, and the third light transmitting region TA3 in a plan view in the third direction Z as illustrated in FIG. 19. The bank pattern 370 may separate spaces in which the first wavelength conversion pattern 340, the second wavelength conversion pattern 350, and the light transmission pattern 330 are disposed.

In an embodiment, the bank pattern 370 may be formed as a integrally connected single pattern as illustrated in FIG. 19, but the disclosure is not limited thereto. In an alternative embodiment, a part of the bank pattern 370 which surrounds the first light transmitting region TA1, a part of the bank pattern 370 which surrounds the second light transmitting region TA2, and a part of the bank pattern 370 which surrounds the third light transmitting region TA3 may be formed as individual patterns separated from each other.

In an embodiment, the first wavelength conversion pattern 340, the second wavelength conversion pattern 350, and the light transmission pattern 330 are formed by a method of ejecting an ink composition using a nozzle, that is, an inkjet printing method, and the bank pattern 370 may serve as a guide that stably positions the ejected ink composition at a desired position. In such an embodiment, the bank pattern 370 may function as a barrier rib.

In an embodiment, the bank pattern 370 may overlap the pixel defining layer 150.

As illustrated in FIGS. 12 and 13, in an embodiment, the bank pattern 370 may be further located in the non-display area NDA. The bank pattern 370 may overlap the color pattern 250 and the first color filter 231 in the non-display area NDA.

In an embodiment, the bank pattern 370 may include an organic material having photocurability. In an embodiment, the bank pattern 370 may include an organic material having photocurability and including a light blocking material. In such an embodiment where the bank pattern 370 has light blocking properties, the bank pattern 370 may prevent light from intruding between neighboring light emitting regions in the display area DA. In one embodiment, for example, the bank pattern 370 may block the output light LE emitted from the second light emitting element ED2 from entering the first wavelength conversion pattern 340 overlapping the first light emitting region LA1. In such an embodiment, the bank pattern 370 may block or prevent external light from entering elements located under the bank pattern 370 in the non-light emitting region NLA and the non-display area NDA.

In an embodiment, as illustrated in FIGS. 9, 12 and 13, the first wavelength conversion pattern 340, the second wavelength conversion pattern 350, and the light transmission pattern 330 may be located on the second capping layer 391. In an embodiment, the first wavelength conversion pattern 340, the second wavelength conversion pattern 350, and the light transmission pattern 330 may be located in the display area DA.

The light transmission pattern 330 may overlap the third light emitting region LA3 or the third light emitting element ED3. The light transmission pattern 330 may be located in a space defined by the bank pattern 370 in the third light transmitting region TA3.

In an embodiment, the light transmission pattern 330 may be formed as an island-shaped pattern as illustrated in FIG. 19. In such an embodiment, the light transmission pattern 330 may not overlap the light blocking region BA as shown in FIG. 19, but not being limited thereto. In an alternative embodiment, a part of the light transmission pattern 330 may overlap the light blocking region BA.

The light transmission pattern 330 may transmit incident light. The output light LE provided by the third light emitting element ED3 may be blue light as described above. The output light LE which is blue light is transmitted through the light transmission pattern 330 and the third color filter 235 and then emitted to the outside of the display device 1. That is, third light L03 emitted out of the display device 1 through the third light emitting region LA3 may be blue light.

In an embodiment, the light transmission pattern 330 may include a first base resin 331 and may further include a first scatterer 333 dispersed in the first base resin 331.

The first base resin 331 may include or be made of a material having high light transmittance. In an embodiment, the first base resin 331 may include or be made of an organic material. In one embodiment, for example, the first base resin 331 may include an organic material such as epoxy resin, acrylic resin, cardo resin, or imide resin.

The first scatterer 333 may have a refractive index different from that of the first base resin 331 and may form an optical interface with the first base resin 331. In one embodiment, for example, the first scatterer 333 may be light scattering particles. The first scatterer 333 is not particularly limited as long as it is a material that can scatter at least a part of transmitted light. In one embodiment, for example, the first scatterer 333 may be metal oxide particles or organic particles. In such an embodiment, the metal oxide particles may include at least one selected from titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$). In such an embodiment, the organic particles may include at least one selected from acrylic resin and urethane resin. The first scatterer 333 may scatter incident light in random directions regardless of the incident direction of the incident light without substantially changing the wavelength of the light transmitted through the light transmission pattern 330.

In an embodiment, the light transmission pattern 330 may directly contact the second capping layer 391 and the bank pattern 370.

The first wavelength conversion pattern 340 may be located on the second capping layer 391 and may overlap the first light emitting region LA1 or the first light emitting element ED1 or the first light transmitting region TA1.

In an embodiment, the first wavelength conversion pattern 340 may be located in a space defined by the bank pattern 370 in the first light transmitting region TA1.

In an embodiment, the first wavelength conversion pattern 340 may be formed as an island-shaped pattern as illustrated in FIG. 19. In an embodiment, the first wavelength conversion pattern 340 may not overlap the light blocking region BA as shown in FIG. 19, but not being limited thereto. In an embodiment, a part of the first wavelength conversion pattern 340 may overlap the light blocking region BA.

In an embodiment, the first wavelength conversion pattern 340 may directly contact the second capping layer 391 and the bank pattern 370.

The first wavelength conversion pattern 340 may convert or shift a peak wavelength of incident light into another specific peak wavelength and output light having the converted or shifted specific peak wavelength. In an embodiment, the first wavelength conversion pattern 340 may convert the output light LE provided by the first light emitting element ED1 into red light having a peak wavelength in a range of about 610 nm to about 650 nm and output the red light.

In an embodiment, the first wavelength conversion pattern 340 may include a second base resin 341 and a first wavelength shifter 345 dispersed in the second base resin 341 and may further include a second scatterer 343 dispersed in the second base resin 341.

The second base resin 341 may include or be made of a material having high light transmittance. In an embodiment, the second base resin 341 may include or be made of an organic material. In an embodiment, the second base resin 341 may include or be made of the same material as the first base resin 331 or may include at least one selected from the materials listed above for the first base resin 331.

The first wavelength shifter 345 may convert or shift a peak wavelength of incident light to another specific peak wavelength. In an embodiment, the first wavelength shifter 345 may convert the output light LE of the third color, which is blue light provided by the first light emitting element ED1, into red light having a single peak wavelength in a range of about 610 nm to about 650 nm and output the red light.

Examples of the first wavelength shifter 345 may include quantum dots, quantum rods, and phosphors. In one embodiment, for example, the quantum dots may be particulate materials that emit light of a specific color when electrons transit from a conduction band to a valence band.

The quantum dots may be semiconductor nanocrystalline materials. The quantum dots may have a specific band gap according to their composition and size. Thus, the quantum dots may absorb light and then emit light having a unique wavelength. Examples of semiconductor nanocrystals of the quantum dots include group IV nanocrystals, group II-VI compound nanocrystals, group III-V compound nanocrystals, group IV-VI nanocrystals, and combinations of the same.

The group II-VI compounds may be selected from binary compounds selected from CdSe, CdTe, ZnS, ZnSe, ZnTe, ZnO, HgS, HgSe, HgTe, MgSe, MgS and mixtures of the same; ternary compounds selected from InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof; and quaternary compounds selected from HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

The group III-V compounds may be selected from binary compounds selected from GaN, GaP, GaAs, GaSb, AlN, AlP, AlAs, AlSb, InN, InP, InAs, InSb and mixtures of the same; ternary compounds selected from GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and mixtures thereof; and quaternary compounds selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The group IV-VI compounds may be selected from binary compounds selected from SnS, SnSe, SnTe, PbS, PbSe, PbTe and mixtures thereof; ternary compounds selected from SnSeS, SnSeTe, SnSTe, PbSeS, PbSeTe, PbSTe, SnPbS, SnPbSe, SnPbTe and mixtures of the same; and quaternary compounds selected from SnPbSSe, SnPbSeTe, SnPbSTe and mixtures thereof. The group IV elements may be selected from silicon (Si), germanium (Ge), and a mixture thereof. The group IV compounds may be binary compounds selected from silicon carbide (SiC), silicon germanium (SiGe), and a mixture thereof.

Here, the binary, ternary or quaternary compounds may be in the particles at a uniform concentration or may be in the same particles at partially different concentrations. In addition, the quantum dots may have a core/shell structure in which one quantum dot surrounds another quantum dot. An interface between the core and the shell may have a concentration gradient in which the concentration of an element in the shell is reduced toward the center.

In an embodiment, the quantum dots may have a core-shell structure including a core containing the above-described nanocrystal and a shell surrounding the core. The shell of each quantum dot may serve as a protective layer for maintaining semiconductor characteristics by preventing chemical denaturation of the core and/or as a charging layer for giving electrophoretic characteristics to the quantum dot. The shell may be a single layer or a multilayer. An interface between the core and the shell may have a concentration gradient in which the concentration of an element in the shell is reduced toward the center. The shell of each quantum dot may be, for example, a metal or non-metal oxide, a semiconductor compound, or a combination thereof.

In one embodiment, for example, the metal or non-metal oxide may be, but is not limited to, a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ or NiO or a ternary compound such as $MgAl_2O_4$, $CoFe_2O_4$, $NiFe_2O_4$ or $CoMn_2O_4$.

In such an embodiment, the semiconductor compound may be, but is not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb.

Light emitted from the first wavelength shifter 345 may have a full width of half maximum ("FWHM") of an emission wavelength spectrum of about 45 nm or less, about 40 nm or less, or about 30 nm or less. Therefore, the color purity and color reproducibility of the display device 1 can be improved. In addition, the light emitted from the first wavelength shifter 345 may be radiated in various directions regardless of the incident direction of incident light. Therefore, the lateral visibility of the first color displayed in the first light transmitting region TA1 may be improved.

A part of the output light LE provided by the first light emitting element ED1 may be transmitted through the first wavelength conversion pattern 340 without being converted into red light by the first wavelength shifter 345. A component of the output light LE incident on the first color filter 231 without being converted by the first wavelength conversion pattern 340 may be blocked by the first color filter 231, and red light, into which the output light LE has been converted by the first wavelength conversion pattern 340, may be transmitted through the first color filter 231 and emitted to the outside. That is, first light L01 emitted out of the display device 1 through the first light transmitting region TA1 may be red light.

The second scatterer 343 may have a refractive index different from that of the second base resin 341 and may form an optical interface with the second base resin 341. In one embodiment, for example, the second scatterer 343 may be light scattering particles. Other features of the second scatterer 343 are substantially the same or similar to those of the first scatterer 333, and thus any repetitive detailed description thereof will be omitted.

The second wavelength conversion pattern 350 may be located in a space defined by the bank pattern 370 in the second light transmitting region TA2.

In an embodiment, the second wavelength conversion pattern 350 may be formed as an island-shaped pattern as illustrated in FIG. 19. In an alternative embodiment, a part of the second wavelength conversion pattern 350 may overlap the light blocking region BA.

In an embodiment, the second wavelength conversion pattern 350 may directly contact the second capping layer 391 and the bank pattern 370.

The second wavelength conversion pattern 350 may convert or shift a peak wavelength of incident light into another specific peak wavelength and output light having the converted or shifted specific peak wavelength. In an embodiment, the second wavelength conversion pattern 350 may convert the output light LE provided by the second light emitting element ED2 into green light in a range of about 510 nm to about 550 nm and output the green light.

In an embodiment, the second wavelength conversion pattern 350 may include a third base resin 351 and a second wavelength shifter 355 dispersed in the third base resin 351 and may further include a third scatterer 353 dispersed in the third base resin 351.

The third base resin 351 may include or be made of a material having high light transmittance. In an embodiment, the third base resin 351 may include or be made of an organic material. In an embodiment, the third base resin 351 may include or be made of the same material as the first base resin 331 or may include at least one selected from the materials listed above for the first base resin 331.

The second wavelength shifter 355 may convert or shift a peak wavelength of incident light to another specific peak wavelength. In an embodiment, the second wavelength shifter 355 may convert blue light having a peak wavelength in a range of about 440 nm to about 480 nm into green light having a peak wavelength in a range of about 510 nm to about 550 nm.

Examples of the second wavelength shifter 355 may include quantum dots, quantum rods, and phosphors. The second wavelength shifter 355 is substantially the same or similar to the first wavelength shifter 345 described above, and thus any repetitive detailed description thereof will be omitted.

In an embodiment, both the first wavelength shifter 345 and the second wavelength shifter 355 may include or be composed of quantum dots. In such an embodiment, the particle size of quantum dots constituting the second wavelength shifter 355 may be smaller than that of quantum dots constituting the first wavelength shifter 345.

The third scatterer 353 may have a refractive index different from that of the third base resin 351 and may form an optical interface with the third base resin 351. In one embodiment, for example, the third scatterer 353 may be light scattering particles. Other features of the third scatterer 353 are substantially the same or similar to those of the second scatterer 343, and thus any repetitive detailed description thereof will be omitted.

The output light LE emitted from the second light emitting element ED2 may be provided to the second wavelength conversion pattern 350, and the second wavelength shifter 355 may convert the output light LE provided by the second light emitting element ED2 into green light having a peak wavelength in a range of about 510 nm to about 550 nm and emit the green light.

A part of the output light LE which is blue light may be transmitted through the second wavelength conversion pattern 350 without being converted into green light by the second wavelength shifter 355 and may be blocked by the second color filter 233, and green light, into which the output light LE has been converted by the second wavelength conversion pattern 350, may be transmitted through the second color filter 233 and emitted to the outside. Accordingly, second light L02 emitted out of the display device 1 through the second light transmitting region TA2 may be green light.

A third capping layer 393 may be located on the bank pattern 370, the light transmission pattern 330, the first wavelength conversion pattern 340, and the second wavelength conversion pattern 350. The third capping layer 393 may cover the light transmission pattern 330, the first wavelength conversion pattern 340, and the second wavelength conversion pattern 350. In an embodiment, the third capping layer 393 may also be located in the non-display area NDA. In the non-display area NDA (see FIG. 1), the third capping layer 393 may directly contact the second capping layer 391 and seal the light transmission pattern 330, the first wavelength conversion pattern 340, and the second wavelength conversion pattern 350. Accordingly, impurities such as moisture or air may be effectively prevented from being introduced from the outside and damaging or contaminating the light transmission pattern 330, the first wavelength conversion pattern 340 and the second wavelength conversion pattern 350.

In an embodiment, the third capping layer 393 may cover an outer surface of the bank pattern 370 in the non-display area NDA. In an embodiment, the third capping layer 393 may directly contact the second capping layer 391 in the non-display area NDA.

In an embodiment, the third capping layer 393 may include or be made of an inorganic material. In an embodiment, the third capping layer 393 may include or be made of the same material as the second capping layer 391 or may include at least one selected from the materials mentioned in the description of the second capping layer 391. In an embodiment where both the second capping layer 391 and the third capping layer 393 includes or are made of an inorganic material, both the second capping layer 391 and the third capping layer 393 may directly contact each other in the non-display area NDA to form an inorganic-inorganic bond.

In an embodiment, as described above, the sealing member 50 may be located between the color conversion substrate 30 and the display substrate 10 in the non-display area NDA.

The sealing member 50 may overlap the encapsulation layer 170. In one embodiment, for example, the sealing member 50 may overlap the lower inorganic layer 171 and the upper inorganic layer 175 and may not overlap the organic layer 173. In an embodiment, the sealing member 50 may directly contact the encapsulation layer 170. In one embodiment, for example, the sealing member 50 may be directly located on the upper inorganic layer 175 and may directly contact the upper inorganic layer 175.

In an embodiment, the upper inorganic layer 175 and the lower inorganic layer 171 located under the sealing member 50 may extend to the outside of the sealing member 50, and an end of the upper inorganic layer 175 and an end of the lower inorganic layer 171 may be located between the sealing member 50 and the first portion OS1$a$ of the first support member OS1 and between the sealing member 50 and the second portion OS1$b$ of the first support member OS1.

The sealing member 50 may overlap the color pattern 250, the first color filter 231, and the bank pattern 370 in the non-display area NDA. In an embodiment, the sealing member 50 may directly contact the third capping layer 393 that covers the bank pattern 370.

The sealing member 50 may overlap the first gate metal WR1 including a wiring connected to the connection pad PD and may also overlap the second gate metal WR2 including a part of the gate driving circuit. In such an embodiment where the sealing member 50 is disposed to overlap the first gate metal WR1 and the second gate metal WR2, a width of the non-display area NDA may be reduced.

The filler 70 may be located in the space between the color conversion substrate 30, the display substrate 10, and the sealing member 50 as described above. In an embodiment, the filler 70 may directly contact the third capping layer 393 and the upper inorganic layer 175 of the encapsulation layer 170 as illustrated in FIGS. 9, 12 and 13.

In embodiments of the display device according to the invention, a first support member may not only support masks during a manufacturing process but also function as a crack dam that prevents cracking of an inorganic layer, thereby improving the reliability of the display device and reducing a defect rate in the manufacturing process. In such embodiments, since a sealing member is disposed to overlap a encapsulation layer, space efficiency of a non-display area may be improved.

FIG. 20 is a plan view of a display device 1' separated from a mother substrate, on which side polishing has not been performed, according to an embodiment. FIG. 21 is a cross-sectional view taken along line X31-X31' of FIG. 20 showing the display device 1' on which side polishing has not be performed. FIG. 22 is a cross-sectional view taken along line X51-X51' of FIG. 20 showing the display device 1' on which side polishing has not be performed.

Referring to FIGS. 20 through 22, an embodiment of the display device 1' separated from a mother substrate or a mother glass by cutting the mother substrate or the mother glass along a scribing line SRL (hereinafter, referred to as an 'unprocessed display device') includes an unprocessed display substrate 10', an unprocessed color conversion substrate 30', a sealing member 50, and a filler 70. The unprocessed display substrate 10' may include not only a first support member OS1' located in a non-display area NDA but also a second support member OS2 located outside of the first support member OS1'.

In an embodiment, the first support member OS1' of the unprocessed display device 1' may include a first portion OS1$a$' located adjacent to a first side L1$a$ of the unprocessed display device 1' and a second portion OS1$b$' disposed along a second side L2$a$, a third side L3$a$ and a fourth side L4$a$ of the unprocessed display device 1'. A width of the first portion OS1$a$' in the first direction X may be greater than that of the first portion OS1$a$ (see FIG. 2) illustrated in FIG. 2.

In an embodiment, the second support member OS2 of the unprocessed display device 1' may be located outside of the second portion OS1$b$' of the first support member OS1'. The second support member OS2 may be disposed along the second side L2$a$, the third side L3$a$ and the fourth side L4$a$ of the unprocessed display device 1' and may be connected to the first portion OS1$a$' of the first support member OS1'.

The first portion OS1$a$' includes a first lower support pattern OS11$a$' and a first upper support pattern OS12$a$' located on the first lower support pattern OS11$a$', and the second portion OS1$b$' includes a second lower support pattern OS11$b$' and a second upper support pattern OS12$b$' located on the second lower support pattern OS11$b$' as described above.

The second support member OS2 may also include a lower support pattern OS21 and an upper support pattern OS22. The first support member OS1' and the second support member OS2 may function as mask supports that support masks (or open masks) used in the process of forming a light emitting layer OL, a cathode CE, a first capping layer 160, a lower inorganic layer 171 and an upper inorganic layer 175 of the unprocessed display substrate 10' in the state of the mother substrate or the mother glass.

The second support member OS2 and the second portion OS1$b$' of the first support member OS1' may be spaced apart from each other. Therefore, when a process of cutting the mother substrate along the scribing line SRL is performed, the second support member OS2 may primarily absorb impacts. In an embodiment, since the second support member OS2 and the second portion OS1$b$' of the first support member OS1' are spaced apart from each other, the transmission of an impact, which is applied to the second support member OS2, to the first support member OS1' may be reduced. Therefore, cracks may be effectively prevented from being generated in the lower inorganic layer 171 and the upper inorganic layer 175 due to external impacts during the process of cutting the mother substrate.

A side polishing process may be further performed on the unprocessed display device 1' separated from the mother substrate. The second side L2$a$, the third side L3$a$ and the fourth side L4$a$ of the unprocessed display device 1' may be polished up to a side polishing line SPL located relatively inward than the scribing line SRL. In the side polishing process, the unprocessed display substrate 10' and the unprocessed color conversion substrate 30' may be partially removed, and the second support member OS2 may also be removed. In an embodiment, a portion of the first portion OS1$a$' of the first support member OS1' which faces the second side L2a and the fourth side L4a may be removed, and a portion of the second portion OS1b' of the first support member OS1' may be removed in the side polishing process. Therefore, a width of the second portion OS1b' may be reduced in the side polishing process.

In such an embodiment, the side polishing process may not be performed on the first side L1a of the unprocessed display device 1'. Alternatively, the side polishing process may be performed on the first side L1a of the unprocessed display device 1' only up to a part outside connection pads PD. Therefore, the width of the first portion OS1a' of the first support member OS1' may not be reduced. Accordingly, after the side polishing is completed, the width W1a (see FIG. 12) of the first portion OS1a (see FIG. 12) may be greater than the width W1b of the second portion OS1b (see FIG. 13).

In an embodiment, a part of the color conversion substrate 30' on the first side L1a may be partially cut and removed along a cutting line CL before or after the side polishing process is performed. Through the above process, the display device illustrated in FIGS. 2, 9, 12 and 13 may be manufactured.

In an embodiment of the display device, as described above, a width of a non-display area may be relatively reduced because a side polishing process is performed on the display device after the display device is separated from a mother substrate in a manufacturing process. In such an embodiment, since support members that support a mask are spaced apart from each other in the state of the mother substrate, the transmission of an impact, which may be generated in a cutting process for separating the display device, into the display device may be effectively prevented or minimized. In such an embodiment, even if a part of an inorganic layer (e.g., a first lower inorganic layer and a first upper inorganic layer) is partially deposited on a first support member due to mask misalignment in the manufacturing process, an external impact generated in the cutting process may be absorbed by a second support member. In such an embodiment, since the second support member and the first support member are spaced apart from each other, the impact absorbed by the second support member may not be transmitted to the first support member. Accordingly, the generation of cracks in the inorganic layer due to the cutting process may be effectively prevented or minimized. In such an embodiment, since an impact generated in the side polishing process is absorbed by the first support member, the transmission of the impact to the inorganic layer due to the side polishing process can be reduced or prevented.

FIG. 23 is a plan view of a display device 1-1 according to an embodiment. FIG. 24 is a cross-sectional view taken along line X32-X32' of the display device 1-1 of FIG. 23. FIG. 25 is a cross-sectional view taken along line X52-X52' of the display device 1-1 of FIG. 23.

The display device 1-1 shown in FIGS. 23 to 25 is substantially the same or similar to the embodiment illustrated in FIGS. 2, 9, 12 and 13 except that a display substrate 10-1 includes a first support member OS1-1 and a second support member OS2-1. The same or like elements shown in FIGS. 23 to 25 have been labeled with the same reference characters as used above to describe the embodiment illustrated in FIGS. 2, 9, 12 and 13, and any repetitive detailed description thereof will hereinafter be omitted or simplified.

The first support member OS1-1 may be located outside of a sealing member 50 and may surround the sealing member 50. In an embodiment, the first support member OS1-1 may be substantially aligned with a second side L2, a third side L3 and a fourth side L4 of the display device 1-1 and may be spaced apart from a first side L1 of the display device 1-1.

The first support member OS1-1 may include a first lower support pattern OS1-11 located on a second insulating layer 117 and a first upper support pattern OS1-12 located on the first lower support pattern OS1-11.

The second support member OS2-1 may be located between the first support member OS1-1 and connection pads PD or between the first support member OS1-1 and a pad area PDA. The second support member OS2-1 may be spaced apart from the first support member OS1-1. The second support member OS2-1 may be located only on the first side L1 of the display device 1-1. In one embodiment, for example, the second support member OS2-1 may include only a part extending in the first direction X and may not include a part extending in the second direction Y. In such an embodiment, the second support member OS2-1 may not be located between the second side L2, the third side L3 and the fourth side L4 of the display device 1-1 and the first support member OS1-1.

The second support member OS2-1 may include a second lower support pattern OS2-11 located on the second insulating layer 117 and a second upper support pattern OS2-12 located on the second lower support pattern OS2-11.

In an embodiment, the first lower support pattern OS1-11 and the second lower support pattern OS2-11 may include or be made of the same material as a third insulating layer 130 and may be formed simultaneously with the third insulating layer 130 during a same process.

In an embodiment, the first upper support pattern OS1-12 and the second upper support pattern OS2-12 may include or be made of the same material as a pixel defining layer 150 and may be formed simultaneously with the pixel defining layer 150 during a same process.

FIG. 26 is a plan view of a display device 1-1' separated from a mother substrate, t on which side polishing has not been performed, according to an embodiment.

Referring to FIG. 26, the display device 1-1' (hereinafter, referred to as an 'unprocessed display device') separated from a mother substrate or a mother glass by cutting the mother substrate or the mother glass along a scribing line SRL may include not only a first support member OS1-1' located in a non-display area NDA but also a second support member OS2-1' located outside of the first support member OS1-1'.

The second support member OS2-1' may be disposed along a first side L1a, a second side L2a, a third side L3a and a fourth side L4a of the unprocessed display device 1-1', may be spaced apart from the first support member OS1-1', and may completely surround the first support member OS1-1'.

A side polishing process may be further performed on the unprocessed display device 1-1' separated from the mother substrate along the scribing line SRL. The second side L2a, the third side L3a and the fourth side L4a of the unprocessed display device 1-1' may be polished up to a side polishing line SPL located relatively inward than the scribing line SRL. In the side polishing process, a part of the second support member OS2-1' which is disposed along the second side L2a, the third side L3a and the fourth side L4a may be removed, and a part of the second support member OS2-1' which is disposed along the first side L1a may remain to form the second support member OS2-1 (see FIG. 23) illustrated in FIG. 23.

In an embodiment, a part of the first support member OS1-1' which is disposed along the second side L2a, the third side L3a, and the fourth side L4a may also be polished and removed in the side polishing process.

Through the above process, the display device illustrated in FIG. 23 may be manufactured.

FIG. 27 is a plan view of a display device 1-2 according to an embodiment. FIG. 28 is a cross-sectional view taken along line X33-X33' of the display device 1-2 of FIG. 27. FIG. 29 is a cross-sectional view taken along line X53-X53' of the display device 1-2 of FIG. 27.

The display device 1-shown in FIGS. 27 to 29 is substantially the same as the embodiment illustrated in FIGS. 23 to 25 except that a display substrate 10-2 includes a third support member OS3-1. The same or like elements shown in FIGS. 27 to 29 have been labeled with the same reference characters as used above to describe the embodiment illustrated in FIGS. 23 to 25, and any repetitive detailed description thereof will hereinafter be omitted or simplified.

The third support member OS3-1 may be located between a second support member OS2-1 and connection pads PD or between the second support member OS2-1 and a pad area PDA. The third support member OS3-1 may be spaced apart from the second support member OS2-1. The second support member OS2-1 and the third support member OS3-1 may be located only on a first side L1 of the display device 1-2.

The third support member OS3-1 may include a third lower support pattern OS3-11 located on a second insulating layer 117 and a third upper support pattern OS3-12 located on the third lower support pattern OS3-11.

In an embodiment, the third lower support pattern OS3-11 may include or be made of the same material as a third insulating layer 130 and may be formed simultaneously with the third insulating layer 130 during a same process. In such an embodiment, the third upper support pattern OS3-12 may include or be made of the same material as a pixel defining layer 150 and may be formed simultaneously with the pixel defining layer 150 during a same process.

FIG. 30 is a plan view of a display device 1-2' according to an embodiment separated from a mother substrate, more specifically, a plan view of a display device 1-2' according to an embodiment on which side polishing has not been performed.

The display device 1-2' separated from a mother substrate or a mother glass by cutting the mother substrate or the mother glass along a scribing line SRL shown in FIG. 30 (hereinafter, referred to as an 'unprocessed display device') is substantially the same as the embodiment of FIG. 26 except that the unprocessed display device 1-2' further includes a third support member OS3-1' located outside of a second support member OS2-1'. The same or like elements shown in FIG. 30 have been labeled with the same reference characters as used above to describe the embodiment illustrated in FIG. 26, and any repetitive detailed description thereof will hereinafter be omitted or simplified.

In such an embodiment, the third support member OS3-1' may be disposed along a first side L1a, a second side L2a, a third side L3a and a fourth side La of the unprocessed display device 1-2', may be spaced apart from the second support member OS2-1', and may completely surround the second support member OS2-1'.

A side polishing process may be further performed on the unprocessed display device 1-2' separated from the mother substrate along the scribing line SRL. The second side L2a, the third side L3a and the fourth side L4a of the unprocessed display device 1-2' may be polished up to a side polishing line SPL located relatively further in than the scribing line SRL. In the side polishing process, a part of the second support member OS2-1' which is disposed along the second side L2a, the third side L3a and the fourth side L4a and a part of the third support member OS3-1' which is disposed along the second side L2a, the third side L3a and the fourth side L4a may be removed. A part of the second support member OS2-1' which is disposed along the first side L1a may remain to form the second support member OS2-1 (see FIG. 27) illustrated in FIG. 27, and a part of the third support member OS3-1' which is disposed along the first side L1a may remain to form the third support member OS3-1 (see FIG. 27) illustrated in FIG. 27.

Through the above process, the display device illustrated in FIGS. 27 through 29 may be manufactured.

FIG. 31 is a plan view of a display device 1-3 according to an embodiment. FIG. 32 is a cross-sectional view taken along line X34-X34' of the display device 1-3 of FIG. 31. FIG. 33 is a cross-sectional view taken along line X54-X54' of the display device 1-3 of FIG. 31.

Referring to FIGS. 31 to 33, an embodiment of the display device 1-3 according to the current embodiment includes a display substrate 10-3, a color conversion substrate 30-1, a sealing member 51, and a filler 70. The display device 1-3 shown in FIGS. 31 to 33 is substantially the same or similar to the embodiment illustrated in FIGS. 2, 9, 12 and 13 except that the display device 1-3 includes the sealing member 51, and the display substrate 10-3 includes a first support member OS1-3. The same or like elements shown in FIGS. 31 to 33 have been labeled with the same reference characters as used above to describe the embodiment illustrated in FIGS. 2, 9, 12 and 13. 26, and any repetitive detailed description thereof will hereinafter be omitted or simplified.

In such an embodiment, the sealing member 51 surrounds a dam member DM. The sealing member 51 includes a first portion 51a disposed along a first side L11 of the display device 1-3 and a second portion 51b connected to the first portion 51a and disposed along a second side L21, a third side L31 and a fourth side L41 of the display device 1-3.

In an embodiment, the second portion 51b of the sealing member 51 may be substantially aligned with the second side L21, the third side L31 and the fourth side L41 of the display device 1-3. In one embodiment, for example, as illustrated in FIGS. 32 and 33, the second portion 51b of the sealing member 51 may be aligned with edges of the color conversion substrate 30-1 and edges of the display substrate 10-3.

In an embodiment, the first portion 51a of the sealing member 51 may be spaced apart from the first side L11 of the display device 1-3.

In an embodiment, a width WSa of the first portion 51a of the sealing member 51 may be greater than a width WSb of the second portion 51b of the sealing member 51.

The first support member OS1-3 may be located between the first portion 51a of the sealing member 51 and connection pads PD. The first support member OS1-3 may be located only on the first side L11 of the display device 1-3. In such an embodiment, the first support member OS1-3 may not be located between the second side L21, the third side L31 and the fourth side L41 of the display device 1-3 and the second portion 51b of the sealing member 51.

The first support member OS1-3 may include a first lower support pattern OS1-31 located on a second insulating layer 117 and a first upper support pattern OS1-32 located on the first lower support pattern OS1-31.

In an embodiment, the first lower support pattern OS1-31 may include or be made of the same material as a third insulating layer 130, and the first upper support pattern OS1-32 may include or be made of the same material as a pixel defining layer 150 and may be formed simultaneously with the pixel defining layer 150 during a same process.

In such an embodiment, the display device 1-3 may be manufactured by setting the side polishing line SPL in the unprocessed display device 1' (see FIG. 20) illustrated in FIG. 20, etc. to partially overlap the sealing member 50 (see FIG. 20).

Alternatively, the display device 1-3 may be manufactured by completely removing the second portion OS1*b* (see FIG. 2) of the first support member OS1 (see FIG. 2) from the display device 1 (see FIG. 2) illustrated in FIG. 2 and further performing side polishing on a part of the sealing member 50 (see FIG. 2). Of the first portion OS1*a* (see FIG. 2) of the first support member OS1 (see FIG. 2) illustrated in FIG. 2, a portion remaining after the side polishing may become the first support member OS1-3 of the display device 1-3.

FIG. 34 is a plan view of a display device 1-4 according to an embodiment. FIG. 35 is a cross-sectional view taken along line X35-X35' of the display device 1-4 of FIG. 34. FIG. 36 is a cross-sectional view taken along line X55-X55' of the display device 1-4 of FIG. 34.

Referring to FIGS. 34 to 36, an embodiment of the display device 1-4 includes a display substrate 10-4, a color conversion substrate 30-1, a sealing member 51, and a filler 70. The display device 1-4 shown in FIGS. 34 to 36 is substantially the same or similar to the embodiment illustrated in FIGS. 31 to 33 except that the display substrate 10-4 further includes a second support member OS2-1. In such an embodiment, the second support member OS2-1 are substantially the same as those described above with reference to FIGS. 23 to 25. The same or like elements shown in FIGS. 34 to 36 have been labeled with the same reference characters as used above to describe the embodiment illustrated in FIGS. 31 to 33, and any repetitive detailed description thereof will hereinafter be omitted.

FIG. 37 is a plan view of a display device 1-5 according to an embodiment. FIG. 38 is a cross-sectional view taken along line X36-X36' of the display device 1-5 of FIG. 37. FIG. 39 is a cross-sectional view taken along line X56-X56' of the display device 1-5 of FIG. 37.

Referring to FIGS. 37 to 39, an embodiment of the display device 1-5 includes a display substrate 10-5, a color conversion substrate 30-1, a sealing member 51, and a filler 70. The display device 1-5 shown in FIGS. 37 to 39 is substantially the same or similar to the embodiment illustrated in FIGS. 34 to 36 except that the display substrate 10-5 further includes a third support member OS3-1. In such an embodiment, the third support member OS3-1 are substantially the same as those described above with reference to FIGS. 27 to 29. The same or like elements shown in FIGS. 37 to 39 have been labeled with the same reference characters as used above to describe the embodiment illustrated in FIGS. 27 to 29 and 34 to 36, and any repetitive detailed description thereof will hereinafter be omitted.

In embodiments of FIGS. 30 to 39 described above, a support member located outside of a sealing member absorbs an impact generated in a scribing process during a manufacturing process, thereby effectively preventing cracks from being generated in an inorganic layer, etc. inside a display device.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device defining a thickness direction and comprising:
   a first base on which a display area and a non-display area are defined;
   a first support member disposed on the first base and located in the non-display area;
   a light emitting element disposed on the first base and located in the display area;
   an encapsulation layer disposed on the light emitting element;
   a second base disposed on the encapsulation layer;
   a color filter disposed between the second base and the encapsulation layer, wherein the color filter overlaps the light emitting element;
   a wavelength conversion pattern disposed on the color filter; and
   a sealing member disposed between the first base and the second base and located in only the non-display area, such that the encapsulation layer is disposed above the light emitting element and disposed under the sealing member relative to the first base,
   wherein the sealing member comprises:
      a first portion having an inner side facing the encapsulation layer in a first direction orthogonal to the thickness direction and an outer side opposite the inner side that is spaced apart from an edge of the first base, and
      a second portion having an inner side facing the encapsulation layer in a second direction orthogonal to both the thickness direction and the first direction and an outer side opposite the inner side that is aligned in the thickness direction with the edge of the first base, and
   wherein the first portion of the sealing member extends in a same direction as the first support member, is located between the first support member and the display area, overlaps the light emitting element in the first direction, and is spaced apart from the first support member.

2. The display device of claim 1, wherein a width of the first portion of the sealing member is greater than a width of the second portion of the sealing member.

3. The display device of claim 1, further comprising:
   a connection pad disposed on the first base and located in the non-display area,
   wherein the first portion of the sealing member is located between the connection pad and the display area, and the first support member is located between the connection pad and the first portion of the sealing member.

4. The display device of claim 3, further comprising:
   a second support member disposed on the first base, located between the first support member and the connection pad, and spaced apart from the first support member,
   wherein the second support member extends in a same direction as the first support member.

5. The display device of claim 1, wherein
   the encapsulation layer comprises a lower inorganic layer disposed on the light emitting element, an organic layer disposed on the lower inorganic layer and an upper inorganic layer disposed on the organic layer, and the sealing member is disposed on the upper inorganic layer in the non-display area and overlaps the lower inorganic layer and the upper inorganic layer.

6. The display device of claim 1, wherein a portion of an outermost edge of the encapsulation layer is disposed between the first support member and the sealing member, and the portion of the outermost edge of the encapsulation layer does not overlap the sealing member.

7. The display device of claim 1, wherein the first direction is orthogonal to the second direction.

8. The display device of claim 1, wherein the first support member and the sealing member do not overlap in the thickness direction of the display device.

9. The display device of claim 1, wherein the first support member and the sealing member overlap in a direction orthogonal to the thickness direction of the display device.

10. The display device of claim 1, wherein the first support member is located entirely in the non-display area.

11. An electronic device comprising the display device of claim 1.

\*   \*   \*   \*   \*